(12) United States Patent
Inada et al.

(10) Patent No.: US 10,012,780 B2
(45) Date of Patent: *Jul. 3, 2018

(54) LIGHT-EMITTING DEVICE INCLUDING PHOTOLUMINESCENT LAYER

(71) Applicant: Panasonic Intellectual Property Management Co., Ltd., Osaka (JP)

(72) Inventors: Yasuhisa Inada, Osaka (JP); Taku Hirasawa, Kyoto (JP); Mitsuru Nitta, Kyoto (JP); Akira Hashiya, Osaka (JP); Takeyuki Yamaki, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 56 days.

This patent is subject to a terminal disclaimer.

(21) Appl. No.: 15/215,592

(22) Filed: Jul. 21, 2016

(65) Prior Publication Data

US 2016/0327715 A1 Nov. 10, 2016

Related U.S. Application Data

(63) Continuation of application No. PCT/JP2014/004324, filed on Aug. 22, 2014.

(30) Foreign Application Priority Data

Feb. 28, 2014 (JP) ................................ 2014-037992
Jul. 29, 2014 (JP) ................................ 2014-154112

(51) Int. Cl.
*F21V 8/00* (2006.01)
*G03B 21/20* (2006.01)
(Continued)

(52) U.S. Cl.
CPC ......... *G02B 6/0003* (2013.01); *G02B 6/0038* (2013.01); *G02B 6/0053* (2013.01);
(Continued)

(58) Field of Classification Search
CPC .. G02B 6/0003; G02B 6/0038; G02B 6/0053; G02B 6/0083; G02B 6/0085;
(Continued)

(56) References Cited

U.S. PATENT DOCUMENTS 5,517,039 A 5/1996 Holonyak, Jr. et al.
5,732,102 A 3/1998 Bouadma
(Continued)

FOREIGN PATENT DOCUMENTS

JP 9-073807 3/1997
JP 11-283751 10/1999
(Continued)

OTHER PUBLICATIONS

Non-Final Office Action issued in U.S. Appl. No. 15/169,771, dated Aug. 16, 2017.
(Continued)

*Primary Examiner* — Bao Q Truong
(74) *Attorney, Agent, or Firm* — McDermott Will & Emery LLP

(57) ABSTRACT

A light-emitting device includes a photoluminescent layer and a light-transmissive layer located on the photoluminescent layer. At least one of the photoluminescent layer and the light-transmissive layer has a submicron structure having at least projections or recesses arranged perpendicular to the thickness direction of the photoluminescent layer. At least one of the photoluminescent layer and the light-transmissive layer has a light emitting surface. The first light has a wavelength $\lambda_a$ in air. A distance $D_{int}$ between adjacent projections or recesses and a refractive index $n_{wav-a}$ of the photoluminescent layer for the first light satisfy $\lambda_a/n_{wav-a} < D_{int} < \lambda_a$. A thickness of the photoluminescent layer,
(Continued)

the refractive index $n_{wav-a}$, and the distance $D_{int}$ are set to limit a directional angle of the first light emitted from the light emitting surface.

33 Claims, 39 Drawing Sheets

(51) Int. Cl.
    *H01L 33/58*     (2010.01)
    *H01L 33/50*     (2010.01)

(52) U.S. Cl.
    CPC ......... *G02B 6/0083* (2013.01); *G02B 6/0085* (2013.01); *G03B 21/204* (2013.01); *H01L 33/58* (2013.01); *G02B 6/0036* (2013.01); *H01L 33/505* (2013.01)

(58) Field of Classification Search
    CPC .... G02B 6/0036; G02B 5/1866; G02B 6/124; G03B 21/204; H01L 33/58; H01L 33/505; H01L 33/507; H01L 33/508; C09K 11/7774; C09K 11/00; F21V 9/00; F21V 9/16; F21K 2/00; F21K 2/005
See application file for complete search history.

(56) References Cited

U.S. PATENT DOCUMENTS

| | | | |
|---|---|---|---|
| 6,728,034 | B1 | 4/2004 | Nakanishi et al. |
| 7,619,357 | B2 | 11/2009 | Onishi et al. |
| 7,699,482 | B2 | 4/2010 | Noguchi |
| 8,227,966 | B2 | 7/2012 | Wakabayashi et al. |
| 8,619,363 | B1 | 12/2013 | Coleman |
| 9,158,215 | B2 | 10/2015 | Yu |
| 9,515,239 | B2 * | 12/2016 | Inada ............... H01L 33/505 |
| 9,518,215 | B2 * | 12/2016 | Hirasawa ............ C09K 11/00 |
| 9,618,697 | B2 * | 4/2017 | Inada ................. G02B 6/1225 |
| 2002/0180348 | A1 | 12/2002 | Oda et al. |
| 2003/0021314 | A1 | 1/2003 | Yoshida et al. |
| 2003/0169792 | A1 | 9/2003 | Kim |
| 2004/0141108 | A1 | 7/2004 | Tanaka et al. |
| 2004/0233534 | A1 | 11/2004 | Nakanishi et al. |
| 2006/0039433 | A1 | 2/2006 | Simpson |
| 2006/0088066 | A1 | 4/2006 | He |
| 2007/0031097 | A1 | 2/2007 | Heikenfeld et al. |
| 2007/0103931 | A1 | 5/2007 | Lee et al. |
| 2007/0138479 | A1 | 6/2007 | Yamazaki et al. |
| 2007/0153860 | A1 | 7/2007 | Chang-Hasnain et al. |
| 2008/0069497 | A1 | 3/2008 | Tissot et al. |
| 2008/0089089 | A1 | 4/2008 | Hama et al. |
| 2008/0149916 | A1 | 6/2008 | Baba et al. |
| 2008/0258160 | A1 | 10/2008 | Do |
| 2008/0303419 | A1 | 12/2008 | Fukuda |
| 2009/0021153 | A1 | 1/2009 | Lee et al. |
| 2009/0040598 | A1 | 2/2009 | Ito |
| 2009/0040745 | A1 | 2/2009 | Nemchuk |
| 2009/0066241 | A1 | 3/2009 | Yokoyama |
| 2009/0129115 | A1 | 5/2009 | Fine et al. |
| 2009/0190068 | A1 | 7/2009 | Kawamura |
| 2009/0206325 | A1 | 8/2009 | Biwa et al. |
| 2009/0267092 | A1 | 10/2009 | Fukshima et al. |
| 2009/0286337 | A1 | 11/2009 | Lee et al. |
| 2010/0074284 | A1 | 3/2010 | Aizawa et al. |
| 2010/0142189 | A1 | 6/2010 | Hong et al. |
| 2010/0164365 | A1 | 7/2010 | Yoshino et al. |
| 2010/0246210 | A1 | 9/2010 | Yashiro |
| 2010/0277887 | A1 | 11/2010 | Su et al. |
| 2011/0101359 | A1 | 5/2011 | Kim et al. |
| 2011/0198563 | A1 | 8/2011 | Kim et al. |
| 2011/0198645 | A1 | 8/2011 | Jo et al. |
| 2012/0018705 | A1 | 1/2012 | Takazoe et al. |
| 2012/0106127 | A1 | 5/2012 | Hattori et al. |
| 2012/0119638 | A1 | 5/2012 | Sato et al. |
| 2012/0176766 | A1 | 7/2012 | Natsumeda |
| 2012/0224378 | A1 | 9/2012 | Koike et al. |
| 2012/0286258 | A1 | 11/2012 | Naraoka et al. |
| 2012/0292652 | A1 | 11/2012 | Yamae et al. |
| 2013/0069046 | A1 | 3/2013 | Ishizuya |
| 2013/0181195 | A1 | 7/2013 | Cho et al. |
| 2013/0208327 | A1 | 8/2013 | Bolle et al. |
| 2013/0277703 | A1 | 10/2013 | Matsuzaki |
| 2013/0308102 | A1 | 11/2013 | Natsumeda et al. |
| 2014/0022818 | A1 | 1/2014 | Natsumeda et al. |
| 2014/0071683 | A1 | 3/2014 | Hamada et al. |
| 2014/0092620 | A1 | 4/2014 | Tissot |
| 2014/0185316 | A1 | 7/2014 | Kim et al. |
| 2014/0306176 | A1 | 10/2014 | Chiu et al. |
| 2014/0362604 | A1 | 12/2014 | Masuda |
| 2015/0249183 | A1 | 9/2015 | Hirasawa et al. |
| 2015/0249186 | A1 | 9/2015 | Inada et al. |
| 2015/0249187 | A1 | 9/2015 | Inada et al. |
| 2015/0252964 | A1 | 9/2015 | Takahashi et al. |
| 2016/0265746 | A1 | 9/2016 | Hirasawa et al. |
| 2016/0265747 | A1 | 9/2016 | Nagao et al. |
| 2016/0265749 | A1 | 9/2016 | Inada |
| 2017/0012232 | A1 | 1/2017 | Kataishi et al. |
| 2017/0075169 | A1 | 3/2017 | Hayama |

FOREIGN PATENT DOCUMENTS

| | | |
|---|---|---|
| JP | 2001-059905 | 3/2001 |
| JP | 2001-155520 | 6/2001 |
| JP | 2007-103901 | 4/2007 |
| JP | 2007-240641 | 9/2007 |
| JP | 2008-130279 | 6/2008 |
| JP | 2008-521211 | 6/2008 |
| JP | 2008-227458 | 9/2008 |
| JP | 2009-140894 | 6/2009 |
| JP | 2010-015874 | 1/2010 |
| JP | 2010-033772 | 2/2010 |
| JP | 2010-097178 | 4/2010 |
| JP | 2010-199357 | 9/2010 |
| JP | 2010-210824 | 9/2010 |
| JP | 2010-231941 | 10/2010 |
| JP | 2010-237311 | 10/2010 |
| JP | 2011-166148 | 8/2011 |
| JP | 2012-093454 | 5/2012 |
| JP | 2012-109334 | 6/2012 |
| JP | 2012-109400 | 6/2012 |
| JP | 2012-182376 | 9/2012 |
| JP | 2013-183020 | 9/2013 |
| JP | 2014-075584 | 4/2014 |
| JP | 2014-082401 | 5/2014 |
| JP | 2014-092645 | 5/2014 |
| JP | 2014-523603 | 9/2014 |
| WO | 2007/034827 | 3/2007 |
| WO | 2007/091687 | 8/2007 |
| WO | 2009/005311 | 1/2009 |
| WO | 2009/099211 | 8/2009 |
| WO | 2011/040528 | 4/2011 |
| WO | 2012/049905 | 4/2012 |
| WO | 2012/108384 | 8/2012 |
| WO | 2012/137584 | 10/2012 |
| WO | 2013/084442 | 6/2013 |
| WO | 2013/125567 | 8/2013 |
| WO | 2013/172025 | 11/2013 |
| WO | 2014/024218 | 2/2014 |
| WO | 2014/119783 | 8/2014 |
| WO | 2015/045886 | 4/2015 |

OTHER PUBLICATIONS

Non-Final Office Action issued in U.S. Appl. No. 15/214,803, dated Aug. 8, 2017.
Non-Final Office Action issued in U.S. Appl. No. 15/214,837, dated Sep. 12, 2017.
Non-Final Office Action issued in U.S. Appl. No. 15/215,595, dated Jul. 28, 2017.
Notice of Allowance issued in U.S. Appl. No. 15/215,595, dated Sep. 22, 2017.
Non-Final Office Action issued in U.S. Appl. No. 15/215,599, dated Aug. 25, 2017.

(56) References Cited

OTHER PUBLICATIONS

Non-Final Office Action issued in U.S. Appl. No. 15/219,462, dated Sep. 26, 2017.
Notice of Allowance issued in U.S. Appl. No. 15/169,771, dated Oct. 24, 2017.
The Extended European Search Report dated Dec. 16, 2016 for the related European Patent Application No. 14883764.4.
Specification of U.S. Appl. No. 15/446,453, filed Mar. 1, 2017.
Non-Final Office Action issued in U.S. Appl. No. 15/216,669, dated Apr. 14, 2017.
International Search Report of PCT application No. PCT/JP2014/004324 dated Nov. 25, 2014.
Non-final Office Action issued in U.S. Appl. No. 14/618,591, dated Nov. 9, 2015.
Final Office Action issued in U.S. Appl. No. 14/618,591, dated May 19, 2016.
Non-final Office Action issued in U.S. Appl. No. 14/618,254, dated Feb. 3, 2016.
Non-Final Office Action issued in U.S. Appl. No. 14/621,729, dated Mar. 9, 2016.
Final Office Action issued in U.S. Appl. No. 14/621,729, dated Sep. 28, 2016.
International Search Report of PCT application No. PCT/JP2015/000810 dated Apr. 7, 2015.
International Search Report of PCT application No. PCT/JP2015/000811 dated Apr. 7, 2015.
International Search Report of PCT application No. PCT/JP2015/000812 dated Apr. 7, 2015.
International Search Report of PCT application No. PCT/JP2015/000813 dated May 19, 2015.
International Search Report of PCT application No. PCT/JP2015/000814 dated May 26, 2015.
International Search Report of PCT application No. PCT/JP2015/000815 dated Apr. 7, 2015.
Specification of U.S. Appl. No. 15/166,123, filed May 26, 2016.
Specification of U.S. Appl. No. 15/169,771, filed Jun. 1, 2016.
Specification of U.S. Appl. No. 15/206,273, filed Jul. 10, 2016.
Specification of U.S. Appl. No. 15/214,523, filed Jul. 20, 2016.
Specification of U.S. Appl. No. 15/214,803, filed Jul. 20, 2016.
Specification of U.S. Appl. No. 15/214,837, filed Jul. 20, 2016.
Specification of U.S. Appl. No. 15/215,595, filed Jul. 21, 2016.
Specification of U.S. Appl. No. 15/215,599, filed Jul. 21, 2016.
Specification of U.S. Appl. No. 15/216,669, filed Jul. 21, 2016.
Specification of U.S. Appl. No. 15/216,686, filed Jul. 21, 2016.
Specification of U.S. Appl. No. 15/219,462, filed Jul. 26, 2016.
Non-Final Office Action issued in U.S. Appl. No. 15/060,574, dated Jan. 16, 2018.
Final Office Action issued in U.S. Appl. No. 15/214,803, dated Feb. 5, 2018.
Notice of Allowance issued in U.S. Appl. No. 15/060,564, dated Mar. 21, 2018.
Notice of Allowance issued in U.S. Appl. No. 15/216,686, dated Mar. 26, 2018.
Non-Final Office Action issued in U.S. Appl. No. 15/219,462, dated Feb. 28, 2018.

* cited by examiner

LIGHT-EMITTING DEVICE INCLUDING PHOTOLUMINESCENT LAYER

BACKGROUND

1. Technical Field

The present disclosure relates to a light-emitting device including a photoluminescent layer.

2. Description of the Related Art

Optical devices, such as lighting fixtures, displays, and projectors, that output light in the necessary direction are required for many applications. Photoluminescent materials, such as those used for fluorescent lamps and white light-emitting diodes (LEDs), emit light in all directions. Thus, those materials are used in combination with optical elements such as reflectors and lenses to output light only in a particular direction. For example, Japanese Unexamined Patent Application Publication No. 2010-231941 discloses an illumination system including a light distributor and an auxiliary reflector to provide sufficient directionality.

SUMMARY

In one general aspect, the techniques disclosed here feature a light-emitting device that includes a photoluminescent layer and a light-transmissive layer located on the photoluminescent layer. At least one of the photoluminescent layer and the light-transmissive layer has a submicron structure having at least projections or recesses arranged perpendicular to the thickness direction of the photoluminescent layer. At least one of the photoluminescent layer and the light-transmissive layer has a light emitting surface. The first light has a wavelength $\lambda_a$ in air. A distance $D_{int}$ between adjacent projections or recesses and a refractive index $n_{wav-a}$ of the photoluminescent layer for the first light satisfy $\lambda_a/n_{wav-a}<D_{int}<\lambda_a$. A thickness of the photoluminescent layer, the refractive index $n_{wav-a}$, and the distance $D_{int}$ are set to limit a directional angle of the first light emitted from the light emitting surface.

It should be noted that general or specific embodiments may be implemented as a device, an apparatus, a system, a method, or any elective combination thereof.

BRIEF DESCRIPTION OF THE DRAWINGS

FIG. 17A illustrates a one-dimensional periodic structure having a period $p_x$ in the x direction, FIG. 17B illustrates a two-dimensional periodic structure having a period $p_x$ in the x direction and a period $p_y$ in the y direction, FIG. 17C illustrates the wavelength dependence of light absorptivity in the structure in FIG. 17A, and FIG. 17D illustrates the wavelength dependence of light absorptivity in the structure in FIG. 17B;

DETAILED DESCRIPTION

Figure 1A:
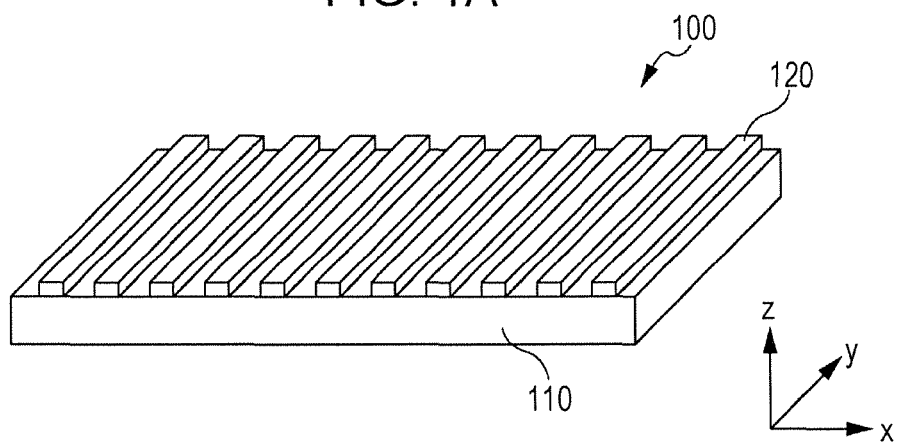
FIG. 1A is a perspective view of the structure of a light-emitting device according to an embodiment.

The present disclosure includes the following light-emitting devices and a light-emitting apparatus:

[Item 1] A light-emitting device including
- a photoluminescent layer that has a first surface perpendicular to a thickness direction thereof and emits light containing first light, an area of the first surface being larger than a sectional area of the photoluminescent layer perpendicular to the first surface; and
- a light-transmissive layer located on the photoluminescent layer, wherein
- at least one of the photoluminescent layer and the light-transmissive layer has a submicron structure having at least projections or recesses arranged perpendicular to the thickness direction of the photoluminescent layer,
- at least one of the photoluminescent layer and the light-transmissive layer has a light emitting surface perpendicular to the thickness direction of the photoluminescent layer, the first light being emitted from the light emitting surface, the first light has a wavelength $\lambda_a$ in air, a distance $D_{int}$ between adjacent projections or recesses and a refractive index $n_{wav-a}$ of the photoluminescent layer for the first light satisfy $\lambda_a/n_{wav-a} < D_{int} < \lambda_a$, and a thickness of the photoluminescent layer, the refractive index $n_{wav-a}$, and the distance $D_{int}$ are set to limit a directional angle of the first light emitted from the light emitting surface.

[Item 2] The light-emitting device according to Item 1, wherein a peak wavelength of the light emitted from the photoluminescent layer is not equal to the wavelength of the first light in air.

In general, light emitted from the photoluminescent layer has a wavelength band including the peak wavelength. The wavelength $\lambda_a$ of the first light is in the wavelength band and is not necessarily the peak wavelength. When the wavelength $\lambda_a$ is not the peak wavelength, light weaker than light having the peak wavelength can be enhanced. Thus, the light-emitting device according to Item 2 can appropriately change the emission spectrum and emit the desired light without changing the material of the photoluminescent layer.

[Item 3] The light-emitting device according to Item 1 or 2, wherein the refractive index $n_{t-a}$ of the light-transmissive layer for the first light is lower than the refractive index $n_{wav-a}$ of the photoluminescent layer for the first light.

[Item 4] The light-emitting device according to any one of Items 1 to 3, wherein the first light has the maximum intensity in a first direction determined in advance by the submicron structure.

[Item 5] The light-emitting device according to Item 4, wherein the first direction is normal to the photoluminescent layer.

[Item 6] The light-emitting device according to Item 4 or 5, wherein the first light emitted in the first direction is linearly polarized light.

[Item 7] The light-emitting device according to any one of Items 4 to 6, wherein the directional angle of the first light with respect to the first direction is less than 15 degrees.

[Item 8] The light-emitting device according to any one of Items 4 to 7, wherein second light having a wavelength $\lambda_b$ different from the wavelength $\lambda_a$ of the first light has the maximum intensity in a second direction different from the first direction.

[Item 9] The light-emitting device according to any one of Items 1 to 8, wherein the light-transmissive layer has the submicron structure.

[Item 10] The light-emitting device according to any one of Items 1 to 9, wherein the photoluminescent layer has the submicron structure.

[Item 11] The light-emitting device according to any one of Items 1 to 8, wherein the photoluminescent layer has a flat main surface, and the light-transmissive layer is located on the flat main surface of the photoluminescent layer and has the submicron structure.

[Item 12] The light-emitting device according to Item 11, wherein the photoluminescent layer is supported by a transparent substrate.

[Item 13] The light-emitting device according to any one of Items 1 to 8, wherein the light-transmissive layer is a transparent substrate having the submicron structure on a main surface thereof, and the photoluminescent layer is located on the submicron structure.

[Item 14] The light-emitting device according to Item 1 or 2, wherein the refractive index $n_{t-a}$ of the light-transmissive layer for the first light is higher than or equal to the refractive index $n_{wav-a}$ of the photoluminescent layer for the first light, and each of the projections or recesses in the submicron structure has a height or depth of 150 nm or less.

[Item 15] The light-emitting device according to any one of Items 1 to 14, wherein the submicron structure includes at least one periodic structure comprising at least the projections or recesses, and the at least one periodic structure includes a first periodic structure having a period $p_a$ that satisfies $\lambda_a/n_{wav-a} < p_a < \lambda_a$.

[Item 16] The light-emitting device according to any one of Items 1 to 14, wherein the submicron structure includes at least one periodic structure comprising at least the projections or recesses, and the at least one periodic structure includes a first periodic structure having a period $p_a$ that satisfies $\lambda_a/n_{wav-a} < p_a < \lambda_a$, and the first periodic structure is a one-dimensional periodic structure.

[Item 17] The light-emitting device according to Item 16, wherein

The light emitted from the photoluminescent layer includes second light having a wavelength $\lambda_b$ different from the wavelength $\lambda_a$ in air, the at least one periodic structure further includes a second periodic structure having a period $p_b$ that satisfies $\lambda_b/n_{wav-b} < p_b < \lambda_b$, wherein $n_{wav-b}$ denotes a refractive index of the photoluminescent layer for the second light, and the second periodic structure is a one-dimensional periodic structure.

[Item 18] The light-emitting device according to any one of Items 1 to 14, wherein the submicron structure includes a two-dimensional periodic structure having at least two periodic structures comprising at least the projections or recesses, and the at least two periodic structures have periodicity in different directions.

[Item 19] The light-emitting device according to any one of Items 1 to 14, wherein the submicron structure includes periodic structures comprising at least the projections or recesses, and the periodic structures include periodic structures arranged in a matrix.

[Item 20] The light-emitting device according to any one of Items 1 to 14, wherein the submicron structure includes periodic structures comprising at least the projections or recesses, and the periodic structures include a periodic structure having a period $p_{ex}$ that satisfies $\lambda_{ex}/n_{wav-ex} < p_{ex} < \lambda_{ex}$, wherein $\lambda_{ex}$ denotes the wavelength of excitation light in air for a photoluminescent material contained in the photoluminescent layer, and $n_{wav-ex}$ denotes the refractive index of the photoluminescent layer for the excitation light.

[Item 21] A light-emitting device including photoluminescent layers and light-transmissive layers, wherein at least two of the photoluminescent layers are independently the photoluminescent layer according to any one of Items 1 to 20, and at least two of the light-transmissive layers are independently the light-transmissive layer according to any one of Items 1 to 20.

[Item 22] The light-emitting device according to Item 21, wherein the photoluminescent layers and the light-transmissive layers are stacked on top of each other.

[Item 23] A light-emitting device including
a photoluminescent layer having a first surface perpendicular to a thickness direction thereof, an area of the first surface being larger than a sectional area of the photoluminescent layer perpendicular to the first surface; and
a light-transmissive layer located on the photoluminescent layer; and
at least one of the photoluminescent layer and the light-transmissive layer has a submicron structure extending perpendicular to the thickness direction of the photoluminescent layer,
wherein the photoluminescent layer emits light to form a quasi-guided mode in the photoluminescent layer and the light-transmissive layer.

[Item 24] A light-emitting device including
a waveguide layer that has a periodic structure and contains a photoluminescent material, wherein
a quasi-guided is formed in the waveguide layer and light emitted from the photoluminescent material is guided while interacting with the periodic structure in the quasi-guided mode.

[Item 25] A light-emitting device including
a photoluminescent layer that has a first surface perpendicular to a thickness direction thereof and emits light containing first light, an area of the first surface being larger than a sectional area of the photoluminescent layer perpendicular to the first surface; and
a light-transmissive layer located on the photoluminescent layer, wherein
at least one of the photoluminescent layer and the light-transmissive layer has a submicron structure having at least projections or recesses arranged perpendicular to the thickness direction of the photoluminescent layer,
at least one of the photoluminescent layer and the light-transmissive layer has a light emitting surface perpendicular to the thickness direction of the photoluminescent layer, the first light being emitted from the light emitting surface,
a distance $D_{int}$ between adjacent projections or recesses, a wavelength $\lambda_{ex}$ of excitation light in air for a photoluminescent material contained in the photoluminescent layer, and a refractive index $n_{wav\text{-}ex}$ of a medium having the highest refractive index for the excitation light out of media present in an optical path to the photoluminescent layer or the light-transmissive layer satisfy $\lambda_{ex}/n_{wav\text{-}ex} < D_{int} < \lambda_{ex}$, and
a thickness of the photoluminescent layer, the refractive index $n_{wav\text{-}ex}$, and the distance $D_{int}$ are set to limit a directional angle of the excitation light emitted from the light emitting surface.

[Item 26] The light-emitting device according to Item 25, wherein the submicron structure includes at least one periodic structure comprising at least the projections or recesses, and the at least one periodic structure includes a first periodic structure having a period $p_{ex}$ that satisfies $\lambda_{ex}/n_{wav\text{-}ex} < p_{ex} < \lambda_{ex}$.

[Item 27] The light-emitting device according to any one of Items 1 to 26, wherein the photoluminescent layer includes a phosphor.

[Item 28] The light-emitting device according to any one of Items 1 to 27, wherein 380 nm $\leq \lambda_a \leq$ 780 nm is satisfied.

[Item 29] The light-emitting device according to any one of Items 1 to 28, wherein the thickness of the photoluminescent layer, the refractive index $n_{wav\text{-}a}$, and the distance $D_{int}$ are set to allow an electric field to be formed in the photoluminescent layer, in which antinodes of the electric field are located in areas, the areas each corresponding to respective one of the projections and/or recesses.

[Item 30] The light-emitting device according to any one of Items 1 to 29, wherein the light-transmissive layer is located indirectly on the photoluminescent layer.

[Item 31] The light-emitting device according to any one of Items 1 to 30, wherein the thickness of the photoluminescent layer, the refractive index $n_{wav\text{-}a}$, and the distance $D_{int}$ are set to allow an electric field to be formed in the photoluminescent layer, in which antinodes of the electric field are located at, or adjacent to, at least the projections or recesses.

[Item 32] The light-emitting device according to any one of Items 1 to 31, further comprising a substrate that has a refractive index $n_{s\text{-}a}$ for the first light and is located on the photoluminescent layer, wherein $\lambda_a/n_{wav\text{-}a} < D_{int} < \lambda_a/n_{s\text{-}a}$ is satisfied.

[Item 33] A light-emitting apparatus including
the light-emitting device according to any one of Items 1 to 32, and
an excitation light source irradiating the photoluminescent layer with excitation light.

A light-emitting device according to an embodiment of the present disclosure includes a photoluminescent layer, a light-transmissive layer located on or near the photoluminescent layer, and a submicron structure that is formed on at least one of the photoluminescent layer and the light-transmissive layer and that extends in a plane of the photoluminescent layer or the light-transmissive layer. The submicron structure has projections or recesses, light emitted from the photoluminescent layer includes first light having a wavelength $\lambda_a$ in air, and the distance $D_{int}$ between adjacent projections or recesses and the refractive index $n_{wav\text{-}a}$ of the photoluminescent layer for the first light satisfy $\lambda_a/n_{wav\text{-}a} < D_{int} < \lambda_a$. The wavelength $\lambda_a$ is, for example, within the visible wavelength range (for example, 380 to 780 nm).

The photoluminescent layer contains a photoluminescent material. The term "photoluminescent material" refers to a material that emits light in response to excitation light. The term "photoluminescent material" encompasses fluorescent materials and phosphorescent materials in a narrow sense, encompasses inorganic materials and organic materials (for example, dyes), and encompasses quantum dots (tiny semiconductor particles). The photoluminescent layer may contain a matrix material (host material) in addition to the photoluminescent material. Examples of matrix materials include resins and inorganic materials such as glasses and oxides.

The light-transmissive layer located on or near the photoluminescent layer is made of a material with high transmittance to the light emitted from the photoluminescent layer, for example, inorganic materials or resins. For example, the light-transmissive layer is desirably made of a dielectric (particularly, an insulator having low light absorptivity). For example, the light-transmissive layer may be a substrate that supports the photoluminescent layer. If the surface of the photoluminescent layer facing air has the submicron structure, the air layer can serve as the light-transmissive layer.

In a light-emitting device according to an embodiment of the present disclosure, a submicron structure (for example, a periodic structure) on at least one of the photoluminescent layer and the light-transmissive layer forms a unique electric field distribution inside the photoluminescent layer and the light-transmissive layer, as described in detail later with reference to the results of calculations and experiments. This electric field distribution is formed by an interaction between guided light and the submicron structure and may also be referred to as a "quasi-guided mode".

The quasi-guided mode can be utilized to improve the luminous efficiency, directionality, and polarization selectivity of photoluminescence, as described later. The unique electric field distribution formed by light emitted from the photoluminescent layer may be referred to as a quasi-guided mode. Light in the quasi-guided mode is strongly emitted in a particular direction defined by the submicron structure (improved directionality and luminous efficiency). The particular direction may be a front direction. The wavelength and polarization (linear polarization) of light can also be defined by the submicron structure. The term "quasi-guided mode" may be used in the following description to describe novel structures and/or mechanisms contemplated by the inventors. However, such a description is for illustrative purposes only and is not intended to limit the present disclosure in any way.

For example, the submicron structure has projections, and the distance (the center-to-center distance) $D_{int}$ between adjacent projections satisfies $\lambda_a/n_{wav-a} < D_{int} < \lambda_a$. Instead of the projections, the submicron structure may have recesses. For simplicity, the following description will be directed to a submicron structure having projections. The symbol $\lambda$ denotes the wavelength of light, and the symbol $\lambda_a$ denotes the wavelength of light in air. The symbol $n_{wav}$ denotes the refractive index of the photoluminescent layer. If the photoluminescent layer is a medium containing materials, the refractive index $n_{wav}$ denotes the average refractive index of the materials weighted by their respective volume fractions.

Although it is desirable to use the symbol $n_{wav-a}$ to refer to the refractive index for light having a wavelength $\lambda_a$ because the refractive index n generally depends on the wavelength, it may be abbreviated for simplicity. The symbol $n_{wav}$ basically denotes the refractive index of the photoluminescent layer; however, if a layer having a higher refractive index than the photoluminescent layer is adjacent to the photoluminescent layer, the refractive index $n_{wav}$ denotes the average refractive index of the layer having a higher refractive index and the photoluminescent layer weighted by their respective volume fractions. This is optically equivalent to a photoluminescent layer composed of layers of different materials.

The effective refractive index $n_{eff}$ of the medium for light in the quasi-guided mode satisfies $n_a < n_{eff} < n_{wav}$, wherein $n_a$ denotes the refractive index of air.

If light in the quasi-guided mode is assumed to be light propagating through the photoluminescent layer while being totally reflected at an angle of incidence $\theta$, the effective refractive index $n_{eff}$ can be written as $n_{eff} = n_{wav} \sin \theta$. The effective refractive index $n_{eff}$ is determined by the refractive index of the medium present in the region where the electric field of the quasi-guided mode is distributed.

For example, if the submicron structure is formed in the light-transmissive layer, the effective refractive index $n_{eff}$ depends not only on the refractive index of the photoluminescent layer but also on the refractive index of the light-transmissive layer. Because the electric field distribution also varies depending on the polarization direction of the quasi-guided mode (that is, the TE mode or the TM mode), the effective refractive index $n_{eff}$ can differ between the TE mode and the TM mode.

The submicron structure is formed on at least one of the photoluminescent layer and the light-transmissive layer. If the photoluminescent layer and the light-transmissive layer are in contact with each other, the submicron structure may be formed on the interface between the photoluminescent layer and the light-transmissive layer. In such a case, the photoluminescent layer and the light-transmissive layer have the submicron structure. Alternatively, the photoluminescent layer may have no submicron structure, and the light-transmissive layer located on or near the photoluminescent layer may have the submicron structure. A phrase like "a submicron structure of a light-transmissive layer located on or near a photoluminescent layer", as used herein, typically means that the distance therebetween is less than half the wavelength $\lambda_a$. This allows the electric field of a guided mode to reach the submicron structure, thus forming a quasi-guided mode. However, the distance between the submicron structure of the light-transmissive layer and the photoluminescent layer may exceed half the wavelength $\lambda_a$ if the light-transmissive layer has a higher refractive index than the photoluminescent layer. If the light-transmissive layer has a higher refractive index than the photoluminescent layer, light reaches the light-transmissive layer even if the above relationship is not satisfied.

The submicron structure, which satisfies $\lambda_a/n_{wav-a} < D_{int} < \lambda_a$, as described above, is characterized by a submicron size. The submicron structure includes at least one periodic structure, as in the light-emitting devices according to the embodiments described in detail later. The at least one periodic structure has a period $p_a$ that satisfies $\lambda_a/n_{wav-a} < p_a < \lambda_a$. Thus, the submicron structure includes a periodic structure in which the distance $D_{int}$ between adjacent projections is constant at $p_a$. If the submicron structure includes a periodic structure, light in the quasi-guided mode propagates while repeatedly interacting with the periodic structure so that the light is diffracted by the submicron structure. Unlike the phenomenon in which light propagating through free space is diffracted by a periodic structure, this is the phenomenon in which light is guided (that is, repeatedly totally reflected) while interacting with the periodic structure. This can efficiently diffract light even if the periodic structure causes a small phase shift (that is, even if the periodic structure has a small height).

The above mechanism can be utilized to improve the luminous efficiency of photoluminescence by the enhancement of the electric field due to the quasi-guided mode and also to couple the emitted light into the quasi-guided mode. The angle of travel of the light in the quasi-guided mode is varied by the angle of diffraction determined by the periodic structure. This can be utilized to output light of a particular wavelength in a particular direction (that is, significantly improve the directionality). Furthermore, high polarization selectivity can be simultaneously achieved because the effective refractive index $n_{eff}(=n_{wav} \sin \theta)$ differs between the TE mode and the TM mode. For example, as demonstrated by the experimental examples below, a light-emitting device can be provided that outputs intense linearly polarized light (for example, the TM mode) of a particular wavelength (for example, 610 nm) in the front direction. The directional angle of the light output in the front direction is, for example, less than 15 degrees. The term "directional angle" refers to the angle of one side with respect to the front direction, which is assumed to be 0 degrees.

Conversely, a submicron structure having a lower periodicity results in a lower directionality, luminous efficiency, polarization, and wavelength selectivity. The periodicity of the submicron structure may be adjusted depending on the need. The periodic structure may be a one-dimensional periodic structure, which has a higher polarization selectivity, or a two-dimensional periodic structure, which allows for a lower polarization.

The submicron structure may include periodic structures. For example, these periodic structures may have different periods or different periodic directions (axes). The periodic structures may be formed on the same plane or may be stacked on top of each other. The light-emitting device may include photoluminescent layers and light-transmissive layers, and each of the layers may have submicron structures.

The submicron structure can be used not only to control the light emitted from the photoluminescent layer but also to efficiently guide excitation light into the photoluminescent layer. That is, the excitation light can be diffracted and coupled into the quasi-guided mode to guide light in the photoluminescent layer and the light-transmissive layer by the submicron structure to efficiently excite the photoluminescent layer. A submicron structure may be used that satisfies $\lambda_{ex}/n_{wav-ex} < D_{int} < \lambda_{ex}$, wherein $\lambda_{ex}$ denotes the wavelength in air of the light that excites the photoluminescent material, and $n_{wav-ex}$ denotes the refractive index of the photoluminescent layer for the excitation light. The symbol $n_{wav-ex}$ denotes the refractive index of the photoluminescent layer for the emission wavelength of the photoluminescent material. Alternatively, a submicron structure may be used that includes a periodic structure having a period $p_{ex}$ that satisfies $\lambda_{ex}/n_{wav-ex} < p_{ex} < \lambda_{ex}$. The excitation light has a wavelength $\lambda_{ex}$ of 450 nm, for example, but may have a shorter wavelength than visible light. If the excitation light has a wavelength within the visible range, it may be output together with the light emitted from the photoluminescent layer.

1. Underlying Knowledge Forming Basis of the Present Disclosure

The underlying knowledge forming the basis for the present disclosure will be described before describing specific embodiments of the present disclosure. As described above, photoluminescent materials such as those used for fluorescent lamps and white LEDs emit light in all directions and thus require optical elements such as reflectors and lenses to emit light in a particular direction. These optical elements, however, can be eliminated (or the size thereof can be reduced) if the photoluminescent layer itself emits directional light. This results in a significant reduction in the size of optical devices and equipment. With this idea in mind, the inventors have conducted a detailed study on the photoluminescent layer to achieve directional light emission.

The inventors have investigated the possibility of inducing light emission with particular directionality so that the light emitted from the photoluminescent layer is localized in a particular direction. Based on Fermi's golden rule, the emission rate Γ, which is a measure characterizing light emission, is represented by the equation (1):

$$\Gamma(r) = \frac{2\pi}{\hbar} \langle (d \cdot E(r)) \rangle^2 \rho(\lambda) \quad (1)$$

In the equation (1), r is the vector indicating the position, λ is the wavelength of light, d is the dipole vector, E is the electric field vector, and ρ is the density of states. For many substances other than some crystalline substances, the dipole vector d is randomly oriented. The magnitude of the electric field E is substantially constant irrespective of the direction if the size and thickness of the photoluminescent layer are sufficiently larger than the wavelength of light. Hence, in most cases, the value of $\langle (d \cdot E(r)) \rangle^2$ does not depend on the direction. Accordingly, the emission rate Γ is constant irrespective of the direction. Thus, in most cases, the photoluminescent layer emits light in all directions.

As can be seen from the equation (1), to achieve anisotropic light emission, it is necessary to align the dipole vector d in a particular direction or to enhance the component of the electric field vector in a particular direction. One of these approaches can be employed to achieve directional light emission. In the present disclosure, the results of a detailed study and analysis on structures for utilizing a quasi-guided mode in which the electric field component in a particular direction is enhanced by the confinement of light in the photoluminescent layer will be described below.

2. Structure for Enhancing Electric Field Only in Particular Direction

The inventors have investigated the possibility of controlling light emission using a guided mode with an intense electric field. Light can be coupled into a guided mode using a waveguide structure that itself contains a photoluminescent material. However, a waveguide structure simply formed using a photoluminescent material outputs little or no light in the front direction because the emitted light is coupled into a guided mode. Accordingly, the inventors have investigated the possibility of combining a waveguide containing a photoluminescent material with a periodic structure (formed of projections or recesses). When the electric field of light is guided in a waveguide while overlapping with a periodic structure located on or near the waveguide, a quasi-guided mode is formed by the effect of the periodic structure. That is, the quasi-guided mode is a guided mode restricted by the periodic structure and is characterized in that the antinodes of the amplitude of the electric field have the same period as the periodic structure. Light in this mode is confined in the waveguide structure to enhance the electric field in a particular direction. This mode also interacts with the periodic structure to undergo diffraction so that the light in this mode is converted into light propagating in a particular direction and can thus be output from the waveguide. The electric field of light other than the quasi-guided mode is not enhanced because little or no such light is confined in the waveguide. Thus, most light is coupled into a quasi-guided mode with a large electric field component.

That is, the inventors have investigated the possibility of using a photoluminescent layer containing a photoluminescent material as a waveguide (or a waveguide layer including a photoluminescent layer) in combination with a periodic structure located on or near the waveguide to couple light into a quasi-guided mode in which the light is converted into light propagating in a particular direction, thereby providing a directional light source.

Figure 30:
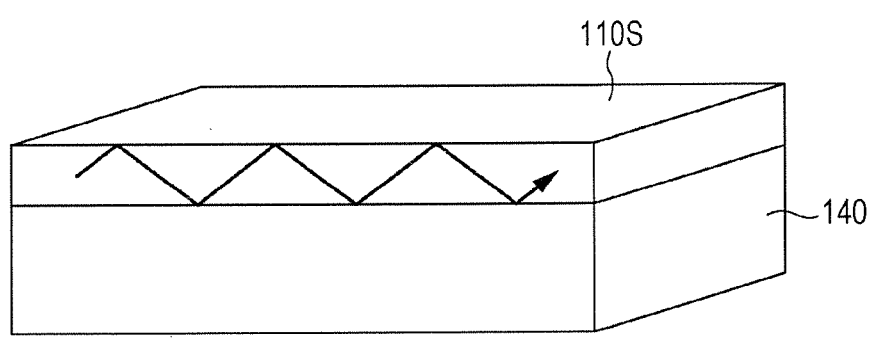
FIG. 30 is a schematic perspective view of a slab waveguide.

As a simple waveguide structure, the inventors have studied slab waveguides. A slab waveguide has a planar structure in which light is guided. FIG. 30 is a schematic perspective view of a slab waveguide 110S. There is a mode of light propagating through the waveguide 110S if the waveguide 110S has a higher refractive index than a transparent substrate 140 that supports the waveguide 110S. If such a slab waveguide includes a photoluminescent layer, the electric field of light emitted from an emission point overlaps largely with the electric field of a guided mode. This allows most of the light emitted from the photoluminescent layer to be coupled into the guided mode. If the photoluminescent layer has a thickness close to the wavelength of the light, a situation can be created where there is only a guided mode with a large electric field amplitude.

If a periodic structure is located on or near the photoluminescent layer, the electric field of the guided mode interacts with the periodic structure to form a quasi-guided mode. Even if the photoluminescent layer is composed of a plurality of layers, a quasi-guided mode is formed as long as the electric field of the guided mode reaches the periodic structure. Not all parts of the photoluminescent layer needs to be formed of a photoluminescent material, provided that at least a portion of the photoluminescent layer functions to emit light.

If the periodic structure is made of a metal, a mode due to the guided mode and plasmon resonance is formed. This mode has different properties from the quasi-guided mode. This mode is less effective in enhancing emission because a large loss occurs due to high absorption by the metal. Thus, it is desirable to form the periodic structure using a dielectric material having low absorptivity.

Figure 1B:
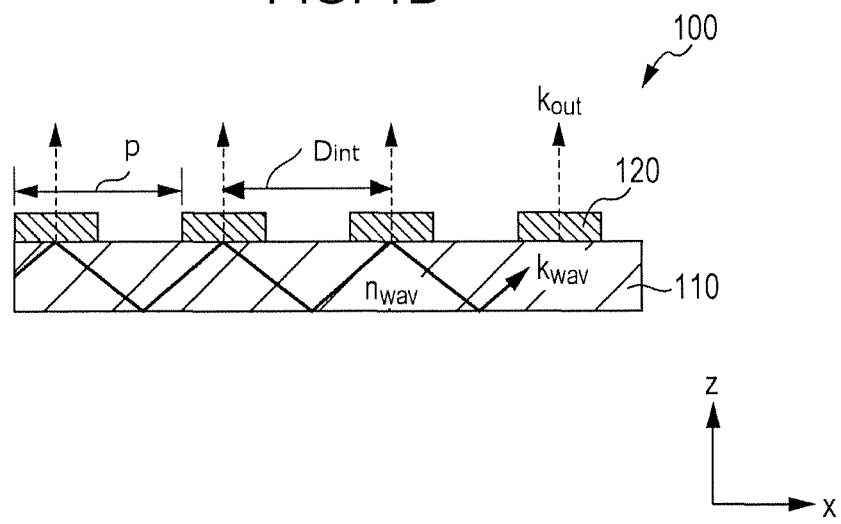
FIG. 1B is a fragmentary cross-sectional view of the light-emitting device illustrated in FIG. 1A.

The inventors have studied the coupling of light into a quasi-guided mode that can be output as light propagating in a particular angular direction using a periodic structure formed on a waveguide (a photoluminescent layer). FIG. 1A is a schematic perspective view of a light-emitting device 100 including a waveguide (a photoluminescent layer) 110 and a periodic structure (a light-transmissive layer) 120. If the light-transmissive layer 120 has a periodic structure (a submicron structure), the light-transmissive layer 120 is hereinafter also referred to as a "periodic structure 120". In this example, the periodic structure 120 is a one-dimensional periodic structure in which stripe-shaped projections extending in the y direction are arranged at regular intervals in the x direction. FIG. 1B is a cross-sectional view of the light-emitting device 100 taken along a plane parallel to the xz plane. If a periodic structure 120 having a period p is provided in contact with the waveguide 110, a quasi-guided mode having a wave number $k_{wav}$ in the in-plane direction is converted into light propagating outside the waveguide 110. In other words, adjacent projections of the periodic structure 120 have a center-to-center distance $D_{int}$ therebetween. The wave number $k_{out}$ of the light can be represented by the equation (2):

$$k_{out} = k_{wav} - m\frac{2\pi}{p} \quad (2)$$

wherein m is an integer indicating the diffraction order.

For simplicity, the light guided in the waveguide 110 is assumed to be a ray of light propagating at an angle $\theta_{wav}$. This approximation gives the equations (3) and (4):

$$\frac{k_{wav}\lambda_0}{2\pi} = n_{wav}\sin\theta_{wav} \quad (3)$$

$$\frac{k_{out}\lambda_0}{2\pi} = n_{out}\sin\theta_{out} \quad (4)$$

In these equations, $\lambda_0$ denotes the wavelength of the light in air, $n_{wav}$ denotes the refractive index of the waveguide 110, $n_{out}$ denotes the refractive index of the medium on the light output side, and $\theta_{out}$ denotes the angle at which the light is output from the waveguide 110 to a substrate or air. From the equations (2) to (4), the output angle $\theta_{out}$ can be represented by the equation (5):

$$n_{out}\sin\theta_{out} = n_{wav}\sin\theta_{wav} - m\lambda_0/p \quad (5)$$

If $n_{wav}\sin\theta_{wav} = m\lambda_0/p$ in the equation (5), this results in $\theta_{out}=0$, meaning that the light can be emitted in the direction perpendicular to the plane of the waveguide 110 (in the front direction).

Based on this principle, light can be coupled into a particular quasi-guided mode and be converted into light having a particular output angle using the periodic structure to output intense light in that direction.

There are some constraints to achieving the above situation. To form a quasi-guided mode, the light propagating through the waveguide 110 has to be totally reflected. The conditions therefor are represented by the inequality (6):

$$n_{out} < n_{wav}\sin\theta_{wav} \quad (6)$$

To diffract the quasi-guided mode using the periodic structure and thereby output the light from the waveguide 110, $-1 < \sin\theta_{out} < 1$ has to be satisfied in the equation (5). Hence, the inequality (7) has to be satisfied:

$$-1 < \frac{n_{wav}}{n_{out}}\sin\theta_{wav} - \frac{m\lambda_0}{n_{out}p} < 1 \quad (7)$$

Taking into account the inequality (6), the inequality (8) may be satisfied:

$$\frac{m\lambda_0}{2n_{out}} < p \quad (8)$$

To output the light from the waveguide 110 in the front direction ($\theta_{out}=0$), as can be seen from the equation (5), the equation (9) has to be satisfied:

$$p = m\lambda_0/(n_{wav}\sin\theta_{wav}) \quad (9)$$

As can be seen from the equation (9) and the inequality (6), the required conditions are represented by the inequality (10):

$$\frac{m\lambda_0}{n_{wav}} < p < \frac{m\lambda_0}{n_{out}} \quad (10)$$

If the periodic structure 120 as illustrated in FIGS. 1A and 1B is provided, it may be designed based on first-order diffracted light (that is, m=1) because higher-order diffracted light having m of 2 or more has low diffraction efficiency. In this embodiment, the period p of the periodic structure 120 is determined so as to satisfy the inequality (11), which is given by substituting m=1 into the inequality (10):

$$\frac{\lambda_0}{n_{wav}} < p < \frac{\lambda_0}{n_{out}} \quad (11)$$

If the waveguide (photoluminescent layer) 110 is not in contact with a transparent substrate, as illustrated in FIGS. 1A and 1B, $n_{out}$ is equal to the refractive index of air (approximately 1.0). Thus, the period p may be determined so as to satisfy the inequality (12):

$$\frac{\lambda_0}{n_{wav}} < p < \lambda_0 \quad (12)$$

Figure 1C:
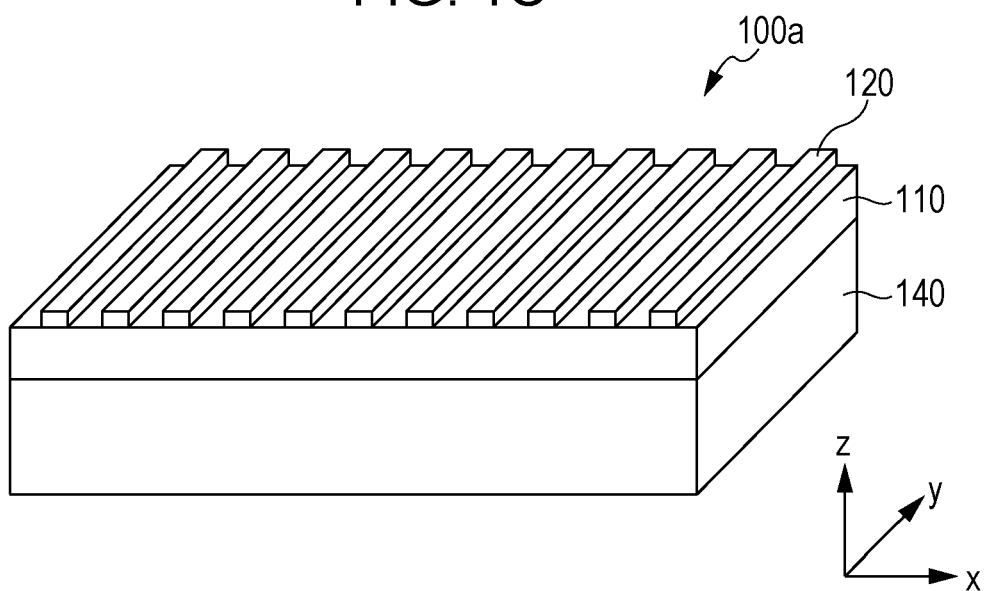
FIG. 1C is a perspective view of the structure of a light-emitting device according to another embodiment.
Figure 1D:
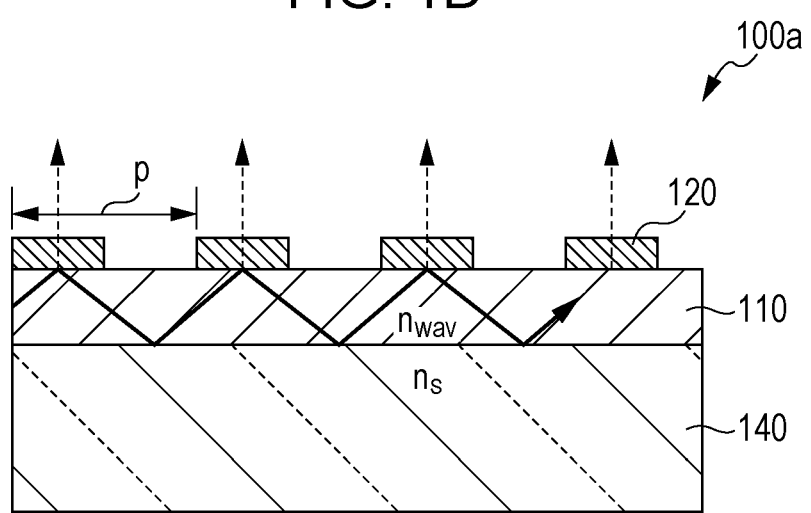
FIG. 1D is a fragmentary cross-sectional view of the light-emitting device illustrated in FIG. 1C.

Alternatively, a structure as illustrated in FIGS. 1C and 1D may be employed in which the photoluminescent layer 110 and the periodic structure 120 are formed on a transparent substrate 140. The refractive index $n_s$ of the transparent substrate 140 is higher than the refractive index of air. Thus, the period p may be determined so as to satisfy the inequality (13), which is given by substituting $n_{out}=n_s$ into the inequality (11):

$$\frac{\lambda_0}{n_{wav}} < p < \frac{\lambda_0}{n_s} \quad (13)$$

Although m=1 is assumed in the inequality (10) to give the inequalities (12) and (13), m≥2 may be assumed. That is, if both surfaces of the light-emitting device 100 are in contact with air layers, as shown in FIGS. 1A and 1B, the period p may be determined so as to satisfy the inequality (14):

$$\frac{m\lambda_0}{n_{wav}} < p < m\lambda_0 \quad (14)$$

wherein m is an integer of 1 or more.

Similarly, if the photoluminescent layer 110 is formed on the transparent substrate 140, as in the light-emitting device 100a illustrated in FIGS. 1C and 1D, the period p may be determined so as to satisfy the inequality (15):

$$\frac{m\lambda_0}{n_{wav}} < p < \frac{m\lambda_0}{n_s} \quad (15)$$

By determining the period p of the periodic structure so as to satisfy the above inequalities, the light emitted from the photoluminescent layer 110 can be output in the front direction, thus providing a directional light-emitting device.

3. Verification by Calculations 3-1. Period and Wavelength Dependence

The inventors verified, by optical analysis, whether the output of light in a particular direction as described above is actually possible. The optical analysis was performed by calculations using DiffractMOD available from Cybernet Systems Co., Ltd. In these calculations, the change in the absorption of external light incident perpendicular to a light-emitting device by a photoluminescent layer was calculated to determine the enhancement of light output perpendicular to the light-emitting device. The calculation of the process by which external incident light is coupled into a quasi-guided mode and is absorbed by the photoluminescent layer corresponds to the calculation of a process opposite to the process by which light emitted from the photoluminescent layer is coupled into a quasi-guided mode and is converted into propagating light output perpendicular to the light-emitting device. Similarly, the electric field distribution of a quasi-guided mode was calculated from the electric field of external incident light.

Figure 2:
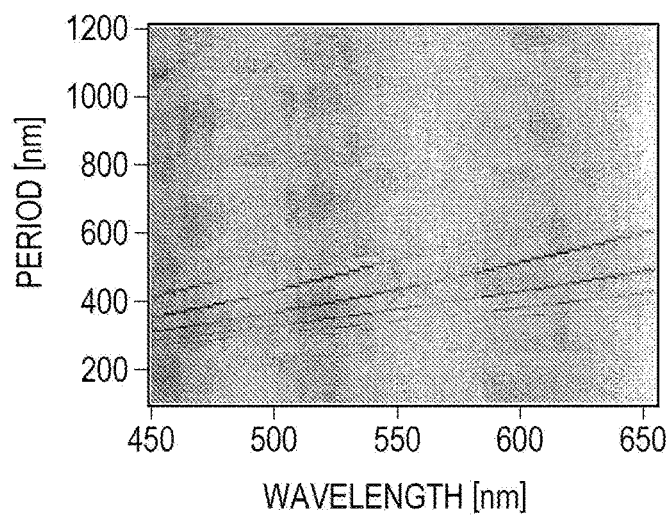
FIG. 2 is a graph showing the calculation results of the enhancement of light output in the front direction with varying emission wavelengths and varying a period of a periodic structure.

FIG. 2 shows the calculation results of the enhancement of light output in the front direction with varying emission wavelengths and varying periods of the periodic structure, where the photoluminescent layer was assumed to have a thickness of 1 μm and a refractive index $n_{wav}$ of 1.8, and the periodic structure was assumed to have a height of 50 nm and a refractive index of 1.5. In these calculations, the periodic structure was assumed to be a one-dimensional periodic structure uniform in the y direction, as shown in FIG. 1A, and the polarization of the light was assumed to be the TM mode, which has an electric field component parallel to the y direction. The results in FIG. 2 show that there are enhancement peaks at certain combinations of wavelength and period. In FIG. 2, the magnitude of the enhancement is expressed by different shades of color; a darker color (black) indicates a higher enhancement, whereas a lighter color (white) indicates a lower enhancement.

Figure 3:
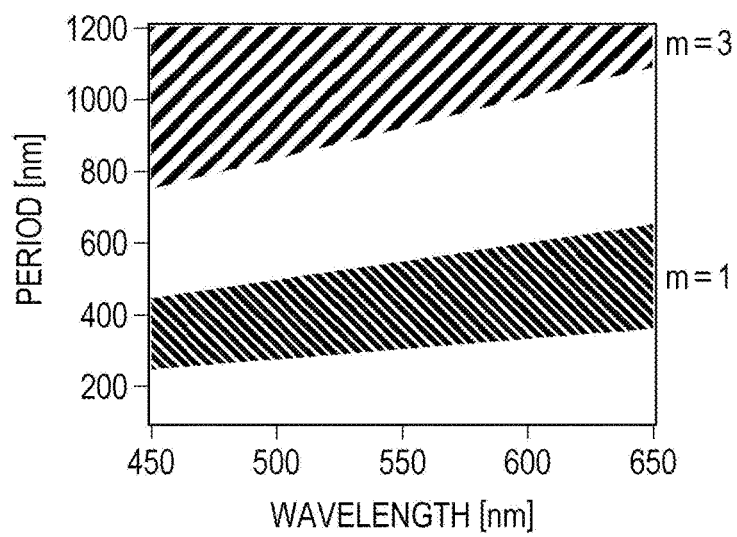
FIG. 3 is a graph illustrating the conditions for m=1 and m=3 in the inequality (10)

In the above calculations, the periodic structure was assumed to have a rectangular cross section as shown in FIG. 1B. FIG. 3 is a graph illustrating the conditions for m=1 and m=3 in the inequality (10). A comparison between FIGS. 2 and 3 shows that the peaks in FIG. 2 are located within the regions corresponding to m=1 and m=3. The intensity is higher for m=1 because first-order diffracted light has a higher diffraction efficiency than third- or higher-order diffracted light. There is no peak for m=2 because of low diffraction efficiency in the periodic structure.

In FIG. 2, a plurality of lines are observed in each of the regions corresponding to m=1 and m=3 in FIG. 3. This indicates the presence of a plurality of quasi-guided modes.

3-2. Thickness Dependence

Figure 4:
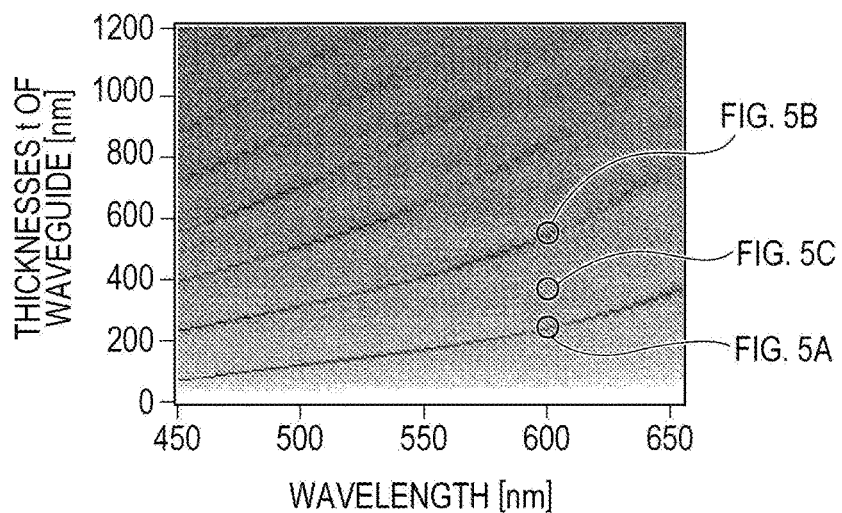
FIG. 4 is a graph showing the calculation results of the enhancement of light output in the front direction with varying emission wavelengths and varying thicknesses t of a photoluminescent layer.

FIG. 4 is a graph showing the calculation results of the enhancement of light output in the front direction with varying emission wavelengths and varying thicknesses t of the photoluminescent layer, where the photoluminescent layer was assumed to have a refractive index $n_{wav}$ of 1.8, and the periodic structure was assumed to have a period of 400 nm, a height of 50 nm, and a refractive index of 1.5. FIG. 4 shows that the enhancement of the light peaks at a particular thickness t of the photoluminescent layer.

Figure 5A:
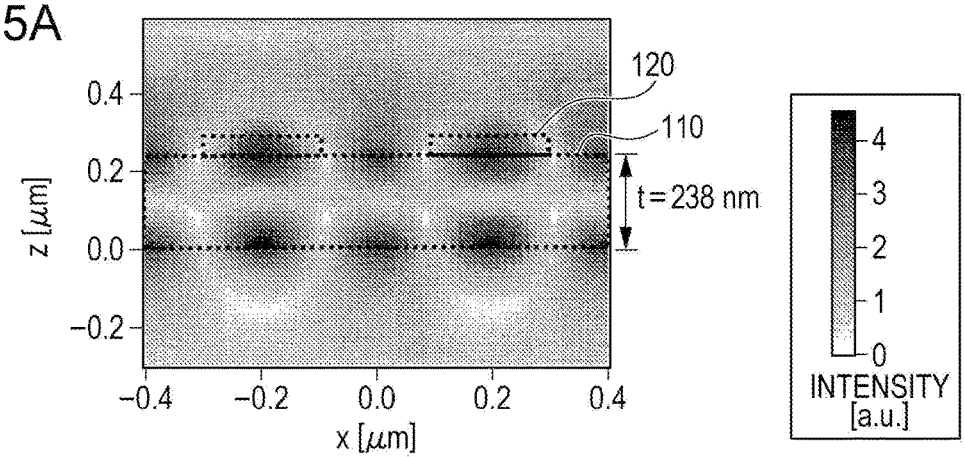
FIG. 5A is a graph showing the calculation results of the electric field distribution of a mode to guide light in the x direction for a thickness t of 238 nm.
Figure 5B:
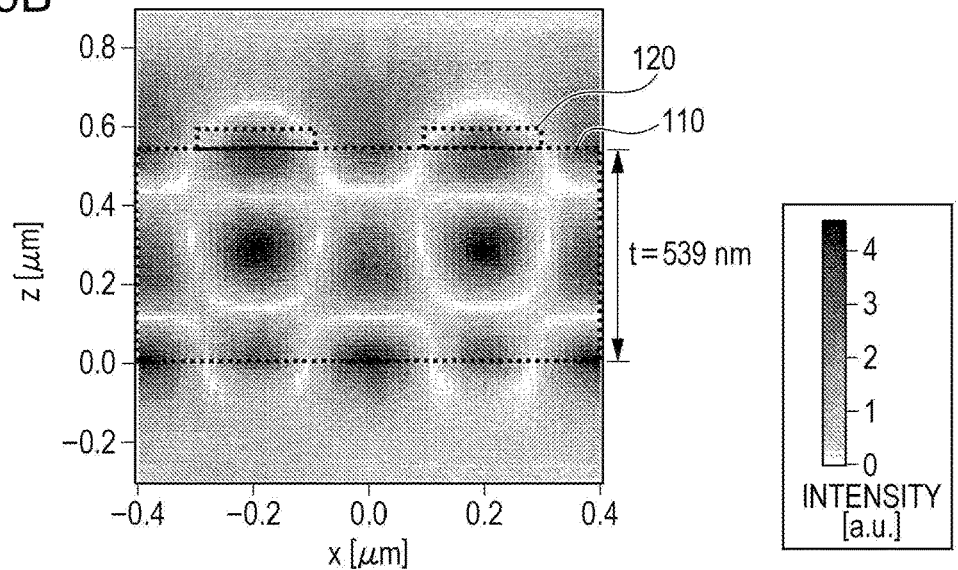
FIG. 5B is a graph showing the calculation results of the electric field distribution of a mode to guide light in the x direction for a thickness t of 539 nm.
Figure 5C:
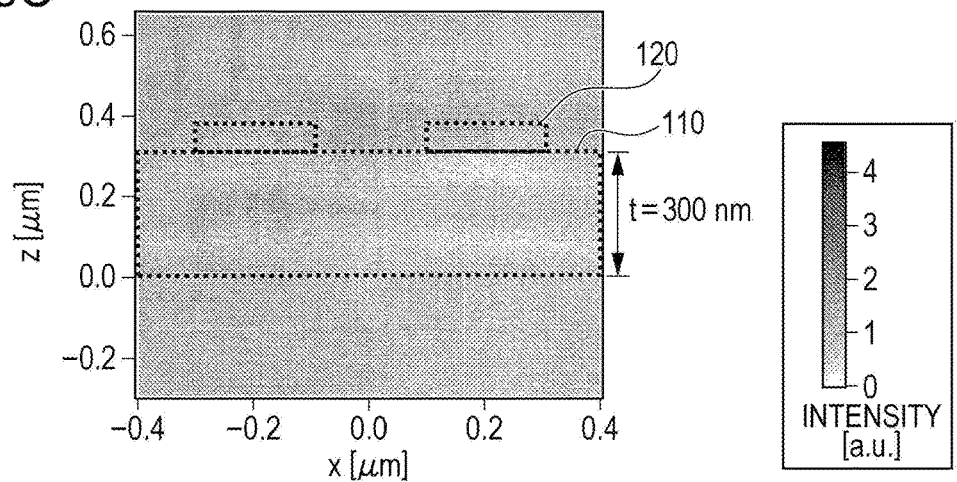
FIG. 5C is a graph showing the calculation results of the electric field distribution of a mode to guide light in the x direction for a thickness t of 300 nm.

FIGS. 5A and 5B show the calculation results of the electric field distributions of a mode to guide light in the x direction for a wavelength of 600 nm and thicknesses t of 238 nm and 539 nm, respectively, at which there are peaks in FIG. 4. For comparison, FIG. 5C shows the results of similar calculations for a thickness t of 300 nm, at which there is no peak. In these calculations, as in the above calculations, the periodic structure was a one-dimensional periodic structure uniform in the y direction. In each figure, a black region indicates a higher electric field intensity, whereas a white region indicates a lower electric field intensity. Whereas the results for t=238 nm and t=539 nm show high electric field intensity, the results for t=300 nm shows low electric field intensity as a whole. This is because there are guided modes for t=238 nm and t=539 nm so that light is strongly confined. Furthermore, regions with the highest electric field intensity (that is, antinodes) are necessarily present in or directly below the projections, indicating the correlation between the electric field and the periodic structure 120. Thus, the resulting guided mode depends on the arrangement of the periodic structure 120. A comparison between the results for t=238 nm and t=539 nm shows that these modes differ in the number of nodes (white regions) of the electric field in the z direction by one.

3-3. Polarization Dependence

Figure 6:
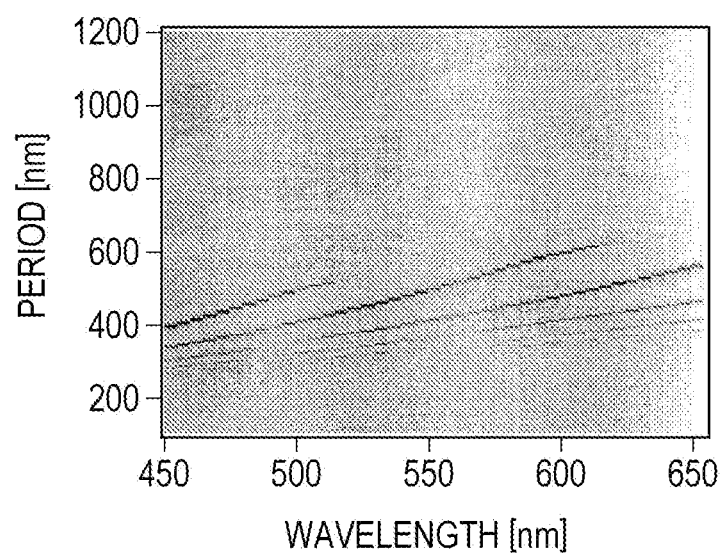
FIG. 6 is a graph showing the calculation results of the enhancement of light performed under the same conditions as in FIG. 2 except that the polarization of the light was assumed to be the TE mode, which has an electric field component perpendicular to the y direction.

To examine the polarization dependence, the enhancement of light was calculated under the same conditions as in FIG. 2 except that the polarization of the light was assumed to be the TE mode, which has an electric field component perpendicular to the y direction. FIG. 6 shows the results of these calculations. Although the peaks in FIG. 6 differ slightly in position from the peaks for the TM mode (FIG. 2), they are located within the regions shown in FIG. 3. This demonstrates that the structure according to this embodiment is effective for both of the TM mode and the TE mode.

3-4. Two-Dimensional Periodic Structure

Figure 7A:
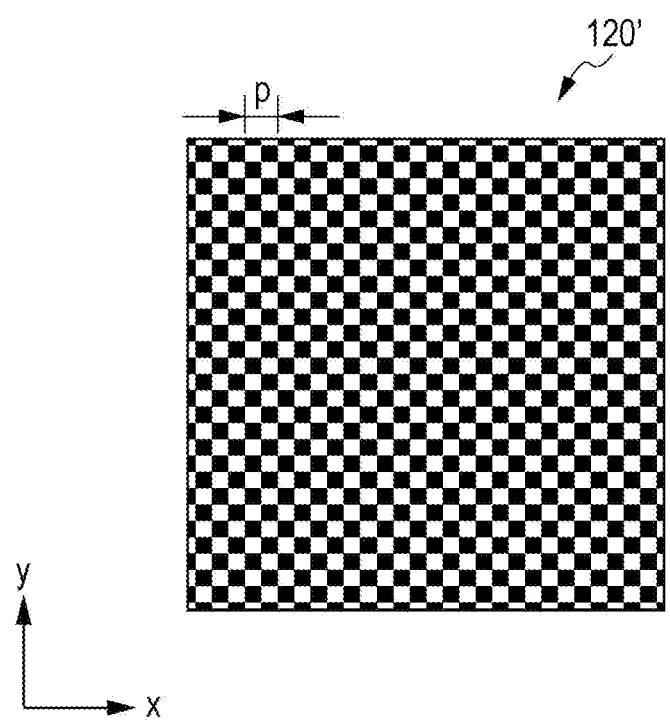
FIG. 7A is a plan view of a two-dimensional periodic structure.
Figure 7B:
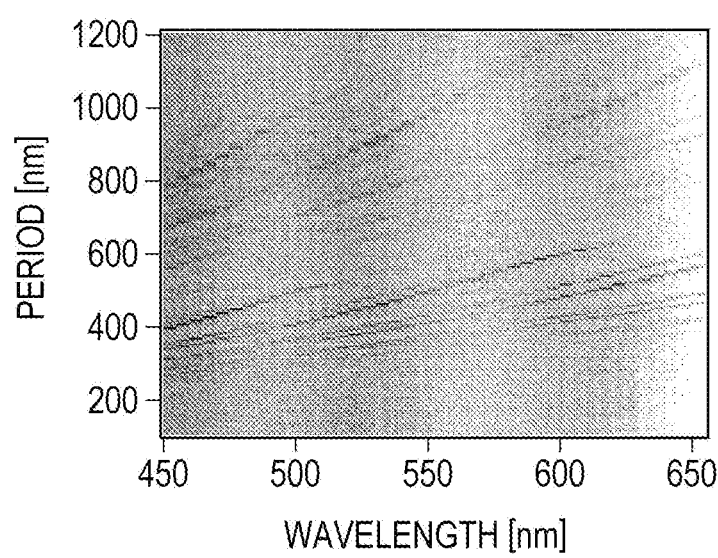
FIG. 7B is a graph showing the results of calculations performed as in FIG. 2 for the two-dimensional periodic structure.

The effect of a two-dimensional periodic structure was also studied. FIG. 7A is a partial plan view of a two-dimensional periodic structure 120' including recesses and projections arranged in both of the x direction and the y direction. In FIG. 7A, the black regions indicate the projections, and the white regions indicate the recesses. For a two-dimensional periodic structure, both of the diffraction in the x direction and the diffraction in the y direction have to be taken into account. Although the diffraction in only the x direction or the y direction is similar to that in a one-dimensional periodic structure, a two-dimensional periodic structure can be expected to give different results from a one-dimensional periodic structure because diffraction also occurs in a direction containing both of an x component and a y component (a direction inclined at 45 degrees). FIG. 7B shows the calculation results of the enhancement of light for the two-dimensional periodic structure. The calculations were performed under the same conditions as in FIG. 2 except for the type of periodic structure. As shown in FIG. 7B, peaks matching the peaks for the TE mode in FIG. 6 were observed in addition to peaks matching the peaks for the TM mode in FIG. 2. These results demonstrate that the two-dimensional periodic structure also converts and outputs the TE mode by diffraction. For a two-dimensional periodic structure, the diffraction that simultaneously satisfies the first-order diffraction conditions in both of the x direction and the y direction also has to be taken into account. Such diffracted light is output in the direction at the angle corresponding to $\sqrt{2}$ times ($2^{1/2}$ times) the period p. Thus, peaks will occur at $\sqrt{2}$ times the period p in addition to peaks that occur in a one-dimensional periodic structure. Such peaks are observed in FIG. 7B.

Figure 18A:
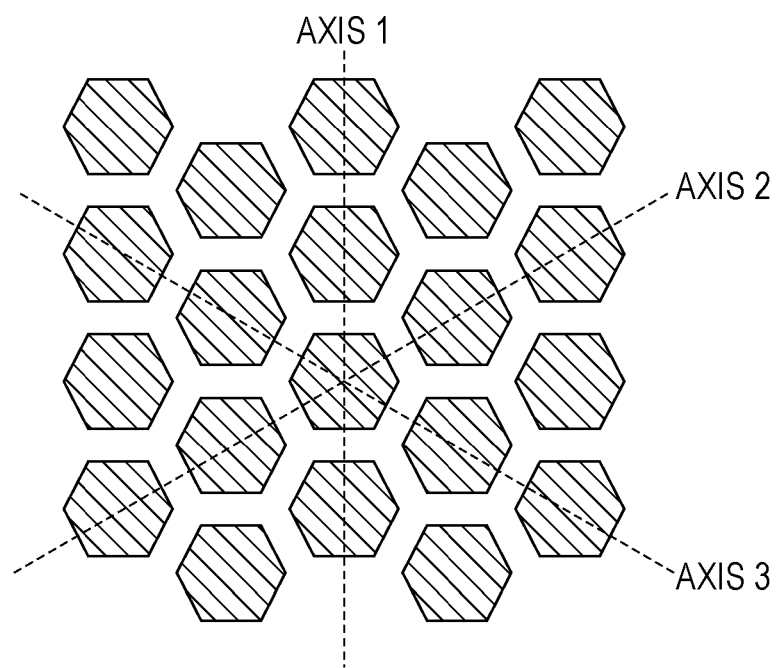
FIG. 18A is a schematic view of a two-dimensional periodic structure.
Figure 18B:
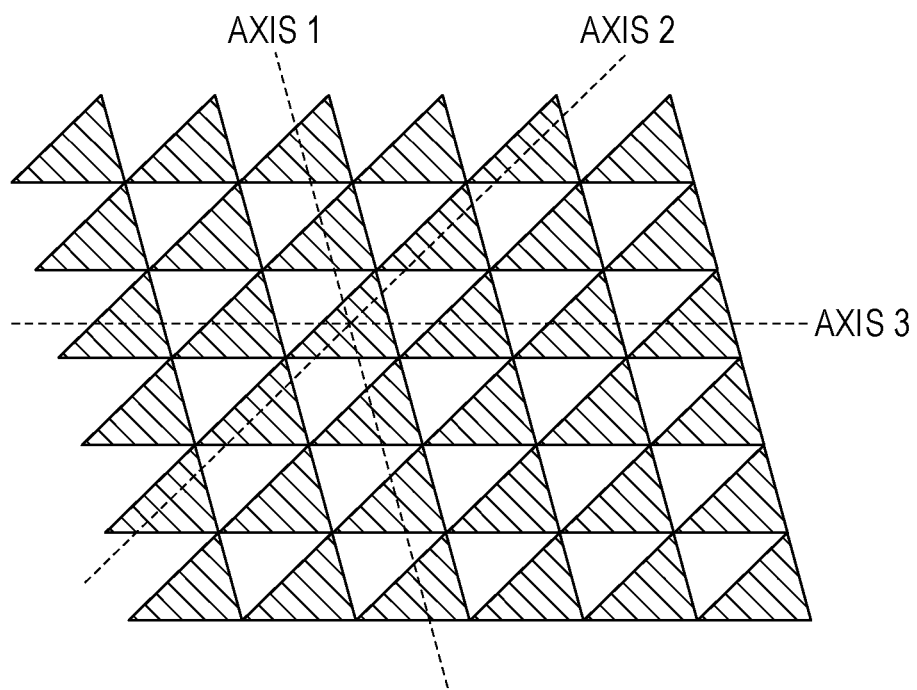
FIG. 18B is a schematic view of another two-dimensional periodic structure.

The two-dimensional periodic structure does not have to be a square grid structure having equal periods in the x direction and the y direction, as illustrated in FIG. 7A, but may be a hexagonal grid structure, as illustrated in FIG. 18A, or a triangular grid structure, as illustrated in FIG. 18B. The two-dimensional periodic structure may have different periods in different directions (in the x direction and the y direction for a square grid structure).

In this embodiment, as demonstrated above, light in a characteristic quasi-guided mode formed by the periodic structure and the photoluminescent layer can be selectively output only in the front direction through diffraction by the periodic structure. With this structure, the photoluminescent layer can be excited with excitation light such as ultraviolet light or blue light to output directional light.

4. Study on Constructions of Periodic Structure and Photoluminescent Layer

The effects of changes in various conditions such as the constructions and refractive indices of the periodic structure and the photoluminescent layer will now be described.

4-1. Refractive Index of Periodic Structure

Figure 8:
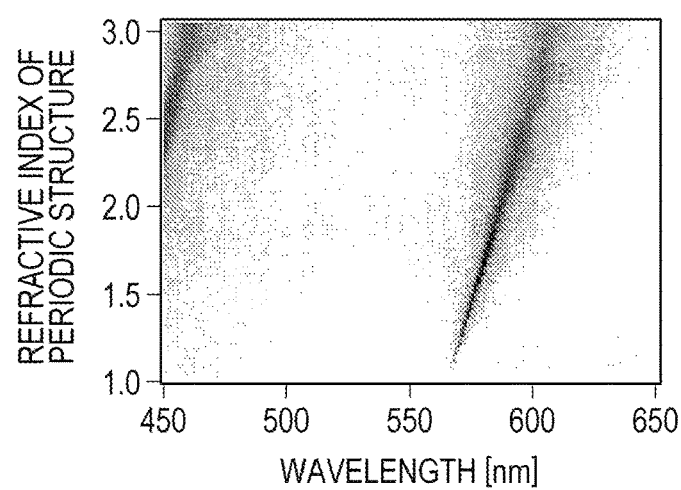
FIG. 8 is a graph showing the calculation results of the enhancement of light output in the front direction with varying emission wavelengths and varying refractive indices of the periodic structure.
Figure 9:
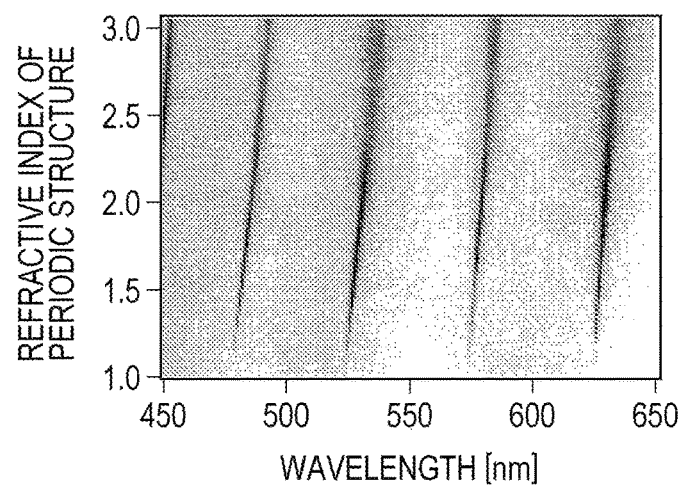
FIG. 9 is a graph showing the results obtained under the same conditions as in FIG. 8 except that the photoluminescent layer was assumed to have a thickness of 1,000 nm.

The refractive index of the periodic structure was studied. In the calculations performed herein, the photoluminescent layer was assumed to have a thickness of 200 nm and a refractive index $n_{wav}$ of 1.8, the periodic structure was assumed to be a one-dimensional periodic structure uniform in the y direction, as shown in FIG. 1A, having a height of 50 nm and a period of 400 nm, and the polarization of the light was assumed to be the TM mode, which has an electric field component parallel to the y direction. FIG. 8 shows the calculation results of the enhancement of light output in the front direction with varying emission wavelengths and varying refractive indices of the periodic structure. FIG. 9 shows the results obtained under the same conditions except that the photoluminescent layer was assumed to have a thickness of 1,000 nm.

The results show that a photoluminescent layer having a thickness of 1,000 nm (FIG. 9) results in a smaller shift in the wavelength at which the light intensity peaks (a peak wavelength) with the change in the refractive index of the periodic structure than a photoluminescent layer having a thickness of 200 nm (FIG. 8). This is because the quasi-guided mode is more affected by the refractive index of the periodic structure as the photoluminescent layer is thinner. Specifically, a periodic structure having a higher refractive index increases the effective refractive index and thus shifts the peak wavelength toward longer wavelengths, and this effect is more noticeable as the photoluminescent layer is thinner. The effective refractive index is determined by the refractive index of the medium present in the region where the electric field of the quasi-guided mode is distributed.

The results also show that a periodic structure having a higher refractive index results in a broader peak and a lower intensity. This is because a periodic structure having a higher refractive index outputs light in the quasi-guided mode at a higher rate and is therefore less effective in confining the light, that is, has a lower Q value. To maintain a high peak intensity, a structure may be employed in which light is moderately output using a quasi-guided mode that is effective in confining the light (that is, has a high Q value). This means that it is undesirable to use a periodic structure made of a material having a much higher refractive index than the photoluminescent layer. Thus, in order to increase the peak intensity and Q value, the refractive index of a dielectric material constituting the periodic structure (the light-transmissive layer) can be lower than or similar to the refractive index of the photoluminescent layer. This is also true if the photoluminescent layer contains materials other than photoluminescent materials.

4-2. Height of Periodic Structure

Figure 10:
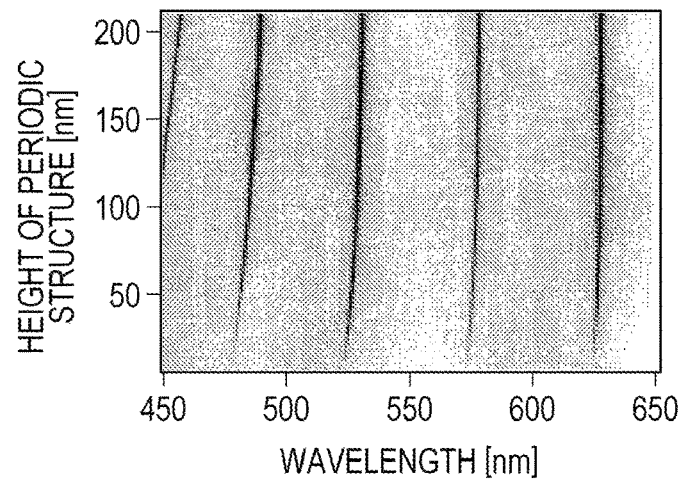
FIG. 10 is a graph showing the calculation results of the enhancement of light output in the front direction with varying emission wavelengths and varying heights of the periodic structure.
Figure 11:
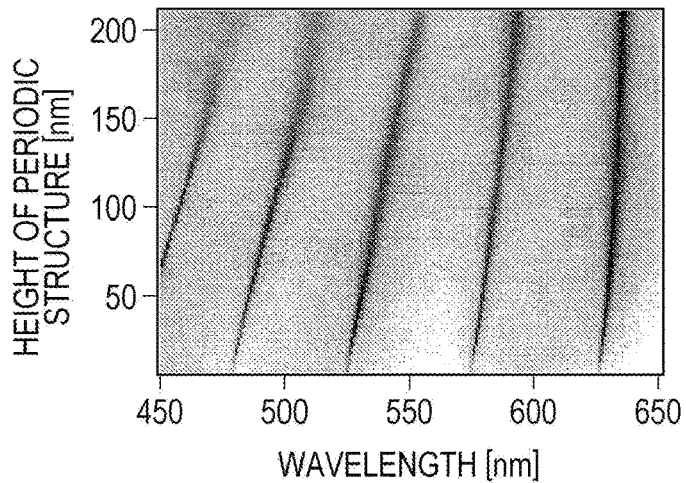
FIG. 11 is a graph showing the results of calculations performed under the same conditions as in FIG. 10 except that the periodic structure was assumed to have a refractive index $n_p$ of 2.0.

The height of the periodic structure was then studied. In the calculations performed herein, the photoluminescent layer was assumed to have a thickness of 1,000 nm and a refractive index $n_{wav}$ of 1.8, the periodic structure was assumed to be a one-dimensional periodic structure uniform in the y direction, as shown in FIG. 1A, having a refractive index $n_p$ of 1.5 and a period of 400 nm, and the polarization of the light was assumed to be the TM mode, which has an electric field component parallel to the y direction. FIG. 10 shows the calculation results of the enhancement of light output in the front direction with varying emission wavelengths and varying heights of the periodic structure. FIG. 11 shows the results of calculations performed under the same conditions except that the periodic structure was assumed to have a refractive index $n_p$ of 2.0. Whereas the results in FIG. 10 show that the peak intensity and the Q value (the peak line width) do not change above a certain height of the periodic structure, the results in FIG. 11 show that the peak intensity and the Q value decrease with increasing height of the periodic structure. If the refractive index $n_{wav}$ of the photoluminescent layer is higher than the refractive index $n_p$ of the periodic structure (FIG. 10), the light is totally reflected, and only a leaking (that is, evanescent) portion of the electric field of the quasi-guided mode interacts with the periodic structure. If the periodic structure has a sufficiently large height, the influence of the interaction between the evanescent portion of the electric field and the periodic structure remains constant irrespective of the height. In contrast, if the refractive index $n_{wav}$ of the photoluminescent layer is lower than the refractive index $n_p$ of the periodic structure (FIG. 11), the light reaches the surface of the periodic structure without being totally reflected and is therefore more influenced by a periodic structure with a larger height. As shown in FIG. 11, a height of approximately 100 nm is sufficient, and the peak intensity and the Q value decrease above a height of 150 nm. Thus, if the refractive index $n_{wav}$ of the photoluminescent layer is lower than the refractive index $n_p$ of the periodic structure, the periodic structure may have a height of 150 nm or less to achieve a high peak intensity and Q value.

4-3. Polarization Direction

Figure 12:
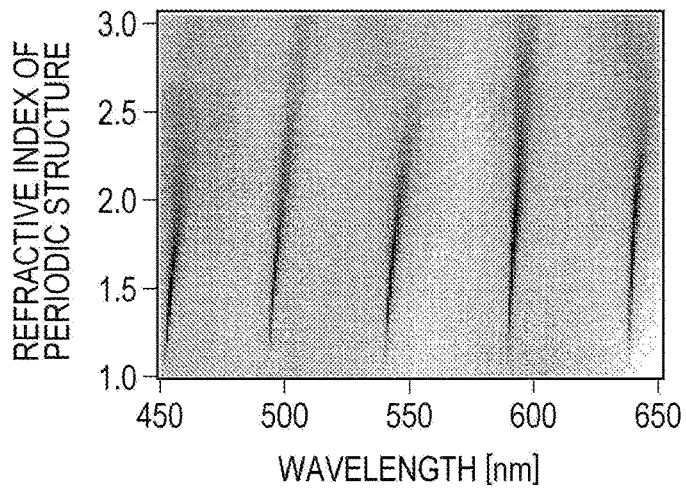
FIG. 12 is a graph showing the results of calculations performed under the same conditions as in FIG. 9 except that the polarization of the light was assumed to be the TE mode, which has an electric field component perpendicular to the y direction.

The polarization direction was then studied. FIG. 12 shows the results of calculations performed under the same conditions as in FIG. 9 except that the polarization of the light was assumed to be the TE mode, which has an electric field component perpendicular to the y direction. The TE mode is more influenced by the periodic structure than the TM mode because the electric field of the quasi-guided mode leaks more largely for the TE mode than for the TM mode. Thus, the peak intensity and the Q value decrease more significantly for the TE mode than for the TM mode if the refractive index $n_p$ of the periodic structure is higher than the refractive index $n_{wav}$ of the photoluminescent layer.

4-4. Refractive Index of Photoluminescent Layer

Figure 13:
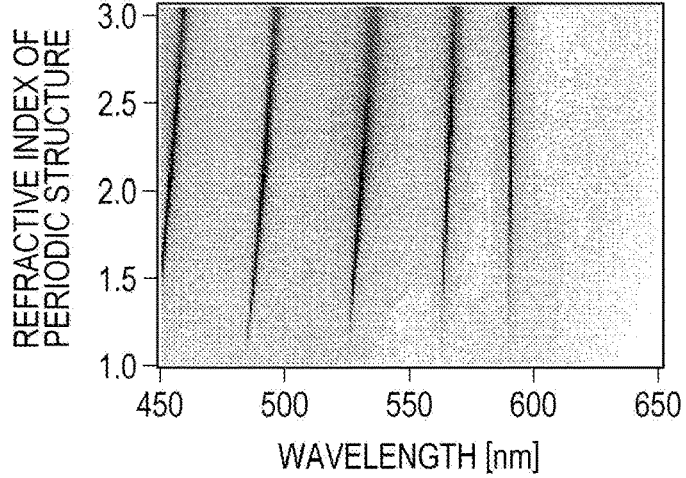
FIG. 13 is a graph showing the results of calculations performed under the same conditions as in FIG. 9 except that the photoluminescent layer was assumed to have a refractive index $n_{wav}$ of 1.5.

The refractive index of the photoluminescent layer was then studied. FIG. 13 shows the results of calculations performed under the same conditions as in FIG. 9 except that the photoluminescent layer was assumed to have a refractive index $n_{wav}$ of 1.5. The results for the photoluminescent layer having a refractive index $n_{wav}$ of 1.5 are similar to the results in FIG. 9. However, light having a wavelength of 600 nm or more was not output in the front direction. This is because, from the inequality (10), $\lambda_0 < n_{wav} \times p/m = 1.5 \times 400$ nm/1=600 nm.

The above analysis demonstrates that a high peak intensity and Q value can be achieved if the periodic structure has a refractive index lower than or similar to the refractive index of the photoluminescent layer or if the periodic structure has a higher refractive index than the photoluminescent layer and a height of 150 nm or less.

5. Modified Examples

Modified Examples of the present embodiment will be described below.

5-1. Structure Including Substrate

As described above, the light-emitting device may have a structure in which the photoluminescent layer 110 and the periodic structure 120 are formed on the transparent substrate 140, as illustrated in FIGS. 1C and 1D. Such a light-emitting device 100a may be produced by forming a thin film of the photoluminescent material for the photoluminescent layer 110 (optionally containing a matrix material; the same applies hereinafter) on the transparent substrate 140 and then forming the periodic structure 120 thereon. In this structure, the refractive index $n_s$ of the transparent substrate 140 has to be lower than or equal to the refractive index $n_{wav}$ of the photoluminescent layer 110 so that the photoluminescent layer 110 and the periodic structure 120 function to output light in a particular direction. If the transparent substrate 140 is provided in contact with the photoluminescent layer 110, the period p has to be set so as to satisfy the inequality (15), which is given by replacing the refractive index $n_{out}$ of the output medium in the inequality (10) by $n_s$.

Figure 14:
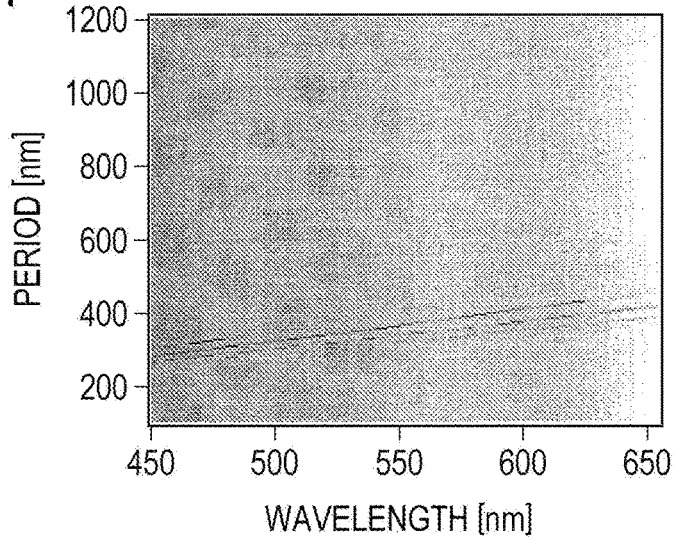
FIG. 14 is a graph showing the results of calculations performed under the same conditions as in FIG. 2 except that the photoluminescent layer and the periodic structure were assumed to be located on a transparent substrate having a refractive index of 1.5.
Figure 15:
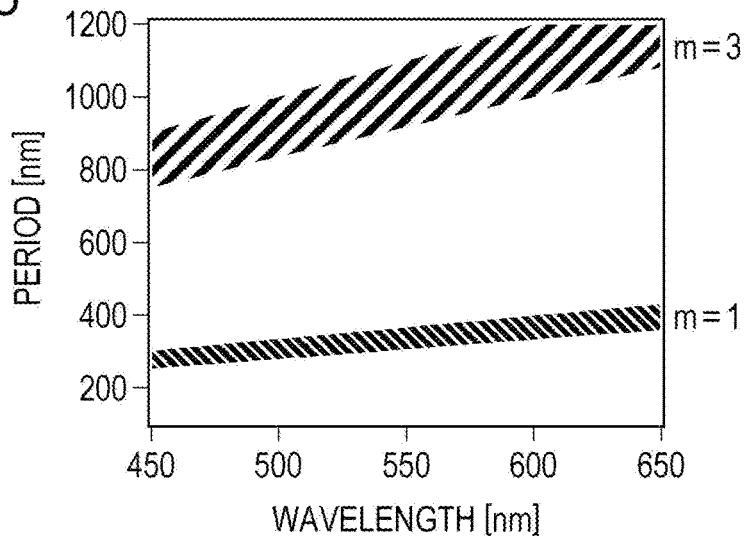
FIG. 15 is a graph illustrating the condition represented by the inequality (13)

To demonstrate this, calculations were performed under the same conditions as in FIG. 2 except that the photoluminescent layer 110 and the periodic structure 120 were assumed to be located on a transparent substrate 140 having a refractive index of 1.5. FIG. 14 shows the results of these calculations. As in the results in FIG. 2, light intensity peaks are observed at particular periods for each wavelength, although the ranges of periods where peaks appear differ from those in FIG. 2. FIG. 15 is a graph illustrating the condition represented by the inequality (15), which is given by substituting $n_{out} = n_s$ into the inequality (10). In FIG. 14, light intensity peaks are observed in the regions corresponding to the ranges shown in FIG. 15.

Thus, for the light-emitting device 100a, in which the photoluminescent layer 110 and the periodic structure 120 are located on the transparent substrate 140, a period p that satisfies the inequality (15) is effective, and a period p that satisfies the inequality (13) is significantly effective.

5-2. Light-Emitting Apparatus Including Excitation Light Source

Figure 16:
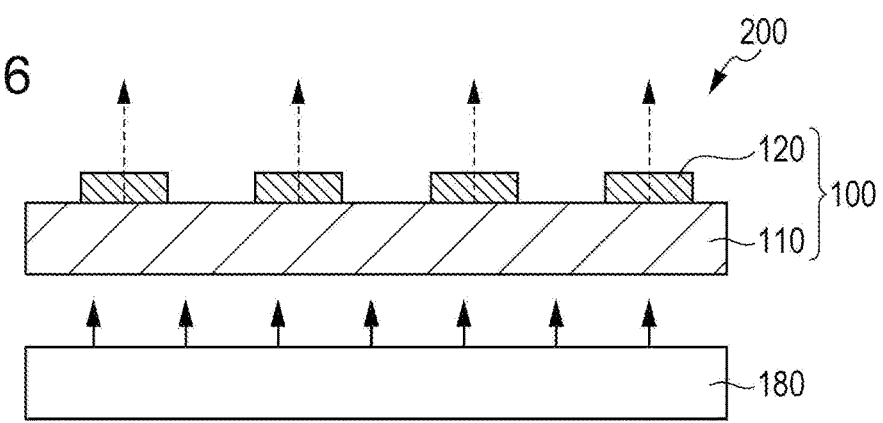
FIG. 16 is a schematic view of a light-emitting apparatus including a light-emitting device illustrated in FIGS. 1A and 1B and a light source that directs excitation light into a photoluminescent layer.

FIG. 16 is a schematic view of a light-emitting apparatus 200 including the light-emitting device 100 illustrated in FIGS. 1A and 1B and a light source 180 that emits excitation light toward the photoluminescent layer 110. In this embodiment, as described above, the photoluminescent layer can be excited with excitation light such as ultraviolet light or blue light to output directional light. The light source 180 can be configured to emit such excitation light to provide a directional light-emitting apparatus 200. Although the wavelength of the excitation light emitted from the light source 180 is typically within the ultraviolet or blue range, it is not necessarily within these ranges, but may be determined depending on the photoluminescent material for the photoluminescent layer 110. Although the light source 180 illustrated in FIG. 16 is configured to direct excitation light into the bottom surface of the photoluminescent layer 110, it may be configured otherwise, for example, to direct excitation light into the top surface of the photoluminescent layer 110.

Figure 17A:
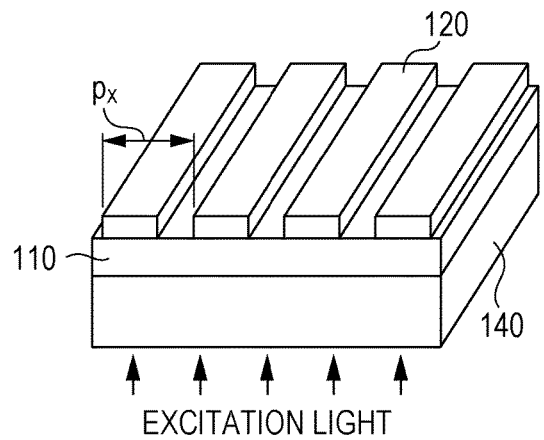
FIGS. 17A to 17D illustrate structures in which excitation light is coupled into a quasi-guided mode to efficiently output light.
Figure 17B:
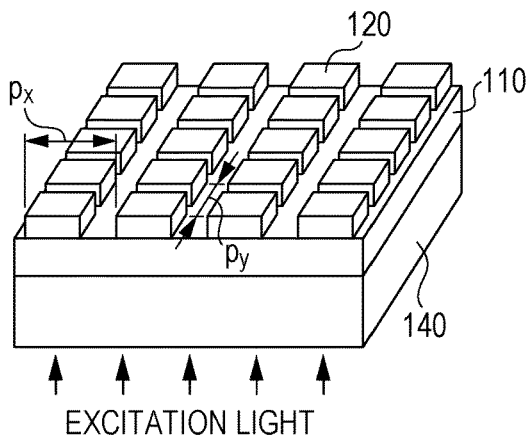

The excitation light may be coupled into a quasi-guided mode to efficiently output light. FIGS. 17A to 17D illustrate this method. In this example, as in the structure illustrated in FIGS. 1C and 1D, the photoluminescent layer 110 and the periodic structure 120 are formed on the transparent substrate 140. As illustrated in FIG. 17A, the period $p_x$ in the x direction is first determined so as to enhance light emission. As illustrated in FIG. 17B, the period $p_y$ in the y direction is then determined so as to couple the excitation light into a quasi-guided mode. The period $p_x$ is determined so as to satisfy the condition given by replacing p in the inequality (10) by $p_x$. The period $p_y$ is determined so as to satisfy the inequality (16):

$$\frac{m\lambda_{ex}}{n_{wav}} < p_y < \frac{m\lambda_{ex}}{n_{out}} \tag{16}$$

wherein m is an integer of 1 or more, $\lambda_{ex}$ is the wavelength of the excitation light, and $n_{out}$ is the refractive index of the medium having the highest refractive index of the media in contact with the photoluminescent layer 110 except the periodic structure 120.

In the example in FIGS. 17A to 17D, $n_{out}$ is the refractive index $n_s$ of the transparent substrate 140. For a structure including no transparent substrate 140, as illustrated in FIG. 16, $n_{out}$ denotes the refractive index of air (approximately 1.0).

In particular, the excitation light can be more effectively converted into a quasi-guided mode if m=1, that is, if the period $p_y$ is determined so as to satisfy the inequality (17):

$$\frac{\lambda_{ex}}{n_{wav}} < p_y < \frac{\lambda_{ex}}{n_{out}} \quad (17)$$

Thus, the excitation light can be converted into a quasi-guided mode if the period $p_y$ is set so as to satisfy the condition represented by the inequality (16) (particularly, the condition represented by the inequality (17)). As a result, the photoluminescent layer 110 can efficiently absorb the excitation light of the wavelength $\lambda_{ex}$.

Figure 17C:
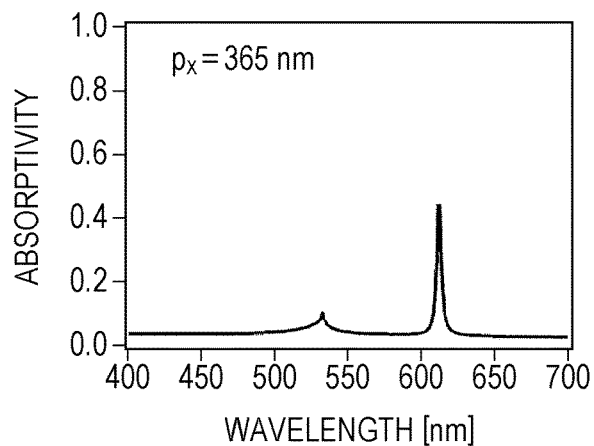
Figure 17D:
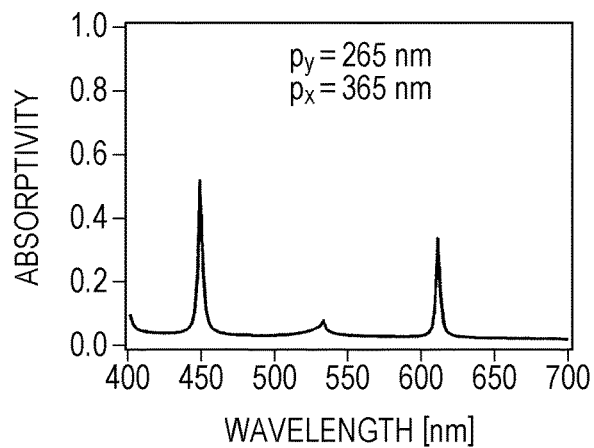

FIGS. 17C and 17D are the calculation results of the proportion of absorbed light to light incident on the structures illustrated in FIGS. 17A and 17B, respectively, for each wavelength. In these calculations, $p_x$=365 nm, $p_y$=265 nm, the photoluminescent layer 110 was assumed to have an emission wavelength λ of about 600 nm, the excitation light was assumed to have a wavelength $\lambda_{ex}$ of about 450 nm, and the photoluminescent layer 110 was assumed to have an extinction coefficient of 0.003. As shown in FIG. 17D, the photoluminescent layer 110 has high absorptivity not only for the light emitted from the photoluminescent layer 110 but also for the excitation light, that is, light having a wavelength of approximately 450 nm. This indicates that the incident light is effectively converted into a quasi-guided mode to increase the proportion of the light absorbed into the photoluminescent layer 110. The photoluminescent layer 110 also has high absorptivity for the emission wavelength, that is, approximately 600 nm. This indicates that light having a wavelength of approximately 600 nm incident on this structure is similarly effectively converted into a quasi-guided mode. The periodic structure 120 shown in FIG. 17B is a two-dimensional periodic structure including structures having different periods (that is, different periodic components) in the x direction and the y direction. Such a two-dimensional periodic structure including periodic components allows for high excitation efficiency and high output intensity. Although the excitation light is incident on the transparent substrate 140 in FIGS. 17A and 17B, the same effect can be achieved even if the excitation light is incident on the periodic structure 120.

Also available are two-dimensional periodic structures including periodic components as shown in FIGS. 18A and 18B. The structure illustrated in FIG. 18A includes periodically arranged projections having a hexagonal planar shape. The structure illustrated in FIG. 18B includes periodically arranged projections having a triangular planar shape. These structures have major axes (axes 1 to 3 in the examples in FIGS. 18A and 18B) that can be assumed to be periodic. Thus, the structures can have different periods in different axial directions. These periods may be set so as to increase the directionality of light beams of different wavelengths or to efficiently absorb the excitation light. In any case, each period is set so as to satisfy the condition corresponding to the inequality (10).

5-3. Periodic Structure on Transparent Substrate

Figure 19A:
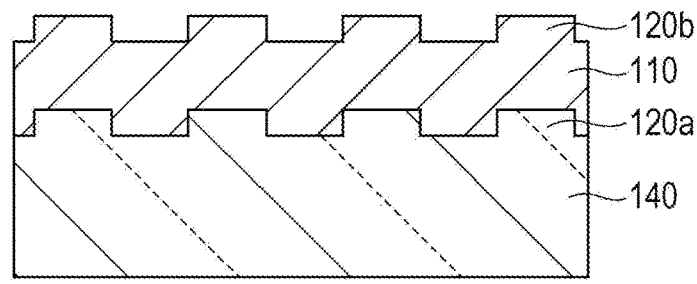
FIG. 19A is a schematic view of a modified example in which a periodic structure is formed on a transparent substrate.
Figure 19B:
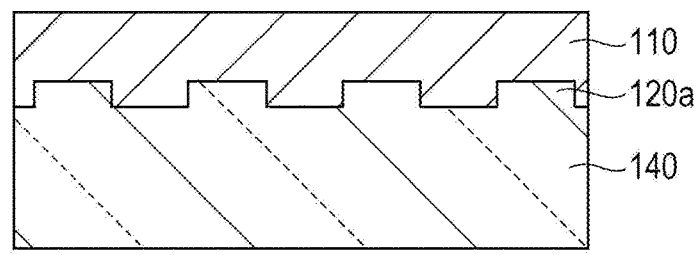
FIG. 19B is a schematic view of another modified example in which a periodic structure is formed on a transparent substrate.

As illustrated in FIGS. 19A and 19B, a periodic structure 120a may be formed on the transparent substrate 140, and the photoluminescent layer 110 may be located thereon. In the example in FIG. 19A, the photoluminescent layer 110 is formed along the texture of the periodic structure 120a on the transparent substrate 140. As a result, a periodic structure 120b with the same period is formed in the surface of the photoluminescent layer 110. In the example in FIG. 19B, the surface of the photoluminescent layer 110 is flattened. In these examples, directional light emission can be achieved by setting the period p of the periodic structure 120a so as to satisfy the inequality (15).

Figure 19C:
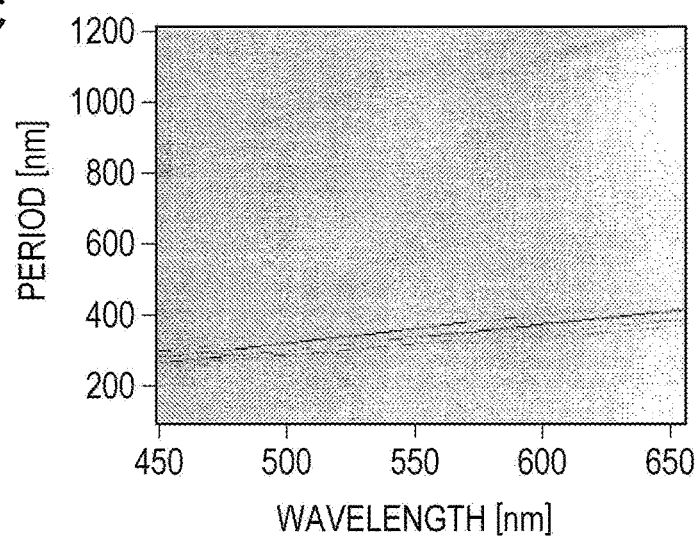
FIG. 19C is a graph showing the calculation results of the enhancement of light output from the structure illustrated in FIG. 19A in the front direction with varying emission wavelengths and varying periods of the periodic structure.

To verify the effect of these structures, the enhancement of light output from the structure in FIG. 19A in the front direction was calculated with varying emission wavelengths and varying periods of the periodic structure. In these calculations, the photoluminescent layer 110 was assumed to have a thickness of 1,000 nm and a refractive index $n_{wav}$ of 1.8, the periodic structure 120a was assumed to be a one-dimensional periodic structure uniform in the y direction having a height of 50 nm, a refractive index $n_p$ of 1.5, and a period of 400 nm, and the polarization of the light was assumed to be the TM mode, which has an electric field component parallel to the y direction. FIG. 19C shows the results of these calculations. In these calculations, light intensity peaks were observed at the periods that satisfy the condition represented by the inequality (15).

5-4. Powder

According to the above embodiment, light of any wavelength can be enhanced by adjusting the period of the periodic structure and the thickness of the photoluminescent layer. For example, if the structure illustrated in FIGS. 1A and 1B is formed using a photoluminescent material that emits light over a wide wavelength range, only light of a certain wavelength can be enhanced. Accordingly, the structure of the light-emitting device 100 as illustrated in FIGS. 1A and 1B may be provided in powder form for use as a fluorescent material. Alternatively, the light-emitting device 100 as illustrated in FIGS. 1A and 1B may be embedded in resin or glass.

Figure 20:
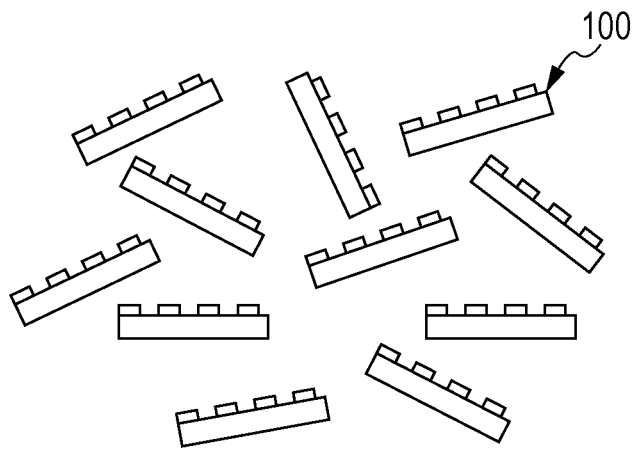
FIG. 20 is a schematic view of a mixture of light-emitting devices in powder form.

The single structure as illustrated in FIGS. 1A and 1B can output only light of a certain wavelength in a particular direction and is therefore not suitable for outputting, for example, white light, which has a wide wavelength spectrum. Accordingly, as shown in FIG. 20, light-emitting devices 100 that differ in the conditions such as the period of the periodic structure and the thickness of the photoluminescent layer may be mixed in powder form to provide a light-emitting apparatus with a wide wavelength spectrum. In such a case, the individual light-emitting devices 100 have sizes of, for example, several micrometers to several millimeters in one direction and can include, for example, one- or two-dimensional periodic structures with several periods to several hundreds of periods.

5-5. Array of Structures with Different Periods

Figure 21:
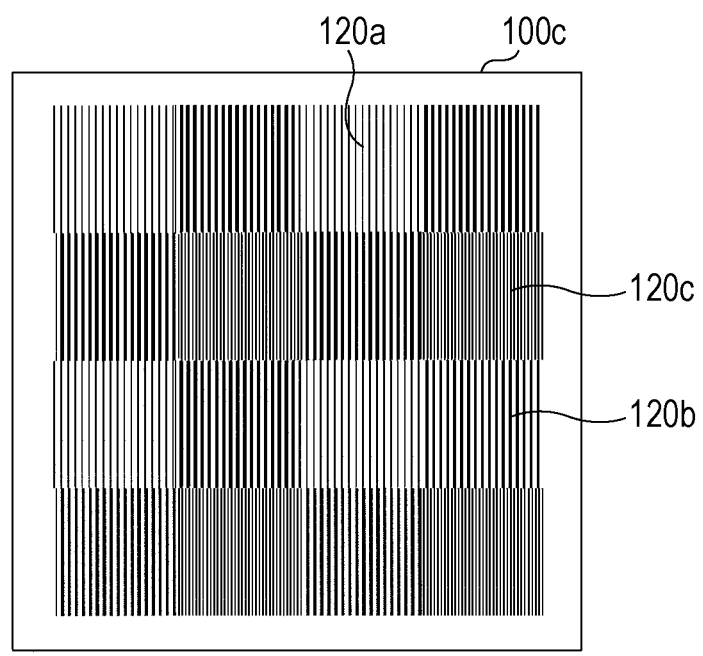
FIG. 21 is a plan view of a two-dimensional array of periodic structures having different periods on the photoluminescent layer.

FIG. 21 is a plan view of a two-dimensional array of periodic structures having different periods on the photoluminescent layer. In this example, three types of periodic structures 120a, 120b, and 120c are arranged without any space therebetween. The periods of the periodic structures 120a, 120b, and 120c are set so as to output, for example, light in the red, green, and blue wavelength ranges, respectively, in the front direction. Thus, structures having different periods can be arranged on the photoluminescent layer to output directional light with a wide wavelength spectrum. The periodic structures are not necessarily configured as described above, but may be configured in any manner.

5-6. Layered Structure

Figure 22:
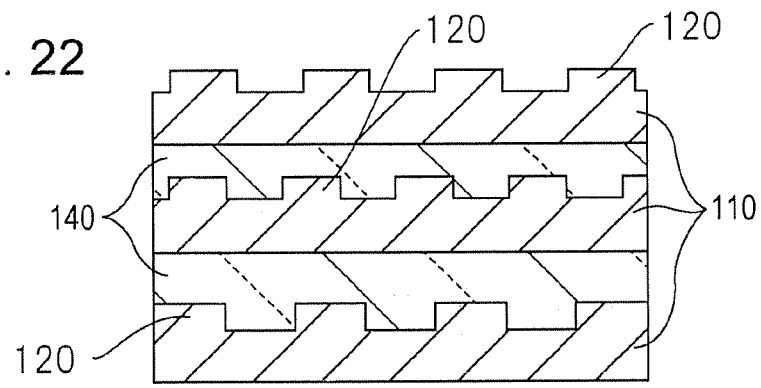
FIG. 22 is a schematic view of a light-emitting device including photoluminescent layers each having a textured surface.

FIG. 22 illustrates a light-emitting device including photoluminescent layers 110 each having a textured surface. A transparent substrate 140 is located between the photoluminescent layers 110. The texture on each of the photoluminescent layers 110 corresponds to the periodicstructure (light-transmissive layer) 120. The example in FIG. 22 includes three periodic structures having different periods. The periods of these periodic structures are set so as to output light in the red, green, and blue wavelength ranges in the front direction. The photoluminescent layer 110 in each layer is made of a material that emits light of the color corresponding to the period of the periodic structure in that layer. Thus, periodic structures having different periods can be stacked on top of each other to output directional light with a wide wavelength spectrum.

The number of layers and the constructions of the photoluminescent layer 110 and the periodic structure in each layer are not limited to those described above, but may be selected as appropriate. For example, for a structure including two layers, first and second photoluminescent layers are formed opposite each other with a light-transmissive substrate therebetween, and first and second periodic structures are formed on the surfaces of the first and second photoluminescent layers, respectively. In such a case, the first photoluminescent layer and the first periodic structure may together satisfy the condition corresponding to the inequality (15), whereas the second photoluminescent layer and the second periodic structure may together satisfy the condition corresponding to the inequality (15). For a structure including three or more layers, the photoluminescent layer and the periodic structure in each layer may satisfy the condition corresponding to the inequality (15). The positional relationship between the photoluminescent layers and the periodic structures in FIG. 22 may be reversed. Although the layers illustrated by the example in FIG. 22 have different periods, they may all have the same period. In such a case, although the spectrum cannot be broadened, the emission intensity can be increased.

5-7. Structure Including Protective Layer

Figure 23:
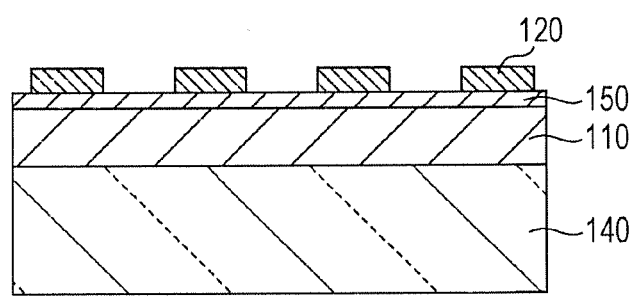
FIG. 23 is a cross-sectional view of a structure including a protective layer between a photoluminescent layer and a periodic structure.

FIG. 23 is a cross-sectional view of a structure including a protective layer 150 between the photoluminescent layer 110 and the periodic structure 120. The protective layer 150 may be provided to protect the photoluminescent layer 110. However, if the protective layer 150 has a lower refractive index than the photoluminescent layer 110, the electric field of the light leaks into the protective layer 150 only by about half the wavelength. Thus, if the protective layer 150 is thicker than the wavelength, no light reaches the periodic structure 120. As a result, there is no quasi-guided mode, and the function of outputting light in a particular direction cannot be achieved. If the protective layer 150 has a refractive index higher than or similar to that of the photoluminescent layer 110, the light reaches the interior of the protective layer 150; therefore, there is no limitation on the thickness of the protective layer 150. Nevertheless, a thinner protective layer 150 is desirable because more light is output if most of the portion in which light is guided (this portion is hereinafter referred to as "waveguide layer") is made of a photoluminescent material. The protective layer 150 may be made of the same material as the periodic structure (light-transmissive layer) 120. In this case, the light-transmissive layer 120 having the periodic structure functions as a protective layer. The light-transmissive layer 120 desirably has a lower refractive index than the photoluminescent layer 110.

6. Materials and Production Methods

Directional light emission can be achieved if the photoluminescent layer (or waveguide layer) and the periodic structure are made of materials that satisfy the above conditions. The periodic structure may be made of any material. However, a photoluminescent layer (or waveguide layer) or a periodic structure made of a medium with high light absorption is less effective in confining light and therefore results in a lower peak intensity and Q value. Thus, the photoluminescent layer (or waveguide layer) and the periodic structure may be made of media with relatively low light absorption.

For example, the periodic structure may be formed of a dielectric material having low light absorptivity. Examples of candidate materials for the periodic structure include magnesium fluoride ($MgF_2$), lithium fluoride (LiF), calcium fluoride ($CaF_2$), quartz ($SiO_2$), glasses, resins, magnesium oxide (MgO), indium tin oxide (ITO), titanium oxide ($TiO_2$), silicon nitride (SiN), tantalum pentoxide ($Ta_2O_5$), zirconia ($ZrO_2$), zinc selenide (ZnSe), and zinc sulfide (ZnS). To form a periodic structure having a lower refractive index than the photoluminescent layer, as described above, $MgF_2$, LiF, $CaF_2$, $SiO_2$, glasses, and resins can be suitably used, which have refractive indices of approximately 1.3 to 1.5.

The term "photoluminescent material" encompasses fluorescent materials and phosphorescent materials in a narrow sense, encompasses inorganic materials and organic materials (for example, dyes), and encompasses quantum dots (tiny semiconductor particles). In general, a fluorescent material containing an inorganic host material tends to have a higher refractive index. Examples of fluorescent materials that emit blue light include $M_{10}(PO_4)_6Cl_2:Eu^{2+}$ (wherein M is at least one element selected from Ba, Sr, and Ca), $BaMgAl_{10}O_{17}:Eu^{2+}$, $M_3MgSi_2O_8:Eu^{2+}$ (wherein M is at least one element selected from Ba, Sr, and Ca), and $M_5SiO_4Cl_6:Eu^{2+}$ (wherein M is at least one element selected from Ba, Sr, and Ca). Examples of fluorescent materials that emit green light include $M_2MgSi_2O_7:Eu^{2+}$ (wherein M is at least one element selected from Ba, Sr, and Ca), $SrSi_5AlO_2N_7:Eu^{2+}$, $SrSi_2O_2N_2:Eu^{2+}$, $BaAl_2O_4:Eu^{2+}$, $BaZrSi_3O_9:Eu^{2+}$, $M_2SiO_4:Eu^{2+}$ (wherein M is at least one element selected from Ba, Sr, and Ca), $BaSi_3O_4N_2:Eu^{2+}$, $Ca_8Mg(SiO_4)_4Cl_2:Eu^{2+}$, $Ca_3SiO_4Cl_2:Eu^{2+}$, $CaSi_{12-(m+n)}Al_{(m+n)}O_nN_{16-n}:Ce^{3+}$, and β-SiAlON:$Eu^{2+}$. Examples of fluorescent materials that emit red light include $CaAlSiN_3:Eu^{2+}$, $SrAlSi_4O_7:Eu^{2+}$, $M_2Si_5N_8:Eu^{2+}$ (wherein M is at least one element selected from Ba, Sr, and Ca), $MSiN_2:Eu^{2+}$ (wherein M is at least one element selected from Ba, Sr, and Ca), $MSi_2O_2N_2:Yb^{2+}$ (wherein M is at least one element selected from Sr and Ca), $Y_2O_2S:Eu^{3+}$, $Sm^{3+}$, $La_2O_2S:Eu^{3+}$, $Sm^{3+}$, $CaWO_4:Li^{1+}$, $Eu^{3+}$, $Sm^{3+}$, $M_2SiS_4:Eu^{2+}$ (wherein M is at least one element selected from Ba, Sr, and Ca), and $M_3SiO_5:Eu^{2+}$ (wherein M is at least one element selected from Ba, Sr, and Ca). Examples of fluorescent materials that emit yellow light include $Y_3Al_5O_{12}:Ce^{3+}$, $CaSi_2O_2N_2:Eu^{2+}$, $Ca_3Sc_2Si_3O_{12}:Ce^{3+}$, $CaSc_2O_4:Ce^{3+}$, α-SiAlON:$Eu^{2+}$, $MSi_2O_2N_2:Eu^{2+}$ (wherein M is at least one element selected from Ba, Sr, and Ca), and $M_7(SiO_3)_6Cl_2:Eu^{2+}$ (wherein M is at least one element selected from Ba, Sr, and Ca).

Examples of quantum dots include materials such as CdS, CdSe, core-shell CdSe/ZnS, and alloy CdSSe/ZnS. Light of various wavelengths can be emitted depending on the material. Examples of matrices for quantum dots include glasses and resins.

The transparent substrate 140, as shown in, for example, FIGS. 1C and 1D, is made of a light-transmissive material having a lower refractive index than the photoluminescent layer 110. Examples of such materials include magnesium fluoride ($MgF_2$), lithium fluoride (LiF), calcium fluoride ($CaF_2$), quartz ($SiO_2$), glasses, and resins.

Figure 24:
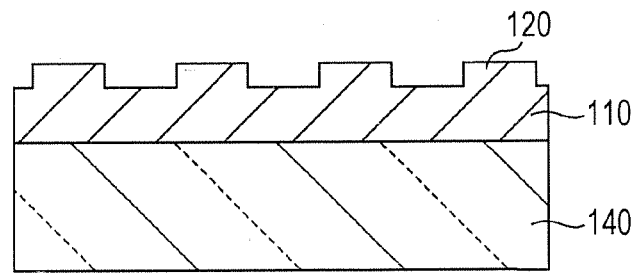
FIG. 24 is a cross-sectional view of a structure including a periodic structure formed by processing only a portion of a photoluminescent layer.

Exemplary production methods will be described below. A method for forming the structure illustrated in FIGS. 1C and 1D includes forming a thin film of the photoluminescent layer 110 on the transparent substrate 140, for example, by evaporation, sputtering, or coating of a fluorescent material, forming a dielectric film, and then patterning the dielectric film, for example, by photolithography to form the periodic structure 120. Alternatively, the periodic structure 120 may be formed by nanoimprinting. As shown in FIG. 24, the periodic structure 120 may also be formed by partially processing the photoluminescent layer 110. In such a case, the periodic structure 120 is made of the same material as the photoluminescent layer 110.

The light-emitting device 100 illustrated in FIGS. 1A and 1B can be manufactured, for example, by fabricating the light-emitting device 100a illustrated in FIGS. 1C and 1D and then stripping the photoluminescent layer 110 and the periodic structure 120 from the substrate 140.

The structure shown in FIG. 19A can be manufactured, for example, by forming the periodic structure 120a on the transparent substrate 140 by a process such as a semiconductor manufacturing processes or nanoimprinting and then depositing thereon the material for the photoluminescent layer 110 by a process such as evaporation or sputtering. The structure shown in FIG. 19B can be manufactured by filling the recesses in the periodic structure 120a with the photoluminescent layer 110 by a process such as coating.

The above methods of manufacture are for illustrative purposes only, and the light-emitting devices according to the embodiments of the present disclosure may be manufactured by other methods.

EXPERIMENTAL EXAMPLES

Light-emitting devices according to embodiments of the present disclosure are illustrated by the following examples.

A sample light-emitting device having the structure as illustrated in FIG. 19A was prepared and evaluated for its properties. The light-emitting device was prepared as described below.

Figure 25:
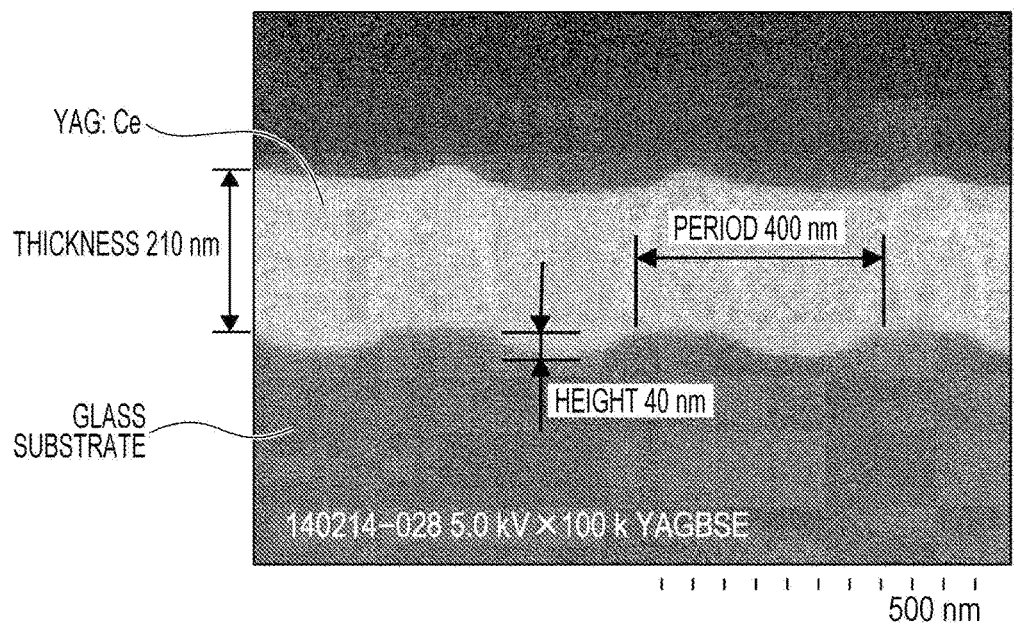
FIG. 25 is a cross-sectional transmission electron microscopy (TEM) image of a photoluminescent layer formed on a glass substrate having a periodic structure.
Figure 26:
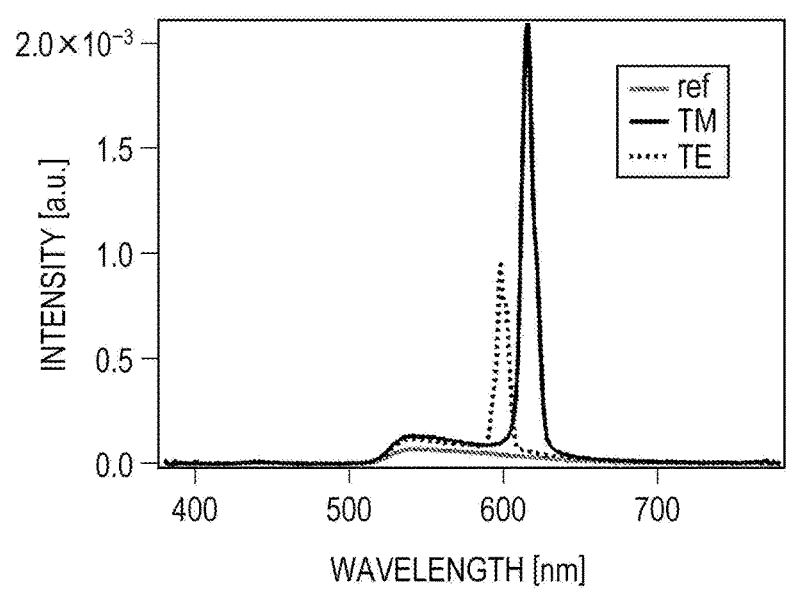
FIG. 26 is a graph showing the results of measurements of the spectrum of light output from a sample light-emitting device in the front direction.

A one-dimensional periodic structure (stripe-shaped projections) having a period of 400 nm and a height of 40 nm was formed on a glass substrate, and a photoluminescent material, that is, YAG:Ce, was deposited thereon to a thickness of 210 nm. FIG. 25 shows a cross-sectional transmission electron microscopy (TEM) image of the resulting light-emitting device. FIG. 26 shows the results of measurements of the spectrum of light emitted from the light-emitting device in the front direction when YAG:Ce was excited with an LED having an emission wavelength of 450 nm. FIG. 26 shows the results (ref) for a light-emitting device including no periodic structure, the results for the TM mode, and the results for the TE mode. The TM mode has a polarization component parallel to the one-dimensional periodic structure. The TE mode has a polarization component perpendicular to the one-dimensional periodic structure. The results show that the intensity of light of a particular wavelength in the case with the periodic structure is significantly higher than without a periodic structure. The results also show that the light enhancement effect is greater for the TM mode, which has a polarization component parallel to the one-dimensional periodic structure.

Figure 27A:
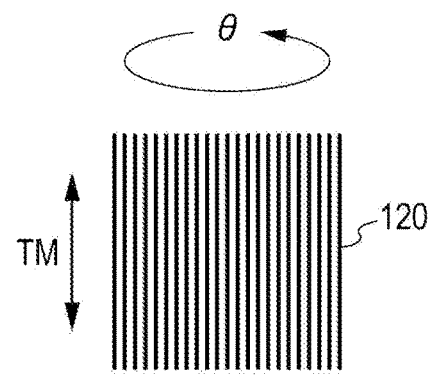
FIG. 27A is a schematic view of a light-emitting device that can emit linearly polarized light of the TM mode, rotated about an axis parallel to the line direction of the one-dimensional periodic structure.
Figure 27B:
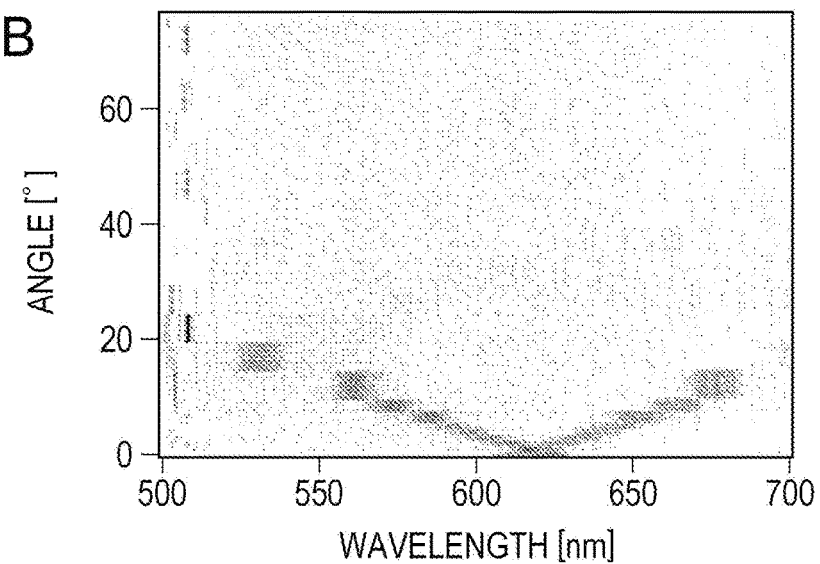
FIG. 27B is a graph showing the results of measurements of the angular dependence of light output from the sample light-emitting device rotated as illustrated in FIG. 27A.
Figure 27C:
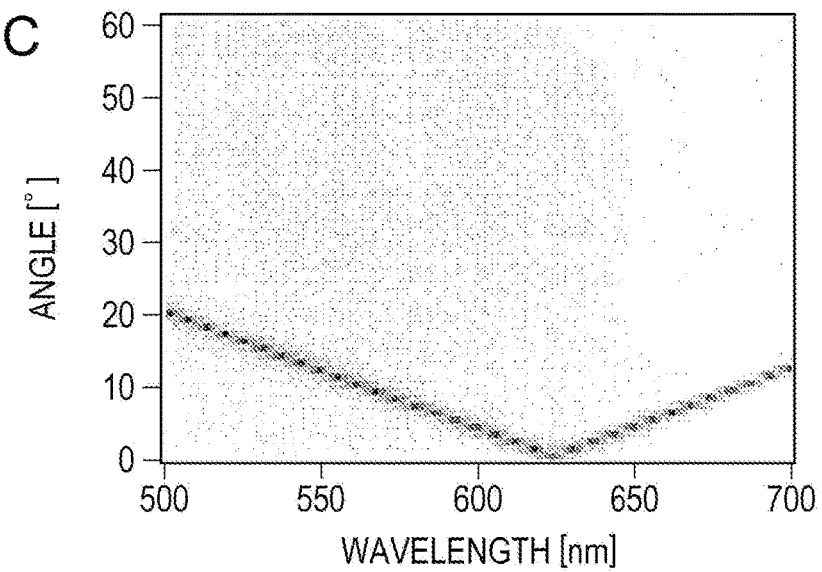
FIG. 27C is a graph showing the results of calculations of the angular dependence of light output from the sample light-emitting device rotated as illustrated in FIG. 27A.
Figure 27D:
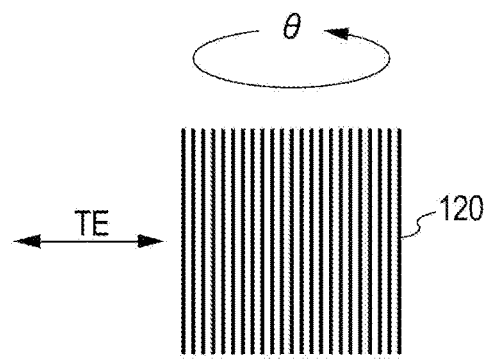
FIG. 27D is a schematic view of a light-emitting device that can emit linearly polarized light of the TE mode, rotated about an axis parallel to the line direction of the one-dimensional periodic structure.
Figure 27E:
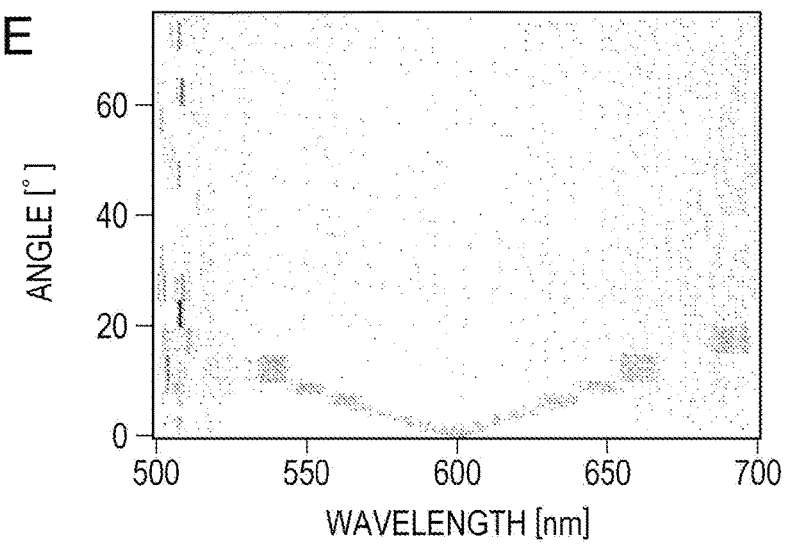
FIG. 27E is a graph showing the results of measurements of the angular dependence of light output from the sample light-emitting device rotated as illustrated in FIG. 27D.
Figure 27F:
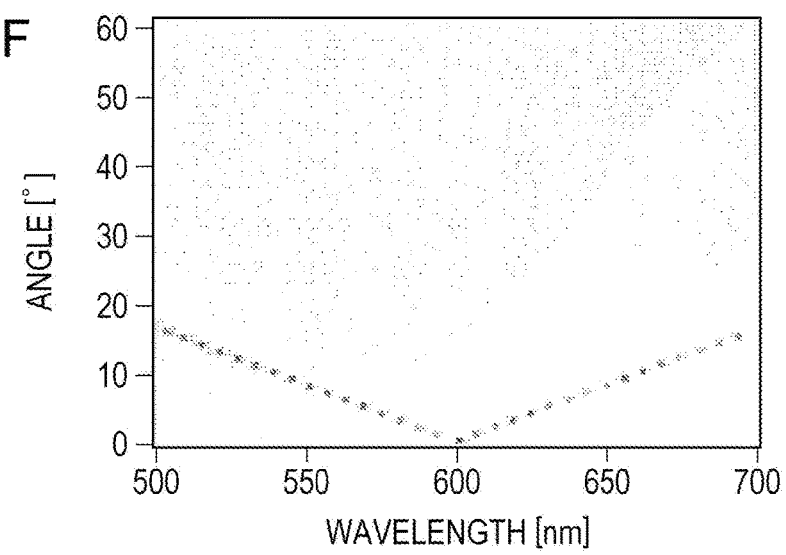
FIG. 27F is a graph showing the results of calculations of the angular dependence of light output from the sample light-emitting device rotated as illustrated in FIG. 27D.
Figure 28A:
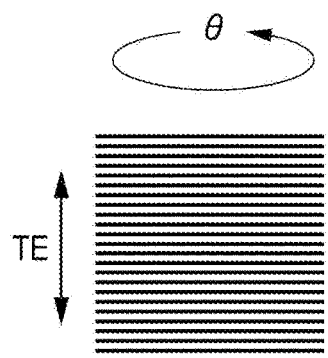
FIG. 28A is a schematic view of a light-emitting device that can emit linearly polarized light of the TE mode, rotated about an axis perpendicular to the line direction of the one-dimensional periodic structure.
Figure 28B:
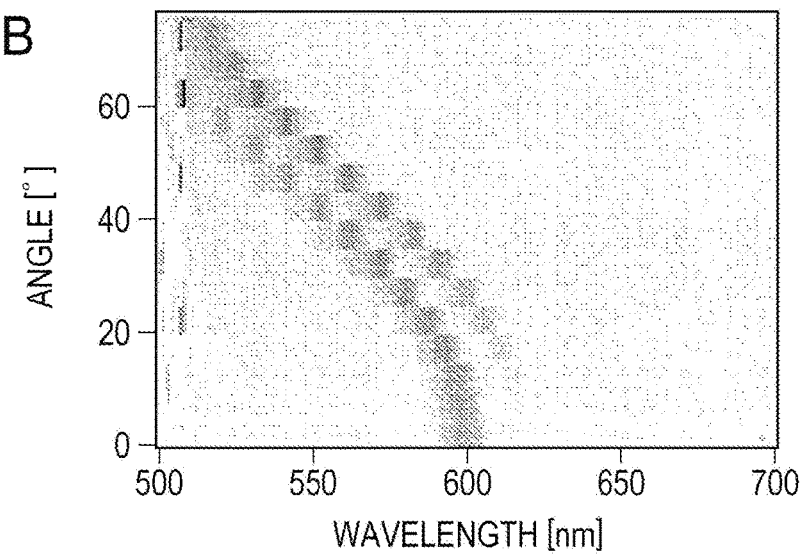
FIG. 28B is a graph showing the results of measurements of the angular dependence of light output from the sample light-emitting device rotated as illustrated in FIG. 28A.
Figure 28C:
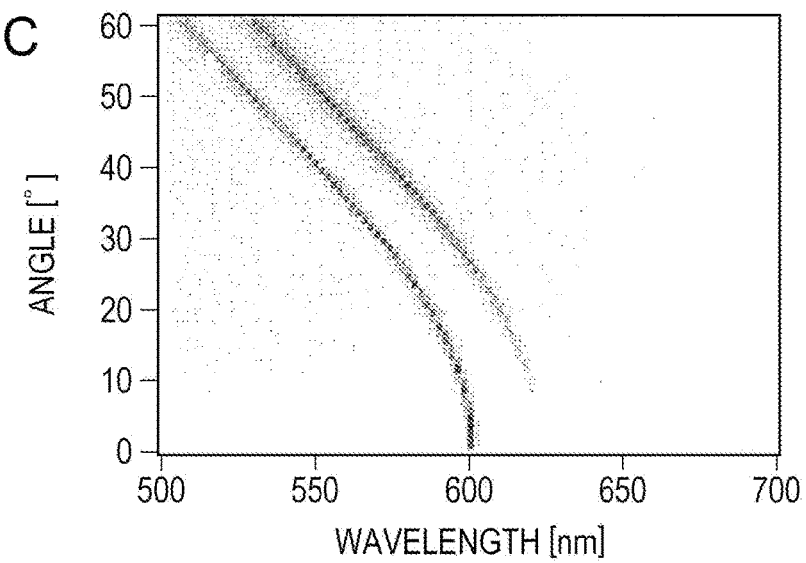
FIG. 28C is a graph showing the results of calculations of the angular dependence of light output from the sample light-emitting device rotated as illustrated in FIG. 28A.
Figure 28D:
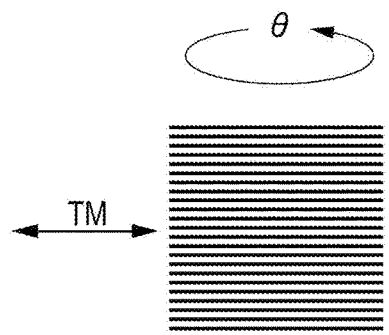
FIG. 28D is a schematic view of a light-emitting device that can emit linearly polarized light of the TM mode, rotated about an axis perpendicular to the line direction of the one-dimensional periodic structure.
Figure 28E:
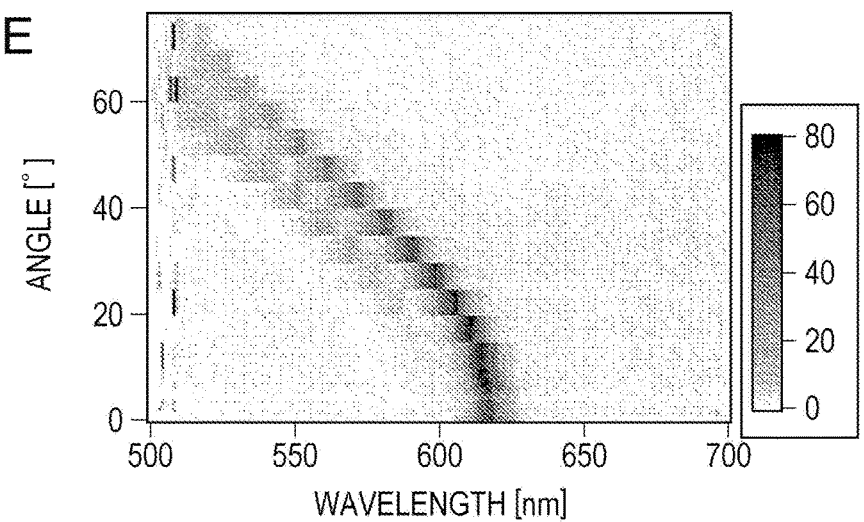
FIG. 28E is a graph showing the results of measurements of the angular dependence of light output from the sample light-emitting device rotated as illustrated in FIG. 28D.
Figure 28F:
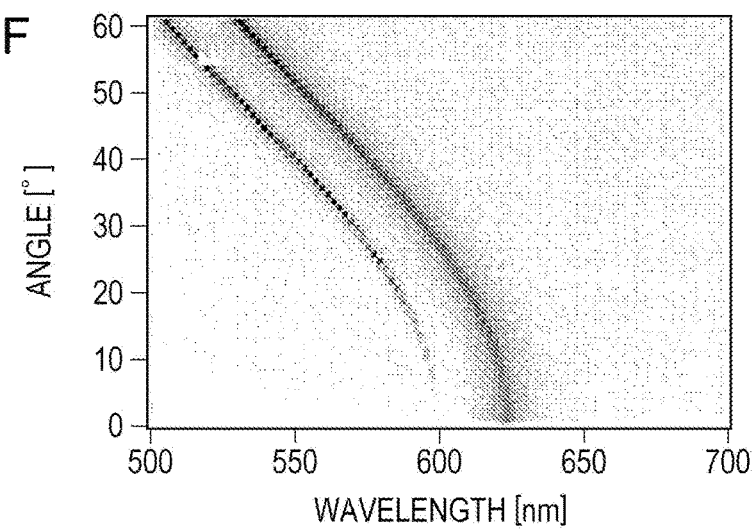
FIG. 28F is a graph showing the results of calculations of the angular dependence of light output from the sample light-emitting device rotated as illustrated in FIG. 28D.

FIGS. 27A to 27F and FIGS. 28A to 28F show the results of measurements and calculations of the angular dependence of the intensity of light output from the same sample. FIGS. 27B and 27E show the results of measurements and FIGS. 27C and 27F show the results of calculations for rotation about an axis parallel to the line direction of the one-dimensional periodic structure (that is, the periodic structure 120). FIGS. 28B and 28E show the results of measurements and FIGS. 28C and 28F show the results of calculations for rotation about an axis perpendicular to the line direction of the one-dimensional periodic structure (that is, the periodic structure 120). FIGS. 27A to 27F and FIGS. 28A to 28F show the results for linearly polarized light in the TM mode and the TE mode. FIG. 27A shows the results for linearly polarized light in the TM mode. FIGS. 27D to 27F show the results for linearly polarized light in the TE mode. FIGS. 28A to 28C show the results for linearly polarized light in the TE mode. FIGS. 28D to 28F show the results for linearly polarized light in the TM mode. As can be seen from FIGS. 27A to 27F and FIGS. 28A to 28F, the enhancement effect is greater for the TM mode, and the enhanced wavelength shifts with angle. For example, light having a wavelength of 610 nm is observed only in the TM mode and in the front direction, indicating that the light is directional and polarized. In addition, the top and bottom parts of each figure match each other. Thus, the validity of the above calculations was experimentally demonstrated.

Figure 29:
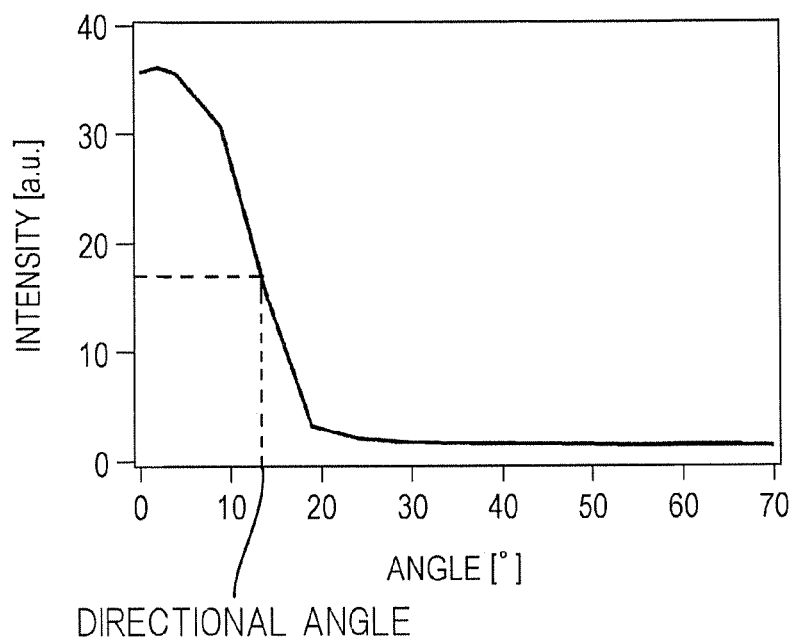
FIG. 29 is a graph showing the results of measurements of the angular dependence of light (wavelength: 610 nm) output from the sample light-emitting device.

Among the above results of measurements, for example, FIG. 29 shows the angular dependence of the intensity of light having a wavelength of 610 nm for rotation about an axis perpendicular to the line direction. As shown in FIG. 29, the light was significantly enhanced in the front direction and was little enhanced at other angles. The directional angle of the light output in the front direction is less than 15 degrees. The directional angle is the angle at which the intensity is 50% of the maximum intensity and is expressed as the angle of one side with respect to the direction with the maximum intensity. This demonstrates that directional light emission was achieved. In addition, all the light was in the TM mode, which demonstrates that polarized light emission was simultaneously achieved.

Although YAG:Ce, which emits light in a wide wavelength range, was used in the above experiment, directional and polarized light emission can also be achieved using a similar structure including a photoluminescent material that emits light in a narrow wavelength range. Such a photoluminescent material does not emit light of other wavelengths and can therefore be used to provide a light source that does not emit light in other directions or in other polarized states.

Modified examples of a light-emitting device and a light-emitting apparatus according to the present disclosure will be described below.

Figure 31:
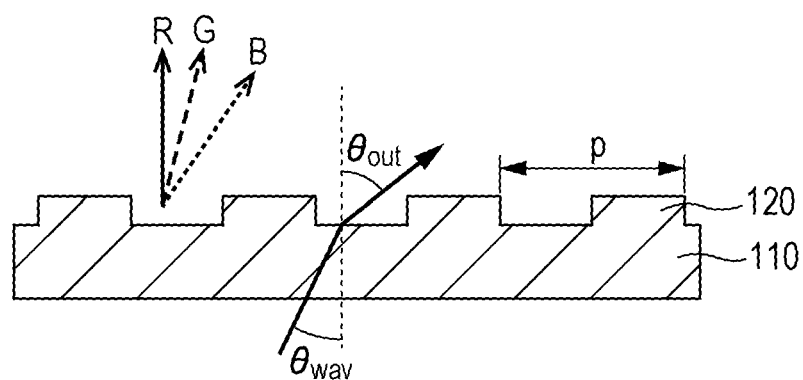
FIG. 31 is a schematic view illustrating the relationship between the wavelength and output direction of light under the emission enhancement effect in a light-emitting device having a periodic structure on a photoluminescent layer.

As described above, the wavelength and output direction of light under the light enhancement effect depend on the submicron structure of a light-emitting device according to the present disclosure. FIG. 31 illustrates a light-emitting device having a periodic structure 120 on a photoluminescent layer 110. The periodic structure 120 is formed of the same material as the photoluminescent layer 110 and is the same as the one-dimensional periodic structure 120 illustrated in FIG. 1A. Light under the light enhancement effect of the one-dimensional periodic structure 120 satisfies $p \times n_{wav} \times \sin \theta_{wav} - p \times n_{out} \times \sin \theta_{out} = m\lambda$ (see equation (5)), wherein p (nm) denotes the period of the one-dimensional periodic structure 120, $n_{wav}$ denotes the refractive index of the photoluminescent layer 110, $n_{out}$ denotes the refractive index of an outer medium toward which the light is output, $\theta_{wav}$ denotes the incident angle on the one-dimensional periodic structure 120, and $\theta_{out}$ denotes the angle at which the light is output from one-dimensional periodic structure 120 to the outer medium. $\lambda$ is the light wavelength in air, and m is an integer.

The equation can be transformed into $\theta_{out} = \arcsin [(n_{wav} \times \sin \theta_{wav} - m\lambda/p)/n_{out}]$. Thus, in general, the output angle $\theta_{out}$ of light under the light enhancement effect varies with the wavelength λ. Consequently, as schematically illustrated in FIG. 31, the color of visible light varies with the observation direction.

This visual angle dependency can be reduced by determining $n_{wav}$ and $n_{out}$ so as to make $(n_{wav} \times \sin\theta_{wav} - m\lambda/p)/n_{out}$ constant for any wavelength λ. The refractive indices of substances have wavelength dispersion (wavelength dependence). Thus, a material to be selected should have the wavelength dispersion characteristics of $n_{wav}$ and $n_{out}$ such that $(n_{wav} \times \sin\theta_{wav} - m\lambda/p)/n_{out}$ is independent of the wavelength λ. For example, if the outer medium is air, $n_{out}$ is approximately 1.0 irrespective of the wavelength. Thus, the material of the photoluminescent layer 110 and the one-dimensional periodic structure 120 is desirably a material having narrow wavelength dispersion of the refractive index $n_{wav}$. It is also desirable that the material have reciprocal dispersion, and the refractive index $n_{wav}$ decrease with decreasing wavelength of light.

Figure 32A:
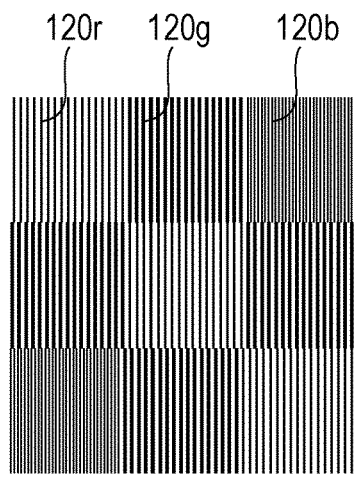
FIGS. 32A to 32C are schematic plan views of the structure of an array of periodic structures having different wavelengths at which the emission enhancement effect is produced.

As illustrated in FIG. 32A, an array of periodic structures having different wavelengths at which the light enhancement effect is produced can emit white light. In the example illustrated in FIG. 32A, a periodic structure 120r that can enhance red light (R), a periodic structure 120g that can enhance green light (G), and a periodic structure 120b that can enhance blue light (B) are arranged in a matrix. Each of the periodic structures 120r, 120g, and 120b may be a one-dimensional periodic structure. The projections of the periodic structures 120r, 120g, and 120b are arranged in parallel. Thus, all the colored light beams have the same polarization characteristics. Light beams of three primary colors emitted from the periodic structures 120r, 120g, and 120b under the light enhancement effect are mixed to produce linearly polarized white light.

Each of the periodic structures 120r, 120g, and 120b arranged in a matrix is referred to as a unit periodic structure (or pixel). The size of the unit periodic structure may be at least three times the period. It is desirable that the unit periodic structures be not perceived by the human eye in order to produce the color mixing effect. For example, it is desirable that the length of one side be less than 1 mm. Although each of the unit periodic structures is square in FIG. 32A, adjacent periodic structures 120r, 120g, and 120b may be in the shape other than square, such as rectangular, triangular, or hexagonal.

A photoluminescent layer under each of the periodic structures 120r, 120g, and 120b may be the same or may be formed of different photoluminescent materials corresponding to each color of light.

Figure 32B:
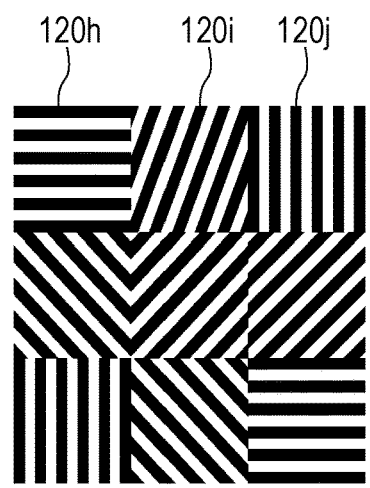

As illustrated in FIG. 32B, one-dimensional periodic structures (including periodic structures 120h, 120i, and 120j) may be arranged such that the longitudinal direction of the projections in one periodic structure is different from the longitudinal direction of the projections in another periodic structure. Light emitted from each of the periodic structures under the light enhancement effect may have the same wavelength or different wavelengths. For example, the same periodic structures arranged as illustrated in FIG. 32B can produce unpolarized light. The periodic structures 120r, 120g, and 120b in FIG. 32A arranged as illustrated in FIG. 32B can produce unpolarized white light as a whole.

Figure 32C:
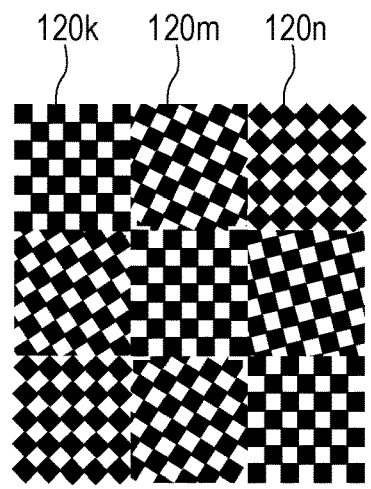

As a matter of course, the periodic structures are not limited to one-dimensional periodic structures and may be two-dimensional periodic structures (including periodic structures 120k, 120m, and 120n), as illustrated in FIG. 32C. The period and direction of each of the periodic structures 120k, 120m, and 120n may be the same or different, as described above, and may be appropriately determined as required.

Figure 32D:
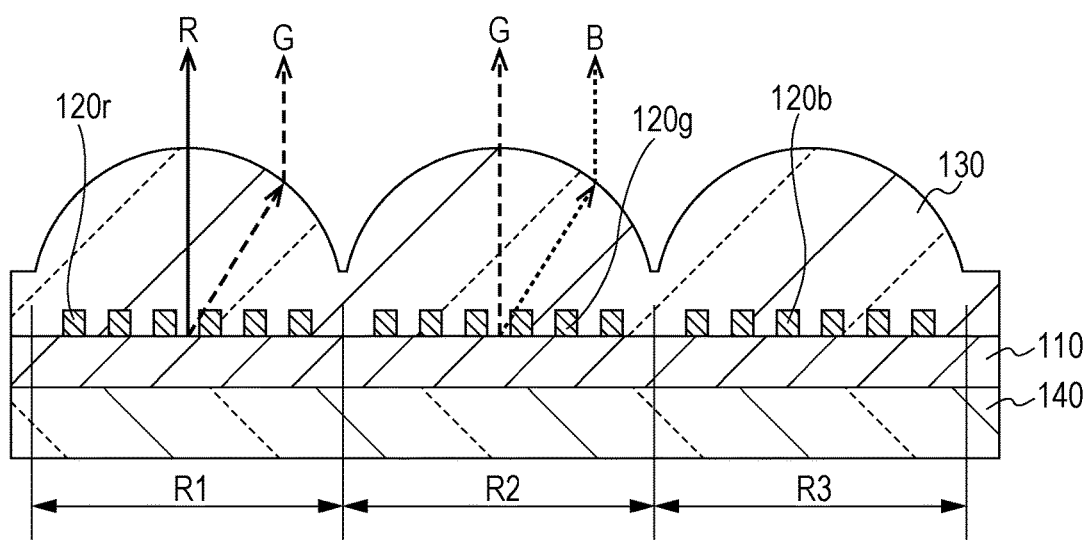
FIG. 32D is a schematic cross-sectional view of a light-emitting device including microlenses.

As illustrated in FIG. 32D, for example, microlenses 130 may be located on a light output side of a light-emitting device. The microlenses 130 can refract oblique light in the normal direction and produce the color mixing effect.

The light-emitting device illustrated in FIG. 32D includes regions R1, R2, and R3, which include the periodic structures 120r, 120g, and 120b, respectively, illustrated in FIG. 32A. In the region R1, the periodic structure 120r outputs red light R in the normal direction and, for example, outputs green light G in an oblique direction. The microlens 130 refracts the oblique green light G in the normal direction. Consequently, a mixture of the red light R and the green light G is observed in the normal direction. Thus, the microlenses 130 can reduce the difference in light wavelength depending on the angle. Although the microlens array including microlenses corresponding to the periodic structures is described here, another microlens array is also possible. As a matter of course, periodic structures to be tiled are not limited to those described above and may be the same periodic structures or the structures illustrated in FIG. 32B or 32C.

Lenticular lenses may also be used as optical elements for refracting oblique light instead of the microlens array. In addition to lenses, prisms may also be used. A prism array may also be used, and a prism corresponding to each periodic structure may be arranged. Prisms of any shape may be used. For example, triangular prisms or pyramidal prisms may be used.

Figure 33A:
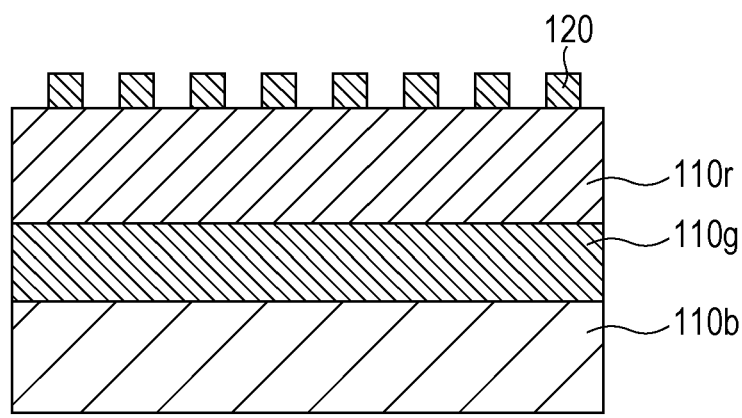
FIGS. 33A and 33B are schematic cross-sectional views of a light-emitting device that includes photoluminescent layers having different emission wavelengths.
Figure 33B:
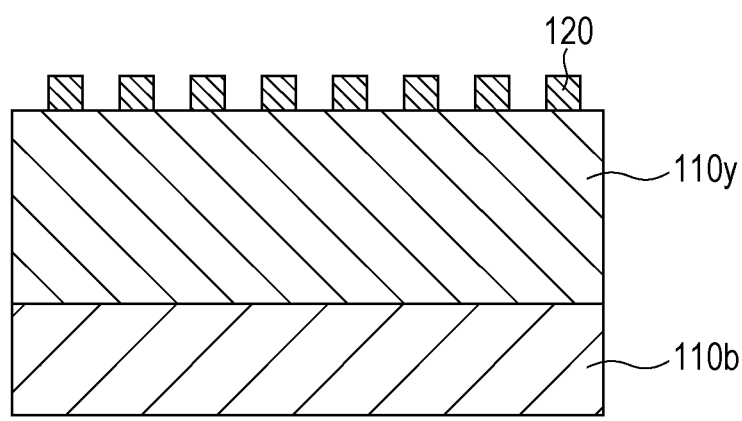

White light (light having a broad spectral width) may be produced by using the periodic structure described above or a photoluminescent layer as illustrated in FIGS. 33A and 33B. As illustrated in FIG. 33A, photoluminescent layers 110b, 110g, and 110r having different emission wavelengths may be stacked to produce white light. The stacking sequence is not limited to that illustrated in FIG. 34A. As illustrated in FIG. 33B, a photoluminescent layer 110y that emits yellow light may be located on a photoluminescent layer 110b that emits blue light. The photoluminescent layer 110y may be formed of YAG.

When photoluminescent materials, such as fluorescent dyes, to be mixed with a matrix (host) material are used, photoluminescent materials having different emission wavelengths may be mixed with the matrix material to emit white light from a single photoluminescent layer. Such a photoluminescent layer that can emit white light may be used in tiled unit periodic structures as illustrated in FIGS. 32A to 32C.

When an inorganic material (for example, YAG) is used as a material of the photoluminescent layer 110, the inorganic material may be subjected to heat treatment at more than 1000° C. in the production process. During the production process, impurities may diffuse from an underlayer (typically, a substrate) and affect the light-emitting properties of the photoluminescent layer 110. In order to prevent impurities from diffusing into the photoluminescent layer 110, a diffusion-barrier layer (barrier layer) 108 may be located under the photoluminescent layer 110, as illustrated in FIGS. 34A to 34D. As illustrated in FIGS. 34A to 34D, the diffusion-barrier layer 108 is located under the photoluminescent layer 110 in the structures described above.

Figure 34A:
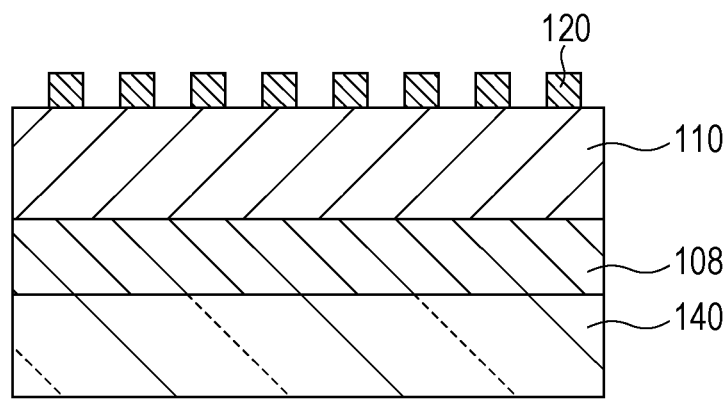
FIGS. 34A to 34D are schematic cross-sectional views of a light-emitting device that includes a diffusion-barrier layer (barrier layer) under a photoluminescent layer.
Figure 34B:
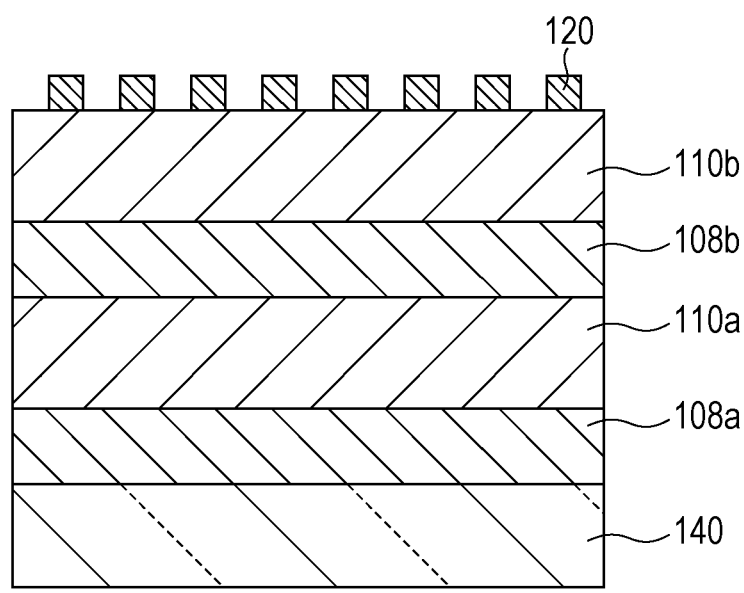

For example, as illustrated in FIG. 34A, the diffusion-barrier layer 108 is located between a substrate 140 and the photoluminescent layer 110. As illustrated in FIG. 34B, when there are photoluminescent layers 110a and 110b, diffusion-barrier layers 108a and 108b are located under the photoluminescent layers 110a and 110b, respectively.

Figure 34C:
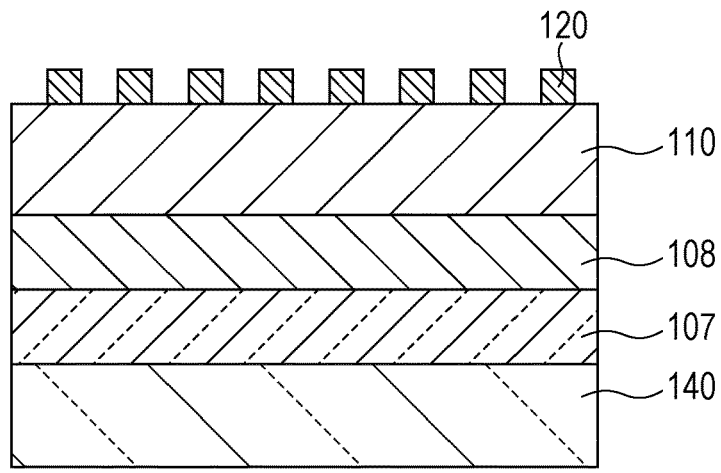
Figure 34D:
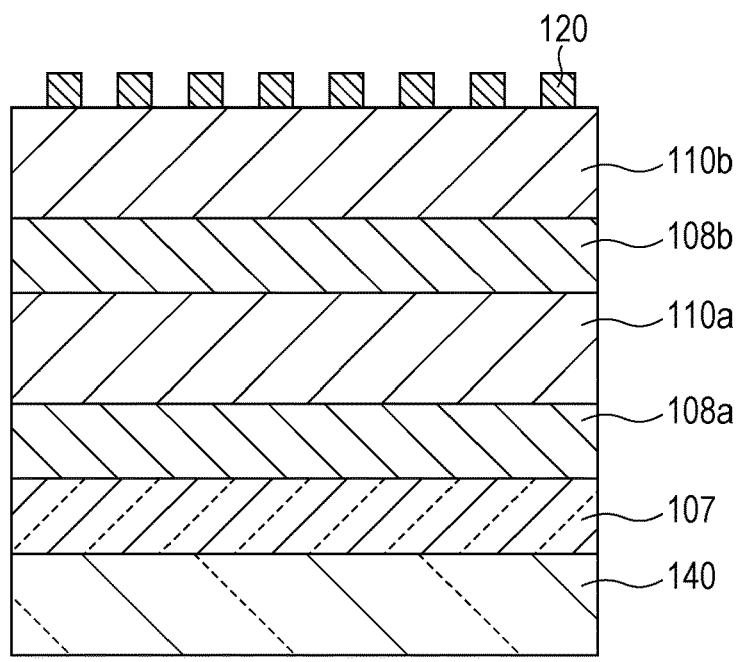

When the substrate 140 has a higher refractive index than the photoluminescent layer 110, a low-refractive-index layer 107 may be formed on the substrate 140, as illustrated in FIGS. 34C and 34D. When the low-refractive-index layer 107 is located on the substrate 140, as illustrated in FIG. 34C, the diffusion-barrier layer 108 is formed between the low-refractive-index layer 107 and the photoluminescent layer 110. As illustrated in FIG. 34D, when there are photoluminescent layers 110a and 110b, diffusion-barrier layers 108a and 108b are located under the photoluminescent layers 110a and 110b, respectively.

The low-refractive-index layer 107 is formed if the substrate 140 has a refractive index greater than or equal to the refractive index of the photoluminescent layer 110. The low-refractive-index layer 107 has a lower refractive index than the photoluminescent layer 110. The low-refractive-index layer 107 may be formed of $MgF_2$, LiF, $CaF_2$, $BaF_2$, $SrF_2$, quartz, a resin, or room-temperature curing glass, such as hydrogen silsesquioxane (HSQ) spin-on glass (SOG). It is desirable that the thickness of the low-refractive-index layer 107 be greater than the light wavelength. For example, the substrate 140 may be formed of $MgF_2$, LiF, $CaF_2$, $BaF_2$, $SrF_2$, glass, a resin, MgO, $MgAl_2O_4$, sapphire ($Al_2O_3$), $SrTiO_3$, $LaAlO_3$, $TiO_2$, $Gd_3Ga_5O_{12}$, $LaSrAlO_4$, $LaSrGaO_4$, $LaTaO_3$, SrO, YSZ ($ZrO_2 \cdot Y_2O_3$), YAG, or $Tb_3Ga_5O_{12}$.

It is desirable that the diffusion-barrier layers 108, 108a, and 108b be selected in a manner that depends on the type of element to be prevented from diffusion. For example, the diffusion-barrier layers 108, 108a, and 108b may be formed of strongly covalent oxide crystals or nitride crystals. The diffusion-barrier layers 108, 108a, and 108b may have a thickness of 50 nm or less.

In structures that include a layer adjacent to the photoluminescent layer 110, such as the diffusion-barrier layer 108 or a crystal growth layer 106 described later, when the adjacent layer has a higher refractive index than the photoluminescent layer 110, the refractive index $n_{wav}$ denotes the average refractive index of the layer having the higher refractive index and the photoluminescent layer 110 weighted by their respective volume fractions. This is optically equivalent to a photoluminescent layer composed of layers of different materials.

Figure 35A:
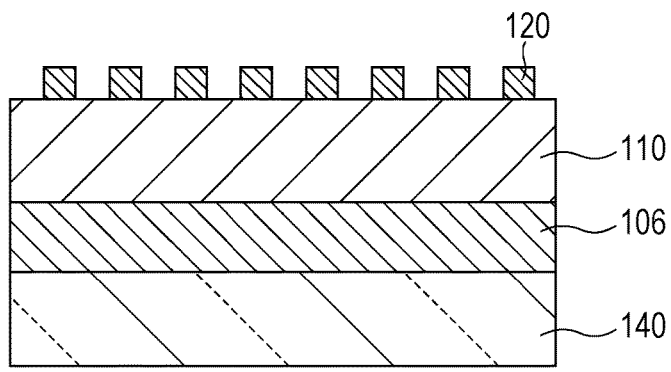
FIGS. 35A to 35C are schematic cross-sectional views of a light-emitting device that includes a crystal growth layer (seed layer) under a photoluminescent layer.

When the photoluminescent layer 110 is formed of an inorganic material, the photoluminescent layer 110 may have poor light-emitting properties due to low crystallinity of the inorganic material. In order to increase the crystallinity of the inorganic material of the photoluminescent layer 110, a crystal growth layer (hereinafter also referred to as a "seed layer") 106 may be formed under the photoluminescent layer 110, as illustrated in FIG. 35A. The material of the crystal growth layer 106 is lattice-matched to the crystals of the overlying photoluminescent layer 110. The lattice matching is desirably within ±5%. If the substrate 140 has a higher refractive index than the photoluminescent layer 110, the crystal growth layer 106 or 106a desirably has a lower refractive index than the photoluminescent layer 110.

Figure 35B:
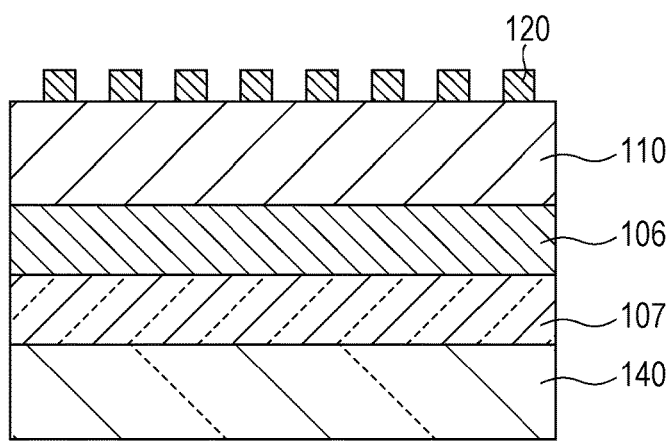
Figure 35C:
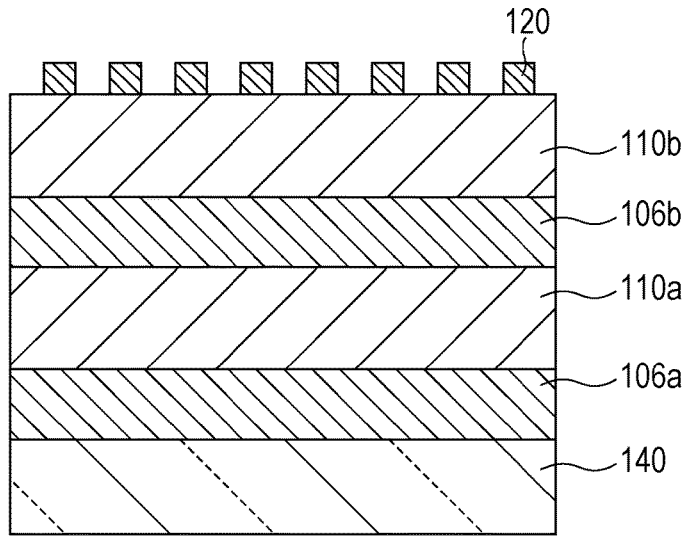

If the substrate 140 has a higher refractive index than the photoluminescent layer 110, a low-refractive-index layer 107 may be formed on the substrate 140, as illustrated in FIG. 35B. In this case, because the crystal growth layer 106 is in contact with the photoluminescent layer 110, the crystal growth layer 106 is formed on the low-refractive-index layer 107, which is located on the substrate 140. In structures that include photoluminescent layers 110a and 110b, as illustrated in FIG. 35C, crystal growth layers 106a and 106b are desirably formed on the photoluminescent layers 110a and 110b, respectively. Each of the crystal growth layers 106, 106a, and 106b may have a thickness of 50 nm or less.

Figure 36A:
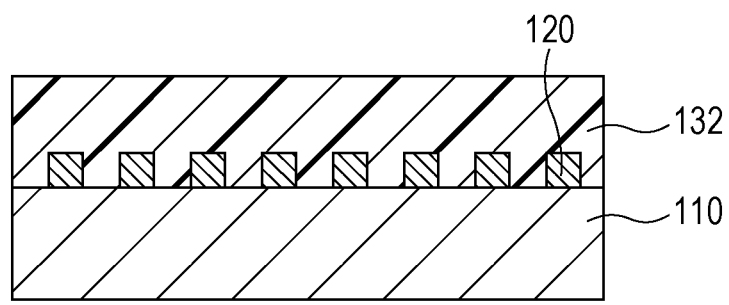
FIGS. 36A and 36B are schematic cross-sectional views of a light-emitting device that includes a surface protective layer for protecting a periodic structure.
Figure 36B:
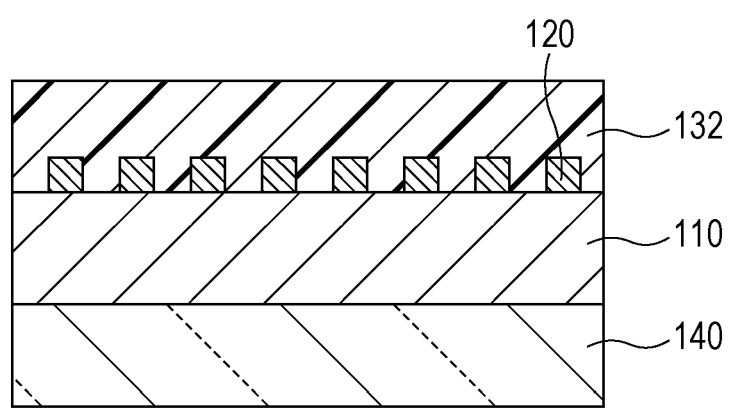

As illustrated in FIGS. 36A and 36B, a surface protective layer 132 may be formed to protect the periodic structure 120.

The surface protective layer 132 may be formed in a light-emitting device with or without the substrate 140, as illustrated in FIGS. 36A and 36B. In the light-emitting device without the substrate as illustrated in FIG. 36A, a surface protective layer may also be formed under the photoluminescent layer 110. The surface protective layer 132 may be formed on any surface of the light-emitting devices. The periodic structure 120 is not limited to those illustrated in FIGS. 36A and 36B and may be of any of the types described above.

The surface protective layer 132 may be formed of a resin, a hard coat material, $SiO_2$, alumina ($Al_2O_3$), silicon oxycarbide (SiOC), or diamond-like carbon (DLC). The surface protective layer 132 may have a thickness in the range of 100 nm to 10 μm.

The surface protective layer 132 can protect the light-emitting device from the external environment and suppress the degradation of the light-emitting device. The surface protective layer 132 can protect the surface of the light-emitting device from scratches, water, oxygen, acids, alkalis, or heat. The material and thickness of the surface protective layer 132 may be appropriately determined for each use.

Photoluminescent materials sometimes deteriorate due to heat. Heat is mostly generated by the nonradiative loss or Stokes loss of the photoluminescent layer 110. For example, the thermal conductivity of quartz (1.6 W/m·K) is lower by an order of magnitude than the thermal conductivity of YAG (11.4 W/m·K). Thus, heat generated by the photoluminescent layer (for example, a YAG layer) 110 is not fully dissipated via the substrate (for example, a quartz substrate) 140 and increases the temperature of the photoluminescent layer 110, thereby possibly causing thermal degradation.

Figure 37A:
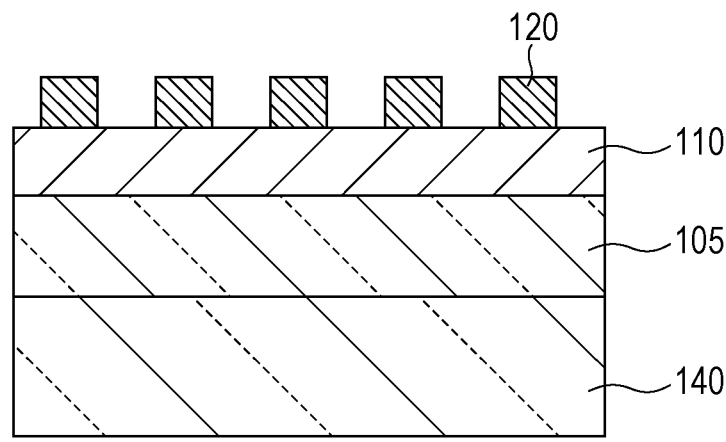
FIGS. 37A to 37D are schematic cross-sectional views of a light-emitting device having a transparent thermally conductive layer.
Figure 37B:
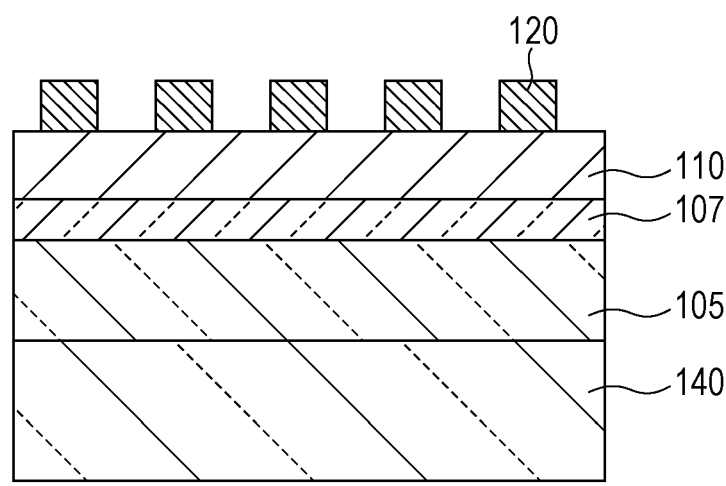

As illustrated in FIG. 37A, a transparent thermally conductive layer 105 between the photoluminescent layer 110 and the substrate 140 can efficiently dissipate heat of the photoluminescent layer 110 and prevent temperature rise. The transparent thermally conductive layer 105 desirably has a lower refractive index than the photoluminescent layer 110. If the substrate 140 has a lower refractive index than the photoluminescent layer 110, the transparent thermally conductive layer 105 may have a higher refractive index than the photoluminescent layer 110. In such a case, the transparent thermally conductive layer 105, together with the photoluminescent layer 110, forms a waveguide layer, and therefore desirably has a thickness of 50 nm or less. As illustrated in FIG. 37B, in the presence of a low-refractive-index layer 107 between the photoluminescent layer 110 and the transparent thermally conductive layer 105, a thick transparent thermally conductive layer 105 may be used.

Figure 37C:
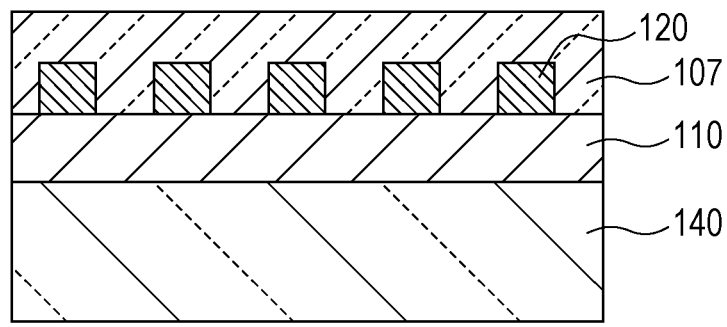
Figure 37D:
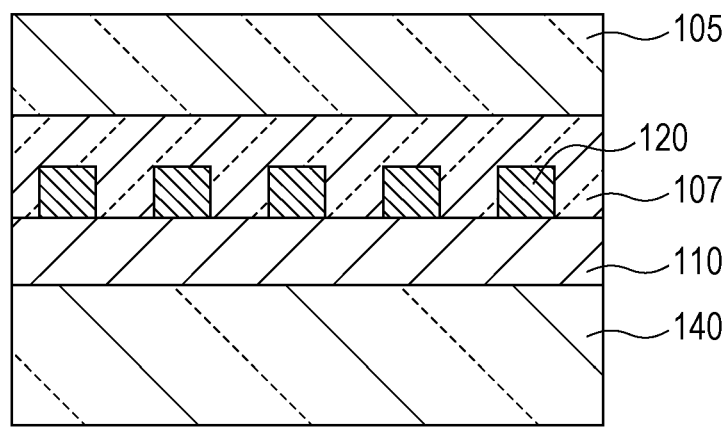

As illustrated in FIG. 37C, the periodic structure 120 may be covered with a low-refractive-index layer 107 having high thermal conductivity. As illustrated in FIG. 37D, a transparent thermally conductive layer 105 may be formed on the low-refractive-index layer 107 covering the periodic structure 120. The low-refractive-index layer 107 does not necessarily have high thermal conductivity.

The material of the transparent thermally conductive layer 105 may be $Al_2O_3$, MgO, $Si_3N_4$, ZnO, AlN, $Y_2O_3$, diamond, graphene, $CaF_2$, or $BaF_2$. Among these, $CaF_2$ and $BaF_2$ can be used for the low-refractive-index layer 107 due to their low refractive indices.

A light-emitting apparatus that includes a light-emitting device 100 and a light source 180 and has high heat dissipation characteristics will be described below with reference to FIGS. 38A to 38D.

Figure 38A:
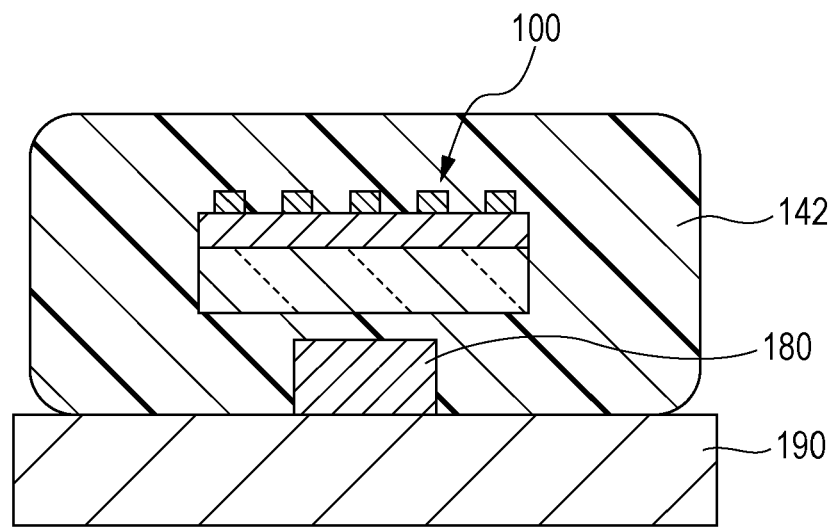
FIGS. 38A to 38D are schematic cross-sectional views of a light-emitting apparatus having improved heat dissipation characteristics.

A light-emitting apparatus illustrated in FIG. 38A includes an LED chip 180 as a light source 180 and a light-emitting device 100. The light-emitting device 100 may be of any of the types described above. The LED chip 180 is located on a supporting substrate 190. The light-emitting device 100 is separated from the LED chip 180 by a predetermined distance. The light-emitting device 100 emits light in response to excitation light emitted from the LED chip 180. The LED chip 180 and the light-emitting device 100 on the supporting substrate 190 are covered with a sealing component 142.

The sealing component 142 has high thermal conductivity and is transparent to light. The material of the sealing component 142 (hereinafter also referred to as a "sealing material") may be a composite material containing a thermally conductive filler and a resin material. The thermally conductive filler may be $Al_2O_3$, ZnO, $Y_2O_3$, graphene, or AlN. The resin material may be an epoxy resin or a silicone resin. In particular, the sealing material may be a nanocomposite material containing a thermally conductive filler of a nanometer size (a submicron size). Use of the nanocomposite material can suppress the diffuse reflection (or scattering) of light. The nanocomposite material may contain ZnO or $Al_2O_3$ as filler and an epoxy resin or a silicone resin.

If the light-emitting device 100 is of a type in which the periodic structure is exposed at the surface, as illustrated in FIG. 38A, the refractive index of a medium around the periodic structure is desirably lower than the refractive index of the periodic structure. If the periodic structure is formed of a light-transmissive layer, it is desirable that the sealing component 142 have a lower refractive index than the light-transmissive layer. If the periodic structure is formed of the same material as a photoluminescent layer, the sealing component 142 desirably has a lower refractive index than the photoluminescent layer.

Figure 38B:
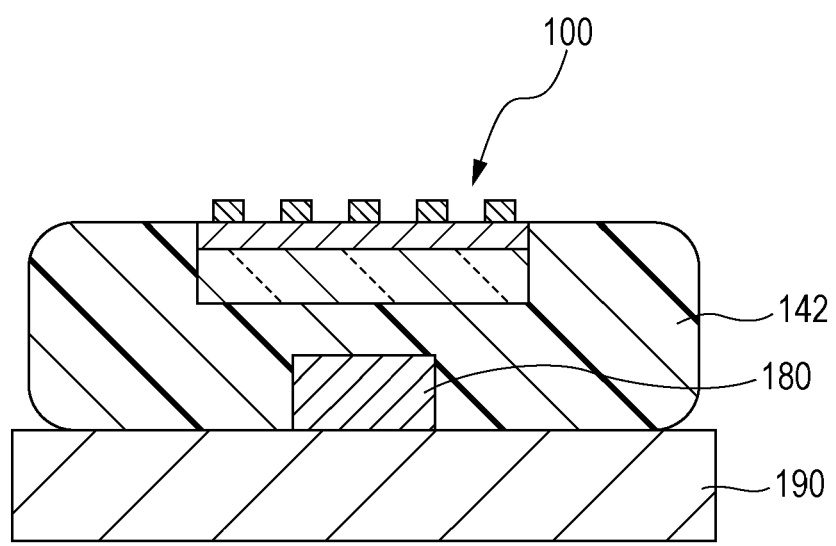

As illustrated in FIG. 38B, the sealing component 142 may be formed such that the vicinity of the surface (for example, a light-transmissive layer having a periodic structure or a photoluminescent layer) of the light-emitting device 100 is exposed. In this case, the sealing component 142 may have any refractive index.

Figure 38C:
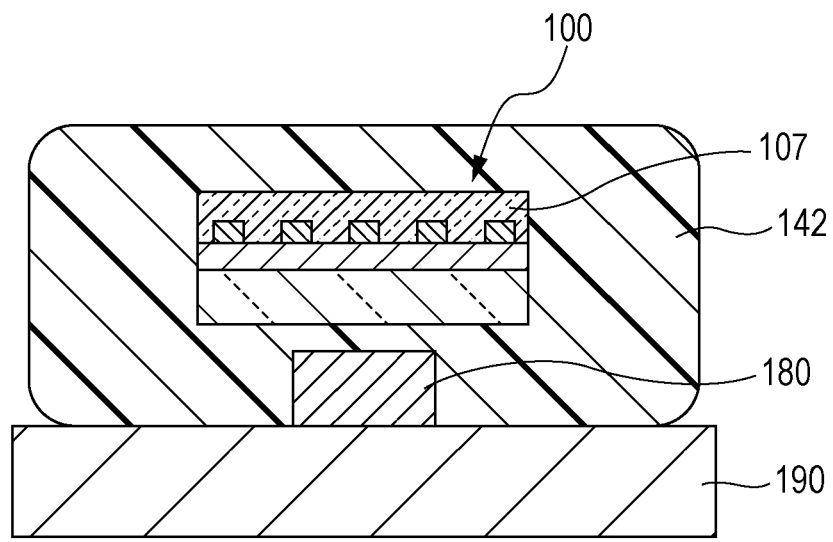

As illustrated in FIG. 38C, if the light-emitting device 100 is of a type in which the periodic structure is covered with a low-refractive-index layer 107 (see FIG. 37C), the sealing component 142 may have a higher refractive index than the periodic structure. Such a structure can offer a wide selection of the material of the sealing component 142.

Figure 38D:
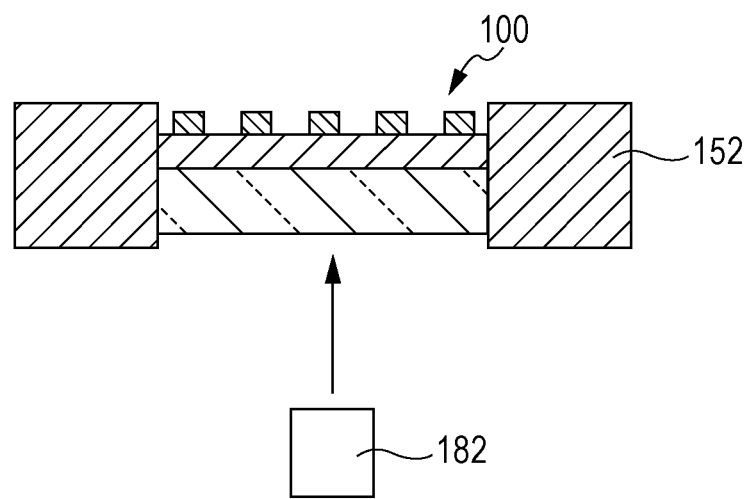

As illustrated in FIG. 38D, the periphery of the light-emitting device 100 may be fixed to a thermally conductive holder 152. The holder 152 may be made of a metal. For example, this structure is desired if the sealing material cannot be placed between the light-emitting device 100 and a light source as in the case where a laser diode 182 is used as a light source. For example, the light-emitting devices 100 illustrated in FIGS. 37A to 38D include the transparent thermally conductive layer 105 or the thermally conductive low-refractive-index layer 107 and therefore have high in-plane thermal conductivity. Thus, the light-emitting devices 100 can effectively dissipate heat via the holder 152.

As illustrated in FIGS. 39A to 39D, a thermally conductive member 144 or 146 may be located on a surface of the light-emitting device 100. The thermally conductive member 144 or 146 may be made of a metal.

Figure 39A:
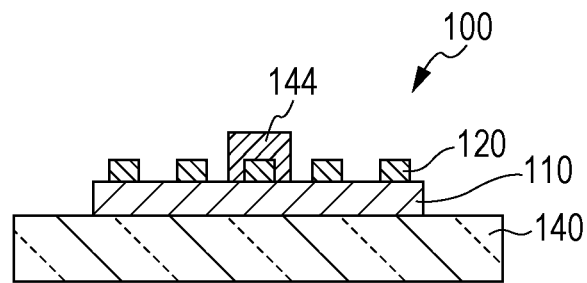
FIGS. 39A to 39D are schematic views of a light-emitting device having a thermally conductive member.
Figure 39B:
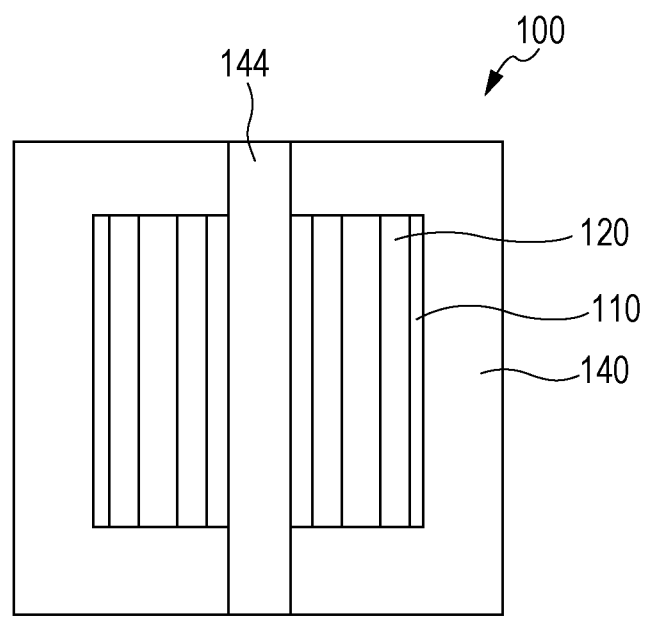

For example, as illustrated in a cross-sectional view of FIG. 39A and a plan view of FIG. 39B, the thermally conductive member 144 may partly cover a periodic structure 120 of a light-emitting device 100. Although the linear thermally conductive member 144 covers only one projection of a one-dimensional periodic structure in FIGS. 39A and 39B, the present disclosure is not limited to this.

Figure 39C:
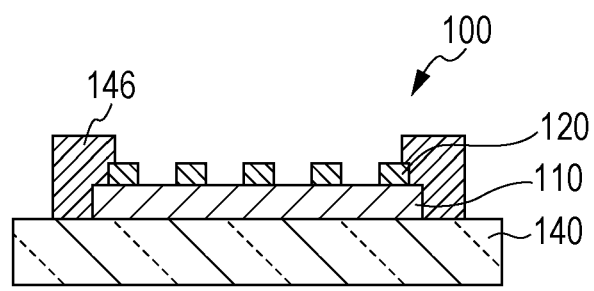
Figure 39D:
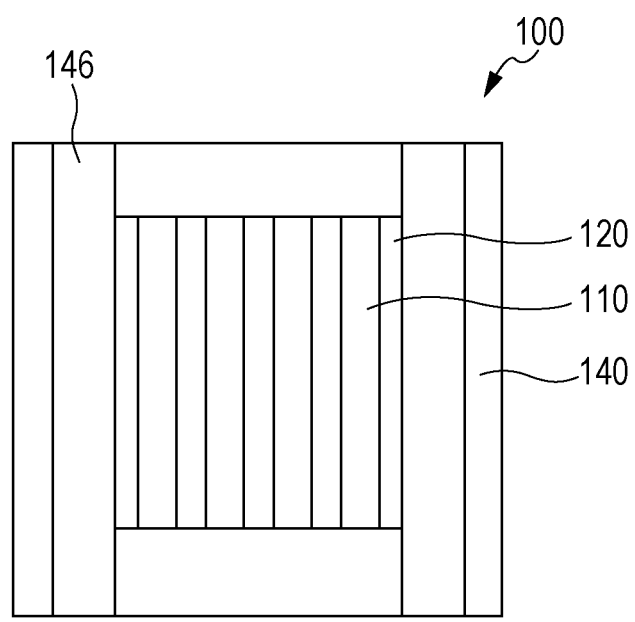

As illustrated in a cross-sectional view of FIG. 39C and a plan view of FIG. 39D, the thermally conductive member 146 may cover projections at each end of the periodic structure 120 of the light-emitting device 100 and cover end surfaces of a photoluminescent layer 110. In both cases, an increase in the area of the periodic structure and the photoluminescent layer covered with the thermally conductive member 146 may affect the characteristics of the light-emitting device 100. Thus, the area of the thermally conductive member 146 on a surface of the light-emitting device 100 should be minimized.

Figure 40A:
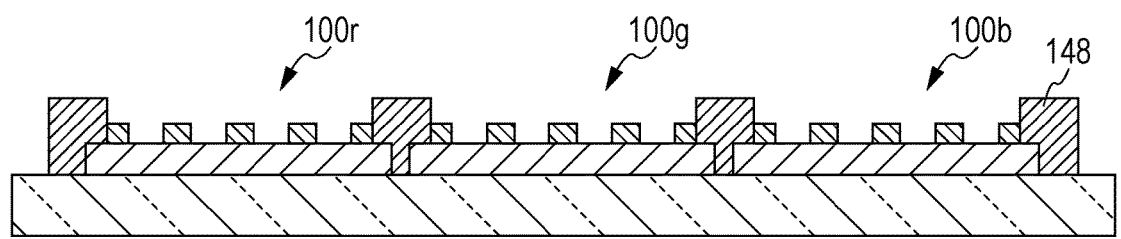
FIGS. 40A and 40B are schematic views of an arrangement of thermally conductive members in tiled light-emitting devices.
Figure 40B:
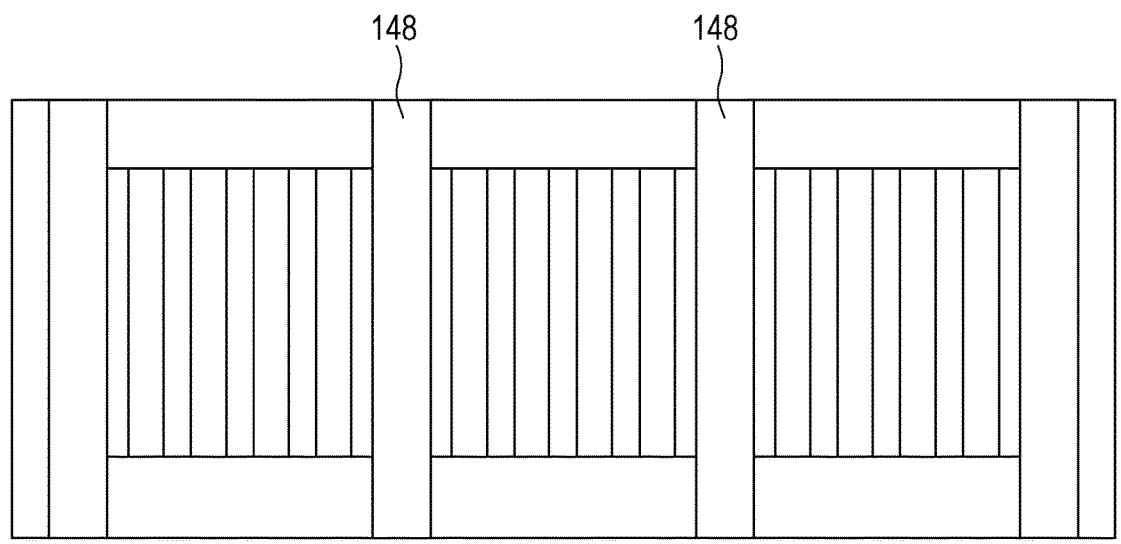

As illustrated in a cross-sectional view of FIG. 40A and a plan view of FIG. 40B, in tiled light-emitting devices 100*r*, 100*g*, and 100*b* having different structures, a thermally conductive member 148 may be located between adjacent light-emitting devices so as to cover end portions of the light-emitting devices. For example, as illustrated in these figures, in an array of a light-emitting device 100*r* that enhances red light, 100*g* that enhances green light, and 100*b* that enhances blue light, a thermally conductive member 148 made of a metal between adjacent light-emitting devices can prevent color mixing due to the light-shielding effect of the thermally conductive member 148. Thus, the thermally conductive member 148 may be used as a black matrix in display panels.

Figure 41A:
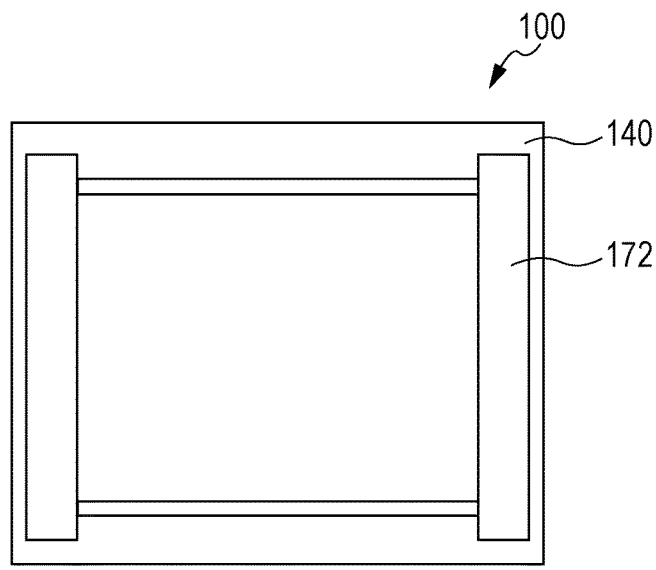
FIGS. 41A and 41B are schematic views of a light-emitting apparatus including an interlock circuit.
Figure 41B:
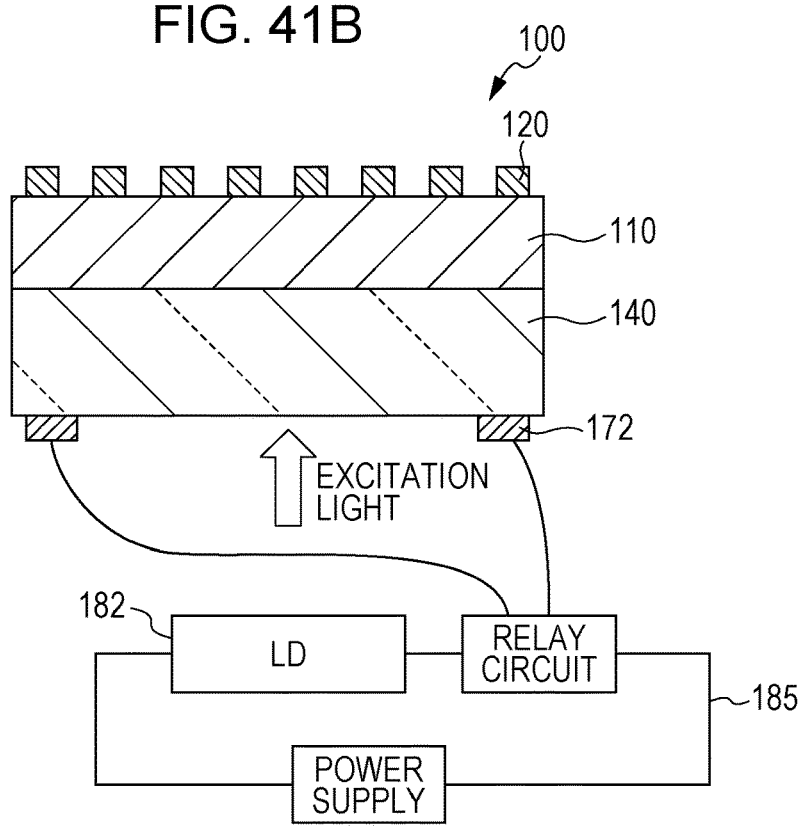

FIGS. 41A and 41B illustrate a light-emitting apparatus including an interlock circuit 185. FIG. 41A is a schematic view of the back side of the light-emitting device 100. FIG. 41B is a schematic view of the light-emitting apparatus, including a cross-sectional view of the light-emitting device 100. As illustrated in FIGS. 41A and 41B, a closed electric wire 172 is located on the back side of a substrate 140 in a light-emitting device 100. The closed electric wire 172 is located along the periphery of the back side of the light-emitting device 100 and is configured to break when the substrate 140 is broken. The closed electric wire 172 may be made of a metallic material. Two terminals of the closed electric wire 172 are electrically connected to a relay circuit of the interlock circuit 185. When the closed electric wire 172 is broken, the relay circuit will stop supplying an electric power to a light source 182. In particular, in the case that the light source 182 emits high-intensity light as in laser diodes, it is desirable to provide the interlock circuit 185 from a safety standpoint.

The submicron structures of the light-emitting devices according to these embodiments may be periodic structures and may be formed by photolithography or nanoprinting. Other methods for forming a submicron structure will be described below with reference to FIGS. 42A to 42F.

Figure 42A:
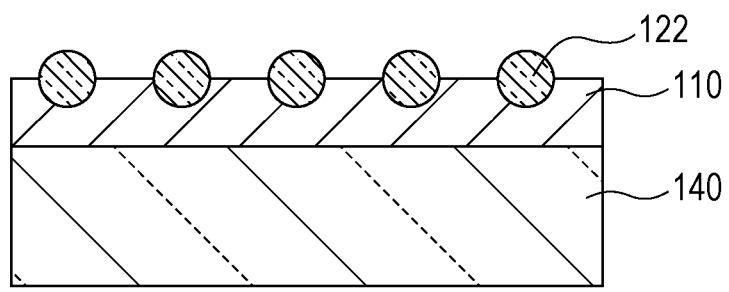
FIGS. 42A to 42F are explanatory views of a method for forming a submicron structure using beads.

As illustrated in FIG. 42A, beads 122 are placed on a surface of a photoluminescent layer 110 supported by a substrate 140. Each of the beads 122 can be partly embedded at regular intervals in the photoluminescent layer 110 and thereby fixed to the photoluminescent layer 110. The refractive index of the beads 122 partly embedded in the photoluminescent layer 110 at regular intervals and partly protruding from the photoluminescent layer 110 may be equal to or lower than the refractive index of the photoluminescent layer 110. For example, if the beads 122 have a lower refractive index than the photoluminescent layer 110, a layer composed of the beads 122 (both the portions protruding from the photoluminescent layer 110 and the portions embedded in the photoluminescent layer 110) functions as a light-transmissive layer 120 having a submicron structure. If the beads 122 have substantially the same refractive index as the photoluminescent layer 110, the beads 122 and the photoluminescent layer 110 function as substantially one body, and the portions protruding from the photoluminescent layer 110 function as a light-transmissive layer 120 having a submicron structure.

Figure 42B:
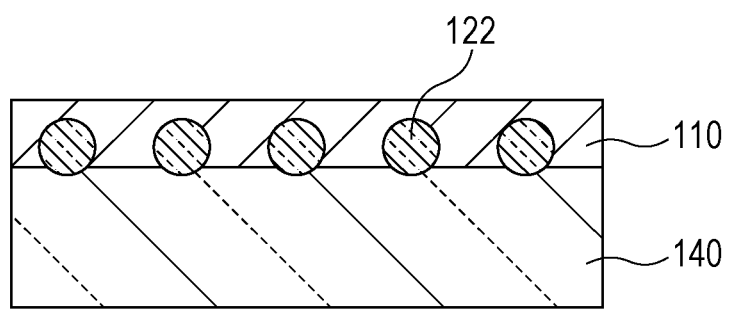

Alternatively, as illustrated in FIG. 42B, beads 122 may be located on a substrate 140 and may be covered with a photoluminescent layer 110. The beads 122 desirably have a lower refractive index than the photoluminescent layer 110.

The beads 122 may have a diameter smaller than or equal to the Dim. If the beads 122 are densely packed, the beads 122 have substantially the same diameter as the $D_{int}$. If the beads 122 have a gap therebetween, the sum of the diameter of the beads 122 and the length of the gap corresponds to the $D_{int}$.

The beads 122 may be hollow beads or solid beads.

FIGS. 42C to 42F illustrate a schematic view of packing of beads and a light scattering pattern of the packed beads. In FIGS. 42C to 42F, black portions indicate solid portions in solid or hollow beads, and white portions indicate void portions in solid or hollow beads.

Figure 42C:
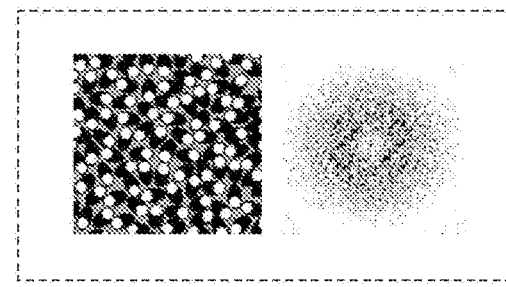
Figure 42D:
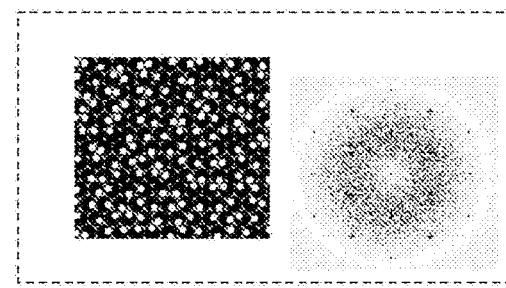
Figure 42E:
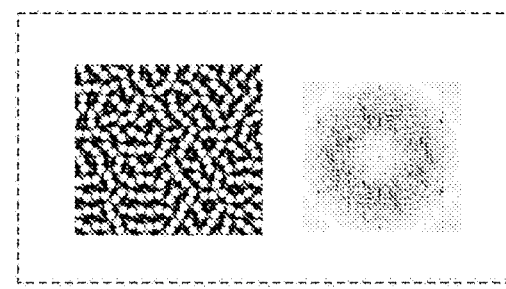
Figure 42F:
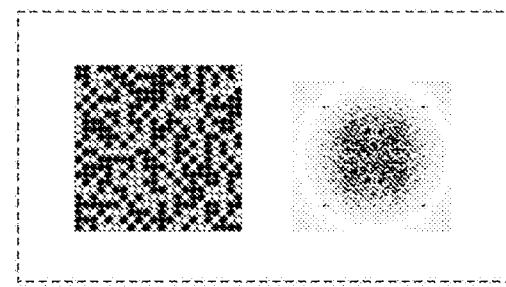

FIG. 42C illustrates densely packed hollow beads having an egg-shaped external shape and a light scattering patter of the hollow beads. The void portions of the hollow beads are generally spherical and are located at the bottom of the eggs. FIG. 42D illustrates densely packed hollow beads having a generally spherical external shape and a light scattering pattern of the hollow beads. The void portions of the hollow beads are generally spherical and are in contact with each external sphere. FIG. 42E illustrates densely packed hollow beads having a generally spherical external shape and a light scattering pattern of the hollow beads. Each void portion of the hollow beads includes two generally spherical voids, and the two spherical voids are arranged along the diameter of the external sphere. FIG. 42F illustrates dense packing of hollow beads each having a generally spherical external shape and solid beads each having a generally spherical external shape, and a light scattering pattern of the packed beads. The hollow beads and solid beads have substantially the same diameter and are mixed at a volume ratio of approximately 50:50. The hollow beads and solid beads are almost randomly arranged without regularity.

Hollow beads and solid beads made of various glasses and resins are commercially available. For example, these beads may be an alumina powder widely commercially available as an abrasive or hollow silica manufactured by Nittetsu Mining Co., Ltd. These beads and a dispersant may be dispersed in a solvent (for example, water or an alcohol), and the dispersion liquid may be applied to a substrate 140 or a photoluminescent layer 110 and dried to form a layer of densely packed beads.

As described above, light-emitting devices and light-emitting apparatuses including the light-emitting devices according to the present disclosure have various advantages and can be used with advantageous effects in various optical devices. Some application examples will be described below.

A light-emitting device according to the present disclosure can emit directional light in a particular direction. It is desirable that such high directionality be utilized in edge-light backlight units that utilize a light guide plate of a liquid crystal display unit. For example, when a known light source having low directionality is used, light from the light source is directed to a light guide plate through a reflector and/or a diffuser. When a light source having high directionality in a particular direction is used, light can be efficiently directed to a light guide plate without these optical components.

In optical devices, light from a light source must be efficiently directed in a predetermined direction. Thus, optical devices include a lens, a prism, and/or a reflector, for example. For example, it is known that a projector includes a light guide to direct light from a light source to a display panel (for example, Japanese Unexamined Patent Application Publication No. 2010-156929). The use of a light-emitting device according to the present disclosure as a light source can remove the light guide.

Known lighting fixtures include an optical component, including a lens and/or a reflector, to direct isotropic light in a desired direction. The use of a light-emitting device according to the present disclosure can remove such an optical component. The use of a light-emitting device according to the present disclosure allows for a simple design for directional light instead of a complex design for isotropic light. Consequently, lighting fixtures can be reduced in size, or the process of designing lighting fixtures can be simplified.

A light-emitting device according to the present disclosure can enhance light having a particular wavelength alone. Thus, a light source that emits light having a required wavelength alone can be easily provided. The wavelength of output light can be adjusted only by changing the periodic structure without changing the material of the photoluminescent layer. The wavelength of output light can be changed with the angle relative to the periodic structure. Such wavelength selectivity is suitable for a narrow-band imaging (NBI, registered trademark) technique, for example. A light-emitting device according to the present disclosure can also be used for visible light communication.

In the field of illumination, color-enhancing light color illumination and beautifying light color illumination techniques have been developed. Such illumination can finely produce the color of an object to be illuminated. The color-enhancing light color illumination is effective in making foods, such as vegetables, look more delicious. The beautifying light color illumination is effective in ensuring natural-looking skin tones. Such illumination is performed by controlling the light source spectrum (the intensity distribution as a function of light wavelength) depending on the object. Hitherto, the spectrum of illumination light has been controlled by selective transmission of light emitted from a light source using an optical filter. The optical filter absorbs unnecessary light and consequently reduces light-use efficiency. In contrast, a light-emitting device according to the present disclosure can enhance light having a particular wavelength and requires no optical filter, thus improving light-use efficiency.

A light-emitting device according to the present disclosure can emit polarized light (linearly polarized light). When unpolarized light including two linearly polarized light components intersecting at right angles is emitted from a light source, linearly polarized light has hitherto been produced by absorbing one of the two linearly polarized light components using a polarizing filter (also referred to as a "polarizer"). Thus, the light-use efficiency is 50% or less. The use of a light-emitting device according to the present disclosure as a polarized light source can obviate the need for a polarizing filter and improve light-use efficiency. Polarized illumination is used to reduce reflected light, for example, from windowpanes of shop windows and view restaurants. Polarized illumination is also used as washstand illumination, which utilizes the dependence of the reflection characteristics of the skin surface on polarized light, and is used to facilitate the observation of lesion sites with an endoscope.

It is desirable that a polarized light source be used as a backlight for liquid crystal display units and as a light source for liquid crystal projectors. When a light-emitting device according to the present disclosure is used as a light source for liquid crystal projectors, in combination with the use of the wavelength selectivity, the light-emitting device can constitute a three-primary-color polarized light source. For example, a light-emitting device that emits red linearly polarized light, a light-emitting device that emits green linearly polarized light, and a light-emitting device that emits blue linearly polarized light may be joined together to form a disk. While the disk is irradiated with excitation light, the disk may be rotated to form a light source that successively emits red, green, and blue three-primary-color polarized light beams.

Figure 43:
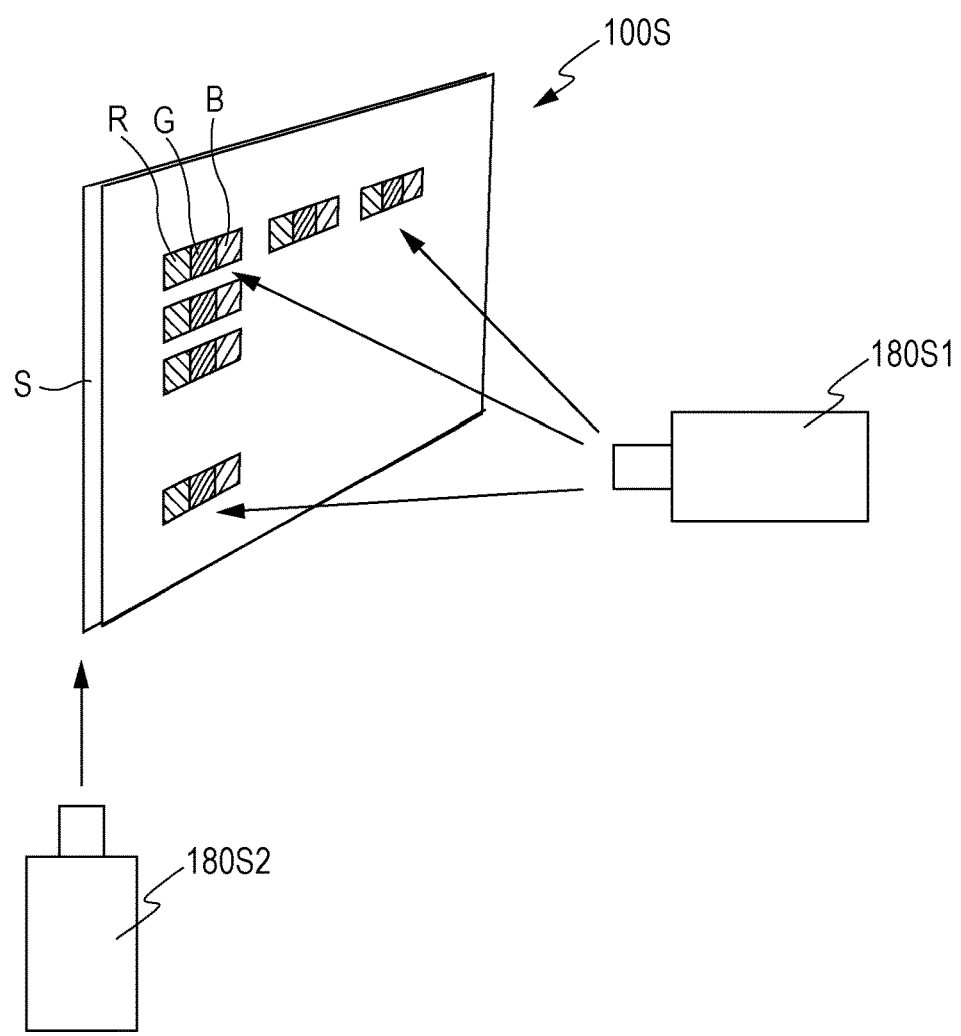
FIG. 43 is a schematic view of the structure of a transparent display unit that includes a light-emitting device according to the present disclosure as a screen.

As illustrated in FIG. 43, a light-emitting device according to the present disclosure may also be used as a screen 100S of a transparent display apparatus.

For example, the screen 100S includes pixels arranged in a matrix. Each of the pixels is composed of a light-emitting device that enhances red light (R), a light-emitting device that enhances green light (G), and a light-emitting device that enhances blue light (B). These light-emitting devices can emit light of a predetermined color in response to their respective excitation light (for example, ultraviolet light) emitted from an excitation light source 180S1, thereby displaying an image. Because the light-emitting devices transmit visible light, observers can observe the background through the screen 100S. When the screen 100S is not irradiated with excitation light, the screen 100S looks like a transparent window. Scanning a laser diode as the excitation light source 180S1 while adjusting its output for image data enables high resolution display. Since a laser beam is coherent light, its excitation efficiency can also be increased by interference with a periodic structure. When light having an undesirable wavelength, such as ultraviolet light, is used as excitation light, a leakage of the undesirable light can be prevented by placing an excitation light source on the opposite side of the screen 100S from the observer and placing a filter for removing the excitation light on the observer side of the screen 100S.

The screen 100S may have high directionality. Thus, only observers in a predetermined direction can observe images.

The excitation light source 180S1 may be replaced with an excitation light source 180S2. A light guide sheet S is placed on the back side of the screen 100S (opposite the observer) and is irradiated with excitation light from the excitation light source 180S2. The excitation light incident on the light guide sheet S propagates through the screen 100S and is applied to the back side of the screen 100S. In this case, light-emitting devices arranged according to a desired image cannot actively display any image. However, the light guide sheet S can be transparent like a window in the absence of excitation light and can display images, figures, and letters when irradiated with excitation light.

As described above with reference to FIGS. 8 and 9, a change in the refractive index of a periodic structure of a light-emitting device according to the present disclosure results in a different wavelength and output direction of enhanced light. The wavelength and output direction of enhanced light also change with the refractive index of a photoluminescent layer. Thus, a change in the refractive index of a medium around the light-emitting device can be easily detected with high sensitivity.

For example, a sensor for detecting various substances can be provided using a light-emitting device according to the present disclosure, as described below.

A substance (such as an enzyme) that selectively binds to a substance to be measured (such as a protein, odorant molecule, or virus) is placed near a periodic structure of a light-emitting device according to the present disclosure. Bonding to the substance to be measured changes the refractive index of a medium around the light-emitting device. The change in the refractive index can be detected as a change in the wavelength or output direction of enhanced light, as described above. Thus, the presence of various substances can be detected.

Application examples of a light-emitting device according to the present disclosure are not limited to those described above. A light-emitting device according to the present disclosure can be applied to various optical devices.

Light-emitting devices and light-emitting apparatuses according to the present disclosure can be applied to various optical devices, such as lighting fixtures, displays, and projectors.

What is claimed is:

1. A light-emitting device comprising:
a photoluminescent layer that has a first surface perpendicular to a thickness direction thereof and emits light containing first light, an area of the first surface being larger than a sectional area of the photoluminescent layer perpendicular to the first surface; and
a light-transmissive layer located on the photoluminescent layer, wherein
at least one of the photoluminescent layer and the light-transmissive layer has a submicron structure having at least projections or recesses arranged perpendicular to the thickness direction of the photoluminescent layer,
at least one of the photoluminescent layer and the light-transmissive layer has a light emitting surface perpendicular to the thickness direction of the photoluminescent layer, the first light being emitted from the light emitting surface,
the first light has a wavelength $\lambda_a$ in air,
a distance $D_{int}$ between adjacent projections or recesses and a refractive index $n_{wav-a}$ of the photoluminescent layer for the first light satisfy $\lambda_a/n_{wav-a} < D_{int} < \lambda_a$, and
a thickness of the photoluminescent layer, the refractive index $n_{wav-a}$, and the distance $D_{int}$ are set to limit a directional angle of the first light emitted from the light emitting surface.

2. The light-emitting device according to claim 1, wherein the wavelength $\lambda_a$ of the first light is different from a peak wavelength of the light emitted from the photoluminescent layer in air.

3. The light-emitting device according to claim 1, wherein the refractive index $n_{t-a}$ of the light-transmissive layer for the first light is lower than the refractive index $n_{wav-a}$ of the photoluminescent layer for the first light.

4. The light-emitting device according to claim 1, wherein the first light has maximum intensity in a first direction determined in advance by the submicron structure.

5. The light-emitting device according to claim 4, wherein the first direction is normal to the photoluminescent layer.

6. The light-emitting device according to claim 4, wherein the first light emitted in the first direction is linearly polarized light.

7. The light-emitting device according to claim 4, wherein the directional angle of the first light with respect to the first direction is less than 15 degrees.

8. The light-emitting device according to claim 4, wherein second light having a wavelength $\lambda_b$ different from the wavelength $\lambda_a$ of the first light has maximum intensity in a second direction different from the first direction.

9. The light-emitting device according to claim 1, wherein the light-transmissive layer has the submicron structure.

10. The light-emitting device according to claim 1, wherein the photoluminescent layer has the submicron structure.

11. The light-emitting device according to claim 1, wherein
the photoluminescent layer has a flat main surface, and
the light-transmissive layer is located on the flat main surface of the photoluminescent layer and has the submicron structure.

12. The light-emitting device according to claim 11, wherein the photoluminescent layer is supported by a transparent substrate.

13. The light-emitting device according to claim 1, wherein
the light-transmissive layer is a transparent substrate having the submicron structure on a main surface thereof, and
the photoluminescent layer is located on the submicron structure.

14. The light-emitting device according to claim 1, wherein the refractive index $n_{t-a}$ of the light-transmissive layer for the first light is higher than or equal to the refractive index $n_{wav-a}$ of the photoluminescent layer for the first light, and each of the projections or recesses in the submicron structure has a height or depth of 150 nm or less.

15. The light-emitting device according to claim 1, wherein the submicron structure includes at least one periodic structure comprising at least the projections or recesses, and the at least one periodic structure includes a first periodic structure having a period $p_a$ that satisfies $\lambda_a/n_{wav-a}<p_a<\lambda_a$.

16. The light-emitting device according to claim 1, wherein
the submicron structure includes at least one periodic structure comprising at least the projections or recesses, and the at least one periodic structure includes a first periodic structure having a period $p_a$ that satisfies $\lambda_a/n_{wav-a}<p_a<\lambda_a$, and
the first periodic structure is a one-dimensional periodic structure.

17. The light-emitting device according to claim 16, wherein
the light emitted from the photoluminescent layer includes second light having a wavelength $\lambda_b$ different from the wavelength $\lambda_a$ in air,
the at least one periodic structure further includes a second periodic structure having a period $p_b$ that satisfies $\lambda_b/n_{wav-b}<P_b<\lambda_b$, wherein $n_{wav-b}$ denotes a refractive index of the photoluminescent layer for the second light, and
the second periodic structure is a one-dimensional periodic structure.

18. The light-emitting device according to claim 1, wherein the submicron structure includes a two-dimensional periodic structure having at least two periodic structures comprising at least the projections or recesses, and the at least two periodic structures have periodicity in different directions.

19. The light-emitting device according to claim 1, wherein
the submicron structure includes periodic structures comprising at least the projections or recesses, and
the periodic structures include periodic structures arranged in a matrix.

20. The light-emitting device according to claim 1, wherein
the submicron structure includes periodic structures comprising at least the projections or recesses, and
the periodic structures include a periodic structure having a period $p_{ex}$ that satisfies $\lambda_{ex}/n_{wav-ex}<P_{ex}<\lambda_{ex}$, wherein $\lambda_{ex}$ denotes the wavelength of excitation light in air for a photoluminescent material contained in the photoluminescent layer, and $n_{wav-ex}$ denotes the refractive index of the photoluminescent layer for the excitation light.

21. A light-emitting device comprising
photoluminescent layers and light-transmissive layers,
wherein at least two of the photoluminescent layers are independently the photoluminescent layer according to claim 1, and at least two of the light-transmissive layers are independently the light-transmissive layer according to claim 1.

22. The light-emitting device according to claim 21, wherein the photoluminescent layers and the light-transmissive layers are stacked on top of each other.

23. A light-emitting device comprising:
a photoluminescent layer having a first surface perpendicular to a thickness direction thereof, an area of the first surface being larger than a sectional area of the photoluminescent layer perpendicular to the first surface; and
a light-transmissive layer located on the photoluminescent layer; and
at least one of the photoluminescent layer and the light-transmissive layer has a submicron structure extending perpendicular to the thickness direction of the photoluminescent layer,
wherein the photoluminescent layer emits light to form a quasi-guided mode in the photoluminescent layer and the light-transmissive layer.

24. A light-emitting device comprising:
a waveguide layer that has a periodic structure and contains a photoluminescent material, wherein
a quasi-guided is formed in the waveguide layer and
light emitted from the photoluminescent material is guided while interacting with the periodic structure in the quasi-guided mode.

25. A light-emitting apparatus comprising:
the light-emitting device according to claim 1; and
an excitation light source irradiating the photoluminescent layer with excitation light.

26. A light-emitting device comprising:
a photoluminescent layer that has a first surface perpendicular to a thickness direction thereof and emits light containing first light, an area of the first surface being larger than a sectional area of the photoluminescent layer perpendicular to the first surface; and
a light-transmissive layer located on the photoluminescent layer, wherein at least one of the photoluminescent layer and the light-transmissive layer has a submicron structure having at least projections or recesses arranged perpendicular to the thickness direction of the photoluminescent layer,
at least one of the photoluminescent layer and the light-transmissive layer has a light emitting surface perpendicular to the thickness direction of the photoluminescent layer, the first light being emitted from the light emitting surface, a distance $D_{int}$ between adjacent projections or recesses, a wavelength $\lambda_{ex}$ of excitation light in air for a photoluminescent material contained in the photoluminescent layer, and a refractive index $n_{wav-ex}$ of a medium having the highest refractive index for the excitation light out of media present in an optical path to the photoluminescent layer or the light-transmissive layer satisfy $\lambda_{ex}/n_{wav-ex} < D_{int} < \lambda_{ex}$, and a thickness of the photoluminescent layer, the refractive index $n_{wav-ex}$, and the distance $D_{int}$ are set to limit a directional angle of the excitation light emitted from the light emitting surface.

27. The light-emitting device according to claim 26, wherein the submicron structure includes at least one periodic structure comprising at least the projections or recesses, and the at least one periodic structure includes a first periodic structure having a period $P_{ex}$ that satisfies $\lambda_{ex}/n_{wav-ex} < P_{ex} < \lambda_{ex}$.

28. The light-emitting device according to claim 1, wherein the photoluminescent layer includes a phosphor.

29. The light-emitting device according to claim 1, wherein 380 nm $\leq \lambda_a \leq$ 780 nm is satisfied.

30. The light-emitting device according to claim 1, wherein the thickness of the photoluminescent layer, the refractive index $n_{wav-a}$, and the distance $D_{int}$ are set to allow an electric field to be formed in the photoluminescent layer, in which antinodes of the electric field are located in areas, the areas each corresponding to respective one of the projections and/or recesses.

31. The light-emitting device according to claim 1, wherein the light-transmissive layer is located indirectly on the photoluminescent layer.

32. The light-emitting device according to claim 1, wherein the thickness of the photoluminescent layer, the refractive index $n_{wav-a}$, and the distance $D_{int}$ are set to allow an electric field to be formed in the photoluminescent layer, in which antinodes of the electric field are located at, or adjacent to, at least the projections or recesses.

33. The light-emitting device according to claim 1, further comprising a substrate that has a refractive index $n_{s-a}$ for the first light and is located on the photoluminescent layer, wherein $\lambda_a/n_{wav-a} < D_{int} < \lambda_a/n_{s-a}$ is satisfied.

* * * * *